United States Patent
Zhang et al.

(10) Patent No.: US 11,901,826 B2
(45) Date of Patent: Feb. 13, 2024

(54) ISOLATED DC/DC CONVERTERS FOR WIDE OUTPUT VOLTAGE RANGE AND CONTROL METHODS THEREOF

(71) Applicant: Delta Electronics, Inc., Taipei (TW)

(72) Inventors: Chi Zhang, Apex, NC (US); Peter Barbosa, Cary, NC (US)

(73) Assignee: DELTA ELECTRONICS, INC., Taipei (TW)

( * ) Notice: Subject to any disclaimer, the term of this patent is extended or adjusted under 35 U.S.C. 154(b) by 331 days.

(21) Appl. No.: 17/203,503

(22) Filed: Mar. 16, 2021

(65) Prior Publication Data

US 2021/0203236 A1     Jul. 1, 2021

Related U.S. Application Data

(63) Continuation-in-part of application No. 16/882,679, filed on May 25, 2020, now Pat. No. 11,025,172.
(Continued)

(51) Int. Cl.
*H02M 3/335*     (2006.01)
*G01R 19/175*     (2006.01)
(Continued)

(52) U.S. Cl.
CPC .. *H02M 3/33576* (2013.01); *G01R 19/16538* (2013.01); *G01R 19/175* (2013.01);
(Continued)

(58) Field of Classification Search
CPC ......... H02M 3/33576; H02M 3/33561; H02M 1/0003; H02M 1/0058; H02M 1/009;
(Continued)

(56) References Cited

U.S. PATENT DOCUMENTS 6,344,979 B1 * 2/2002 Huang ................ H02M 3/3382
                                            363/16
9,263,960 B2 * 2/2016 Jovanović ............... H02M 1/10
(Continued)

FOREIGN PATENT DOCUMENTS

| CN | 102611310 A | 7/2012 |
| JP | 2016046973 A | 4/2016 |

(Continued)

OTHER PUBLICATIONS

Jiao, Yang et al., "Topology Evaluation and Comparison for Isolated Multilevel DCDC Converter for Power Cell in Solid State Transformer", 2019 IEEE Applied Power Electronics Conference and Expostion (APEC), IEEE, Mar. 17, 2019, pp. 802-809.
(Continued)

*Primary Examiner* — Yusef A Ahmed
(74) *Attorney, Agent, or Firm* — KIRTON McCONKIE; Evan R. Witt

(57) ABSTRACT

An efficient control method for an isolated multilevel DC/DC resonant converter achieves a wide output voltage range with a narrow device switching frequency range, relative to the output voltage range and the device switching frequency range of the prior art. At any given time, a control circuit selects one of three different modulation schemes to operate the primary-side switching devices of the resonant converter based on at least one of output voltage, output current, input signal, and one or more external control signals. Together with a selected device switching frequency, the three modulation schemes generate different voltage waveforms to a primary-side transformer, which are coupled to the secondary-side to provide different output voltages.

12 Claims, 57 Drawing Sheets

Related U.S. Application Data which is a continuation-in-part of application No. 16/551,543, filed on Aug. 26, 2019, now abandoned.

(51) Int. Cl.
*G01R 19/165* (2006.01)
*H02M 1/00* (2006.01)

(52) U.S. Cl.
CPC ...... *H02M 3/33561* (2013.01); *H02M 1/0003* (2021.05); *H02M 1/009* (2021.05); *H02M 1/0058* (2021.05)

(58) Field of Classification Search
CPC ...... H02M 1/0074; H02M 7/487; H02M 3/01; H02M 3/33546; H02M 3/33569; G01R 19/16538; G01R 19/175; Y02B 70/10
See application file for complete search history.

(56) References Cited

U.S. PATENT DOCUMENTS

| | | | |
|---|---|---|---|
| 9,973,099 B2* | 5/2018 | Ye | H02M 3/33576 |
| 10,224,827 B1 | 3/2019 | Zhu et al. | |
| 10,298,070 B2 | 5/2019 | Sakata et al. | |
| 10,298,138 B2 | 5/2019 | Jia et al. | |
| 2006/0133119 A1* | 6/2006 | Nomura | H02M 3/33592 363/25 |
| 2009/0316443 A1* | 12/2009 | Coccia | H02M 1/10 363/21.06 |
| 2011/0205761 A1* | 8/2011 | Tschirhart | H02M 3/3376 363/21.02 |
| 2011/0292688 A1* | 12/2011 | Zhang | H02M 1/32 363/21.02 |
| 2013/0135903 A1 | 5/2013 | Fu et al. | |
| 2014/0266135 A1* | 9/2014 | Zhak | H02M 3/07 323/311 |
| 2015/0229225 A1 | 8/2015 | Jang et al. | |
| 2016/0072312 A1* | 3/2016 | Ichikawa | H02M 3/158 307/104 |
| 2016/0105119 A1* | 4/2016 | Akamatsu | H02M 7/4807 363/21.04 |
| 2018/0217370 A1* | 8/2018 | Malone | G02B 26/005 |
| 2018/0262117 A1* | 9/2018 | Lu | H02M 7/797 |
| 2018/0337610 A1* | 11/2018 | Leong | H02M 1/083 |
| 2019/0052177 A1* | 2/2019 | Lu | H02M 7/797 |
| 2019/0058118 A1 | 2/2019 | Paz de Araujo et al. | |
| 2019/0386572 A1* | 12/2019 | Itoh | H02M 1/40 |
| 2020/0091828 A1* | 3/2020 | Fang | H02M 3/33571 |
| 2020/0228017 A1* | 7/2020 | Hu | H02M 3/33584 |
| 2020/0266719 A1* | 8/2020 | Oh | H02M 3/01 |
| 2021/0067045 A1* | 3/2021 | Zhang | H02M 3/33573 |
| 2022/0085728 A1* | 3/2022 | Mantooth | H02M 3/01 |
| 2022/0321016 A1* | 10/2022 | Khaligh | H02M 3/33561 |

FOREIGN PATENT DOCUMENTS

| | | |
|---|---|---|
| JP | 2016189636 A | 11/2016 |
| JP | 2017093179 A | 5/2017 |
| JP | 2021035328 A | 3/2021 |
| TW | 201027892 A | 7/2010 |
| TW | 201931744 A | 8/2019 |
| WO | 2015029640 A1 | 3/2015 |
| WO | 2019052880 A1 | 3/2019 |

OTHER PUBLICATIONS

Chen, Wei et al., ., "A Novel 200~800Vdc Ultra-wide Range Input Dc-Dc Converter with Optimum Intelligent Polymorphic Topologies", Applied Power Electronics Conference and Expostion(APEC), Feb. 15, 2009, pp. 51-57.

Liu, Fuxin et al., "Modified Three-Phase Three-Level DCDC Converter With Zero-Voltage-Switching Characteristic-Adopting Asymmetrical Duty Cycle Control", IEEE Transactions on Power Electronics, vol. 29, No. 12, Dec. 2014, pp. 6307-6318.

Jin, Feng et al., "Multi-phase multi-level LLC Resonant Converter with Low Voltage Stress on the Primary-Side Switches", 2014 IEEE Energy Conversion Congress and Exposition(ECCE), IEEE, Sep. 14, 2014, pp. 4704-4710.

Barbi, Ivo, et al., "DC-DC converter four switches Vsub pk=Vsub in2, capacitive turn-off snubbing, ZV turn-on", IEEE Transactions on Power Electronics, vol. 19, No. 4, Jul. 2004, pp. 918-927.

Beiranvand, Reza, et al., "A Design Procedure for Optimizing the LLC Resonant Converter as a Wide Output Range Voltage Source", IEEE Transactions on Power Electronics, vol. 27, No. 8, Aug. 2012, pp. 3749-3763.

Coccia, A., et al., "Wide input voltage range compensation in DC DC resonant architectures for on-board traction power supplies", 2007 European Conference on Power Electronics and Applications, 2007, 10pages.

Deng, Junjun, et al., "Design Methodology of LLC Resonant Converters for Electric Vehicle Battery Chargers", IEEE Transactions on Vehicular Technology, vol. 63, No. 4, May 2014, pp. 1581-1592.

Fang, Zhijian, et al., "Optimal Design Methodology for LLC Resonant Converter in Battery Charging Applications Based on Time-Weighted Average Efficiency", IEEE Transactions on Power Electronics, vol. 30, No. 10, Oct. 2015, pp. 5469-5483.

Gu, Yilei, et al., "Three-level LLC series resonant DCDC converter", IEEE Transactions on Power Electronics, vol. 20, No. 4, Jul. 2005, pp. 781-789.

Guo, Zhiqiang, et al., "Hybrid Three-Level and Half-Bridge DC-DC Converter With Reduced Circulating Loss and Output Filter Inductance", IEEE Transactions on Power Electronics, vol. 30, No. 12, Dec. 2015, pp. 6628-6637.

Inam, Wardah, et al., "Variable Frequency Multiplier Technique for High-Efficiency Conversion Over a Wide Operating Range", IEEE Journal of Emerging and Selected Topics in Power Electronics, vol. 4, No. 2, Jun. 2016, pp. 335-343.

Jiao, Yang, et al., "Topology Evaluation and Comparison for Isolated Multilevel DC DC Converter for Power Cell in Solid State Transformer", IEEE, 978-1-5386-8330-9, 2019, pp. 802-809.

Li, Zhenwei, et al., "Research on Dual-Operation Mode of 3-level LLC resonant converter", 2015 9th International Conference on Power Electronics and ECCE Asia(ICPE-ECCE Asia) Seoul, Korea, Jun. 2015, pp. 2636-2643.

In, Bor-Ren, et al., "New Three-Level PWM DC_DC Converter—Analysis, Design and Experiments", Journal of Power Electronics, vol. 14, No. 1, Jan. 2014, pp. 30-39.

Liu, Dong, et al., "Periodically Swapping Modulation (PSM) Strategy for Three-Level (TL) DC DC Converters With Balanced Switch Currents", IEEE Transactions on Industrial Electronics, vol. 65, No. 1, Jan. 2018, pp. 412-423.

Muntahina, Umme, et al., "Multimode Optimization of the Phase-Shifted LLC Series Resonant Converter", IEEE Transactions on Power Electronics, vol. 33, No. 12, Dec. 2018, pp. 10478-10489.

Musavi, Fariborz, et al., "An LLC Resonant DCDC Converter for Wide Output Voltage Range Battery Charging Applications", IEEE Transactions on Power Electronicas, vol. 28, No. 12, Dec. 2013, pp. 5437-5445.

Pinheiro, J.Renes, et al., The three-level ZVS PWM converter—a new concept in high voltage DC-to-DC conversion, Proceedings of the 1992 International Conference on Industrial Electronics, Control, Instrumentation, and Automation, San Diego, CA, USA, 1992, pp. 173-178.

Saravanan, S., et al., "Analysis of a Three-Level LLC Series Resonant Converter for High- and Wide-Input-Voltage Applications", Int. Journal of Engineering Research and Applications, vol. 4 Issue 4(Version 5), Apr. 2014, pp. 79-84.

Zong, Sheng, et al., "Asymmetrical Duty Cycle-Controlled LLC Resonant Converter With Equivalent Switching Frequency Doubler", IEEE Transactions on Power Electronics, vol. 31, No. 7, Jul. 2016, pp. 4963-4973.

Wei Liu, et al., An Interleaved PWM Method With Better Voltage-Balancing Ability for Half-Bridge Three-Level DC/DC Converter, IEEE Transactions on Power Electronics Jun. 2018, p. 4594-4598.

(56) References Cited

OTHER PUBLICATIONS

Zhang Chi et al, DC-link Capacitor Voltage Balancing Control for Series Half Bridge LLC Resonant Converter, 2020 IEEE Applied Power Electronics Conference and Exposition (APEC), IEEE, Mar. 15, 2020, pp. 2163-2169.

Zhe Zhang et al, A DC-DC Converter with Wide Input Voltage Range for Fuel Cell and Supercapacitor Application, Power Electronics and Drive Systems, 2009. IEEE, Jan. 2, 2009 (Jan. 2, 2009), pp. 706-711.

Jayan Vijesh et al, Model Predictive Control of Cascaded Multi-Output Multilevel Converter, 2019 IEEE International Conference on Industrial Technology (ICIT), Feb. 13, 2019, pp. 1247-1251.

* cited by examiner

ISOLATED DC/DC CONVERTERS FOR WIDE OUTPUT VOLTAGE RANGE AND CONTROL METHODS THEREOF

CROSS-REFERENCE TO RELATED APPLICATION

This application is a continuation-in-part application of U.S. application Ser. No. 16/882,679 filed on May 25, 2020, which is a continuation-in-part application of U.S. application Ser. No. 16/551,543 filed on Aug. 26, 2019. The entireties of the above-mentioned patent applications are incorporated herein by reference for all purposes.

FIELD OF THE INVENTION

This invention relates to power converters. More specifically, this invention relates to controlling a resonant DC/DC converter using various modulation schemes to attain regulation of an output voltage over a very wide voltage range.

BACKGROUND OF THE INVENTION

Many power conversion applications (e.g., battery charging in electrical vehicles (EVs)) require a regulated output voltage over a wide voltage range. For example, a typical EV battery charger circuit has two converter stages: (i) a front-end AC/DC converter that provides either a fixed DC bus voltage or a variable DC bus voltage, and (ii) an isolated DC/DC converter that directly interfaces with the battery. The DC/DC converter is required to provide a regulated voltage over a wide voltage range under various load current conditions and the battery's state of charge. For example, the typical battery for a conventional EV has a voltage range between 240 volts to 460 volts. However, some premium passenger EVs, utility EVs, and electrical buses or semi-trucks have output battery voltage range between 500 volts and 950 volts. Thus, a DC/DC converter that can provide a regulated output voltage over a very wide output voltage range is desired, so as to accommodate the charging requirements at different battery voltage levels.

The LLC resonant converter topology has been widely used as an isolated DC/DC converter, due to its high efficiency, simple structure achieved by magnetic integration, soft switching on both primary and secondary switches, and capability suitable for applications with wide voltage ranges.

FIGS. 1A and 1B show, respectively, an exemplary conventional full-bridge LLC resonant converter under closed-loop voltage control, and its timing diagrams for switch control signals and primary-side full-bridge output voltage $V_{AB}$. Output voltage $V_o$ may be regulated by controlling the switching frequency of these primary-side switches. Highest efficiency is attained when the LLC resonant converter operates at the resonant frequency ($f_r$), which is determined by resonant inductor $L_r$, and resonant capacitor $C_r$, and when the DC voltage gain M equals the transformer's turns ratio $$\frac{N_P}{N_S},$$

wherein M equals $V_o/V_{in}$. DC voltage gain M diminishes when the switching frequency ($f_{sw}$) is greater than resonant frequency $f_r$. Conversely, the gain M becomes greater when switching frequency $f_{sw}$ is less than resonant frequency $f_r$. Efficiency, however, always diminishes as switching frequency $f_{sw}$ moves away from resonant frequency $f_r$. To achieve a wide output voltage range, the LLC resonant converter operates at a very wide frequency range, which inevitably compromises its efficiency. Further, as the maximum and minimum DC voltage gains of the LLC resonant converter are determined by such circuit parameters as the ratio of magnetizing inductance $L_m$ to resonant inductance $L_r$, and by the load condition, the LLC resonant converter may be unable to achieve a very wide output voltage range under all load conditions.

For wide output voltage range applications, such as battery charging applications, the LLC resonant circuit parameters must carefully trade-off between efficiency and the output voltage range. In the prior art, many techniques for achieving a wide output voltage range have been developed, such as those disclosed in:

(a) "Design Methodology of LLC Resonant Converters for Electric Vehicle Battery Chargers," by J. Deng et al., published in the IEEE Transactions on Vehicular Technology, vol. 63, no. 4, pp. 1581-1592, May 2014;

(b) "An LLC Resonant DC-DC Converter for Wide Output Voltage Range Battery Charging Applications," by F. Musavi et al., published in IEEE Transactions on Power Electronics, vol. 28, no. 12, pp. 5437-5445, December 2013;

(c) "A Design Procedure for Optimizing the LLC Resonant Converter as a Wide Output Range Voltage Source," by R. Beiranvand et al., published in the IEEE Transactions on Power Electronics, vol. 27, no. 8, pp. 3749-3763, August 2012; and (d) "Optimal Design Methodology for LLC Resonant Converter in Battery Charging Applications Based on Time-Weighted Average Efficiency," by Z. Fang et al., published in the IEEE Transactions on Power Electronics, vol. 30, no. 10, pp. 5469-5483, October 2015.

Nevertheless, these techniques can only optimize the converter circuits to achieve a limited output voltage range (e.g., between 200 volts and 500 volts) in conventional EV charging applications.

To achieve a wider output voltage range with good efficiency, modifications of circuit structures and control schemes have been proposed for a conventional LLC resonant converter. For example, the article "Multimode Optimization of the Phase-Shifted LLC Series Resonant Converter" ("Mumtahina") by U. Mumtahina and P. J. Wolfs, published in IEEE Transactions on Power Electronics, vol. 33, no. 12, pp. 10478-10489, December 2018, discloses an LLC resonant converter that combines conventional frequency control and phase-shift control schemes to achieve a wide output voltage range. FIGS. 2A and 2B show, respectively, Mumtahina's full-bridge LLC resonant converter with closed-loop voltage control, and its timing diagrams under phase-shift control for switch control signals and primary-side full-bridge output voltage $V_{AB}$. Mumtahina teaches providing a phase shift between the two pairs of gate signals at the two legs of the primary side switches. Using both phase-shift control and switching frequency control, Mumtahina's LLC resonant converter operates at a lower switching frequency in a voltage step-down operation.

U.S. Pat. No. 9,263,960 B2 ("Jovanovic") to M. Jovanovic and B. Irving, entitled "Power Converters for Wide Input or Output Voltage Range and Control Methods Thereof," granted on Feb. 16, 2016, discloses a topology-morphing control method for a full-bridge LLC circuit that operates under either a full-bridge or a half-bridge topology.

FIGS. 3A and 3B show, respectively, Jovanovic's full-bridge LLC resonant converter under topology-morphing control, and its timing diagrams for switch control signals during a full-bridge to half-bridge topology transition. In Jovanovic, the circuit topology adapts to the control signals, which in return respond to the input or output operating conditions.

U.S. Patent Application Publication 2015/0229225A1 ("Jang") by Y. Jang and M. Jovanovic, entitled "Resonant Converter and Control Methods Thereof," filed on Aug. 13, 2015, discloses a control scheme for a series resonant converter (SRC) that combines a variable-frequency control scheme with a delay-time control scheme. FIG. 4 is a circuit diagram for Jang's SRC. In Jang, a variable frequency control scheme is applied to the primary-side switches, while a delay-time control scheme is applied to the secondary-side switches. The result is a boost to the output voltage, thus achieving a wider output voltage range, under control of a narrower switching frequency range.

Many other variations in topologies and control schemes have been proposed for conventional LLC resonant converters to achieve wide output voltage ranges. However, these variations all have drawbacks, such as complexity in implementation, increased part count, or undesired dynamics. In addition, these variations still do not achieve a sufficiently wide output voltage range. For example, a 200-volt to 1000-volt EV fast-charger remains to be attained.

One challenge in achieving a wide output voltage range is that the input voltage to the LLC resonant converter must be high enough to avoid an undesirably high DC gain. As each switching device on the primary side is required to block the full input voltage (see, e.g., the LLC resonant converter shown in FIG. 1A), a higher input voltage results in an increased cost in high voltage components.

To achieve a wide output voltage range, the input voltage to the LLC resonant converter must be high enough to avoid an undesirably high DC gain. In this regard, a three-level topology, in which each switching device blocks only one-half of the input voltage, is a more attractive alternative than the conventional full-bridge topology of FIG. 1A, and a three-level topology is disclosed, for example, in the article "The three-level ZVS PWM converter-a new concept in high voltage DC-to-DC conversion" ("Pinheiro"), by J. R. Pinheiro and I. Barbi, published in the Proceedings of the 1992 International Conference on Industrial Electronics, Control, Instrumentation, and Automation, San Diego, Calif., USA, 1992, pp. 173-178 vol. 1. The three-level topology is described for LLC converters in the article "Three-level LLC series resonant DC/DC converter" ("Gu"), by Y. Gu, et al., published in IEEE Transactions on Power Electronics, vol. 20, no. 4, pp. 781-789, July 2005. Gu's LLC converters achieve zero-voltage switching (ZVS) for the switches without additional auxiliary circuit.

A three-level serial half bridge (SHB) topology, also known as stacked buck topology, is disclosed in the article "DC-DC converter: four switches $V_{pk}=V_{in}/2$, capacitive turn-off snubbing, ZV turn-on" ("Barbi"), by I. Barbi, et al. in IEEE Transactions on Power Electronics, vol. 19, no. 4, pp. 918-927, July 2004. Barbi removes the two clamping diodes in the conventional three-level topology of Pinheiro.

A half-input voltage, two-level modulation scheme for a DC/DC converter is disclosed in the article "Asymmetrical Duty Cycle-Controlled LLC Resonant Converter With Equivalent Switching Frequency Doubler" ("Zong"), by S. Zong, et al., published in IEEE Transactions on Power Electronics, vol. 31, no. 7, pp. 4963-4973, 7 2016. Zong halves the switching frequency of the primary switches to reduce the driving loss.

For applications with wide input voltage ranges, both full-input-voltage two-level modulation and half-input-voltage two-level modulation schemes are applied to SHB LLC converters in the articles: (a) "Wide input voltage range compensation in DC/DC resonant architectures for on-board traction power supplies," by A. Coccia, et al., published in 2007 European Conference on Power Electronics and Applications, 2007; (b) "Variable Frequency Multiplier Technique for High-Efficiency Conversion Over a Wide Operating Range," by W. Inam, et al., publi Electronics, vol. 4, no. 2, pp. 335-343, June 2016; and (c) "Research on Dual-Operation Mode of 3-level LLC resonant converter," by A. Z. Li, et al., published in 2015 $9^{th}$ International Conference on Power Electronics and ECCE Asia (ICPE-ECCE Asia), 2015.

To achieve a wide output voltage range, the three-level modulation approach reduces the voltage gain once the maximum operating frequency has been reached. FIGS. 5A and 5B show, respectively, the circuit diagram and timing diagrams for the gate signals, demonstrating the three-level modulation schemes may also be effective approaches to regulate the output voltage. Under a three-level modulation scheme, however, the currents through the primary power switches are not balanced, which can cause thermal imbalance on the devices, shorten the device life and even lead to device damage. To balance the currents in the power switches, a periodically swapping modulation strategy is disclosed in the article "Periodically Swapping Modulation (PSM) Strategy for Three-Level (TL) DC/DC Converters With Balanced Switch Currents" ("Liu"), by D. Liu, et al., published in IEEE Transactions on Industrial Electronics, vol. 65, no. 1, pp. 412-423, January 2018. FIGS. 6A and 6B show, respectively, the circuit diagram and timing diagrams for the gate signals in Liu's DC/DC converters. However, Liu's gate signals of each half-bridge are not complementary, which increases the complexity of the gate driving circuit. In addition, the body diode of the MOSFETs conducts current due to the non-optimized gate signals, which increases conduction loss and reduces system efficiency.

Therefore, there is a need of providing an improved power converter in order to overcome the drawbacks of the conventional technologies.

SUMMARY OF THE INVENTION

It is an object of the present invention to provide an isolated DC/DC converter for wide output voltage range and a control method thereof so as to address the above-mentioned issues encountered by the prior arts.

According to one embodiment of the present invention, a power converter (e.g., resonant DC/DC) capable of receiving an input signal from a fixed or variable input voltage source to provide an output voltage or an output current to at least one load includes (a) a primary-side circuit having: (i) series-connected first and second pairs of series-connected switching devices, each of the switching devices being controlled by a switch control signal, wherein the input signal is provided across the series-connected first and second pairs of switching devices; (ii) an LC resonant circuit connected between a first electrical node in the first pair of the switching devices and a second electrical node in the second pair of switching devices; and (iii) an isolation transformer having first and second windings, wherein the first winding is connected between third and fourth electrical nodes in the LC resonant circuit; (b) a secondary-side circuit connected in parallel with the second winding of the isolation transformer, the secondary-side circuit including a filter capacitor providing the output voltage or the output current to the at least one load; and (c) a control circuit, wherein the control circuit selects, at any given time, one of two or more modulating schemes and provides the switch control signals to operate the switching devices of the primary-side circuit under the selected modulation scheme, based on at least one of the output voltage, the output current, the input signal, and one or more external control signals.

Accordingly, highly efficient methods of the embodiments of the present invention enable an SHB LLC resonant converter to regulate an output voltage over a wide range using a narrow device switching frequency range. A method of the embodiment of the present invention may use both modulation scheme control and device switching frequency control. During operation, the modulation scheme may be selected in response to one or more control signals provided from a controller or in an external command. The device switching frequency may be determined, for example, under a closed-loop control of a regulated output voltage. Based on the selected modulation scheme and the device switching frequency, the controller may generate the control signals that drive the primary-side switching devices of the SHB LLC resonant converter.

In one embodiment of the present invention, to achieve a regulated voltage in a high output-voltage range, the SHB LLC resonant converter operates under a symmetrical modulation scheme, with its device switching frequency being adjusted under closed-loop control. To achieve a regulated voltage in a low output-voltage range, the SHB LLC resonant converter operates under an asymmetrical modulation scheme, with device switching frequency control. To achieve a regulated voltage in an extra low output-voltage range, the SHB LLC resonant converter operates under a three-level modulation scheme of the embodiment of the present invention at the maximum allowable switching frequency, with its duty cycle being adjusted under closed-loop control. Thus, the SHB LLC resonant converter operates under a narrower device switching frequency range with improved efficiency, while still achieving a very wide output-voltage range under different load conditions. In addition, the methods of the present invention have lesser restrictions on certain circuit parameters (e.g., the $L_m$-to-$L_r$ ratio) while achieving desired minimum and maximum DC voltage gains. The methods of the present invention are applicable to resonant converters with different secondary-side topologies and secondary-side control schemes. The methods of the present invention operate under both fixed input-voltage and variable input-voltage conditions.

In one embodiment of the present invention, an LLC SHB resonant converter transits from two-level asymmetric modulation to three-level modulation and vice versa. The three-level topology is used when the ratio of the input voltage to the output voltage is in a low range, i.e., when the input voltage is low or when the output voltage is high. Alternatively, the modulation is changed to two-level asymmetric modulation when the input to output voltage ratio is in the high range, i.e., when the input voltage is high or the output voltage is low. The transition between the two modulations is implemented via trajectory control and/or pulse-width-modulation (PWM) control of the four switches. Specifically, if the trajectory control is used, when transitioning between the two-level asymmetric modulation and the three-level modulation, an extra voltage level of resonant tank voltage is inserted between the two modulations, and the duration of the extra voltage level is predetermined by a modulation transition controller. Specifically, if PWM control is applied, when transitioning from the three-level modulation to the two-level asymmetric modulation, the duty ratio of one of every two pulses of one of the first pair of switching devices is decreased from 50% to 0% and the duty ratio of one of every two pulses of one of the second pair of switching devices is decreased from 50% to 0%.

The present invention is better understood upon consideration of the following detailed description and accompanying figures.

BRIEF DESCRIPTION OF THE DRAWINGS

FIG. 11 indicates signal transitions at times $t_1$, $t_2$, $t_3$, $t_4$, $t_5$, $t_6$, $t_7$, $t_8$, $t_9$, $t_{10}$, $t_{11}$, $t_{12}$, $t_{13}$, $t_{14}$, $t_{15}$, and $t_{16}$;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
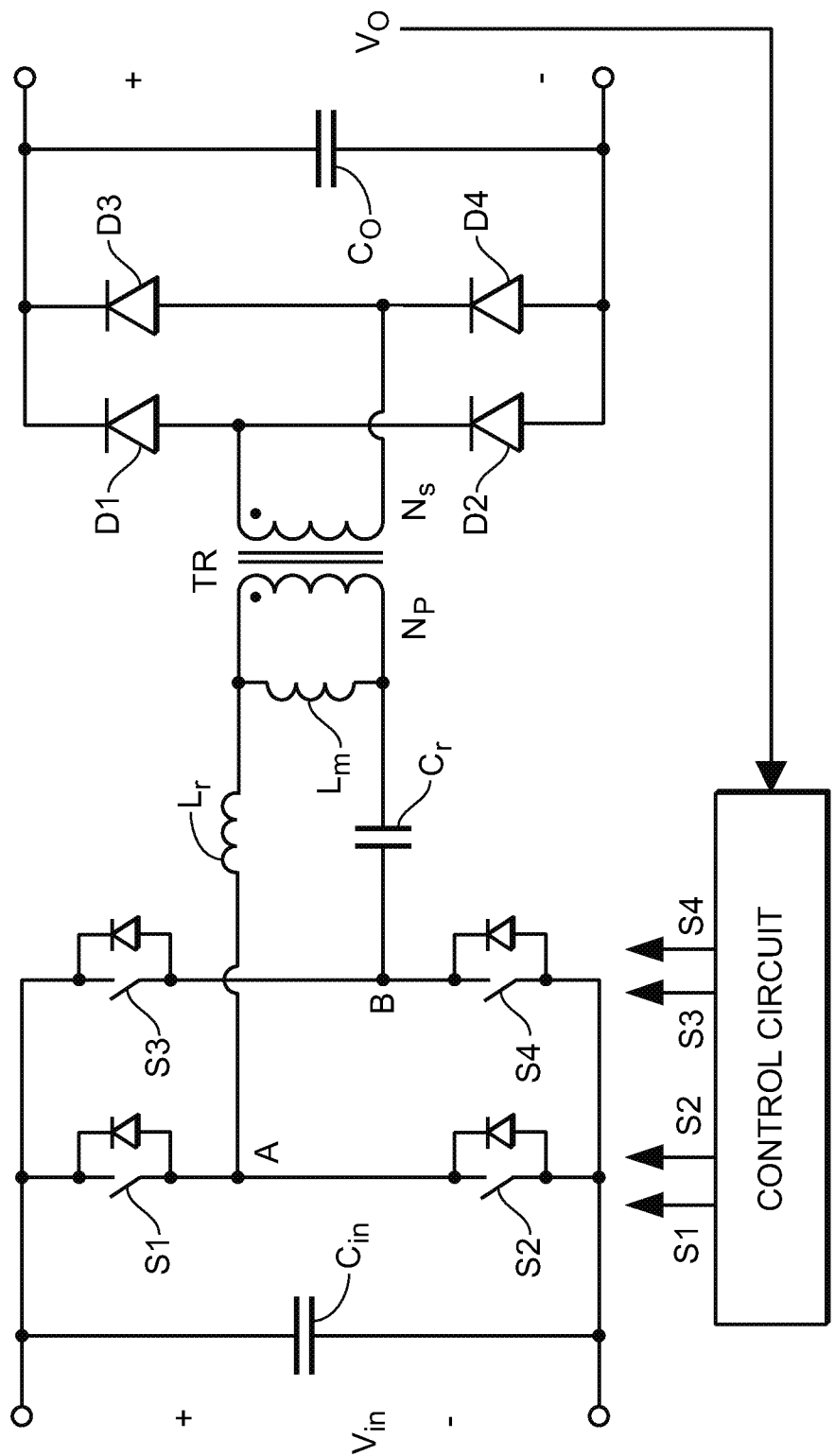
FIGS. 1A and 1B show, respectively, an exemplary conventional full-bridge LLC resonant converter under closed-loop voltage control, and its timing diagrams for switch control signals and primary-side full-bridge output voltage $V_{AB}$.
Figure 1B:
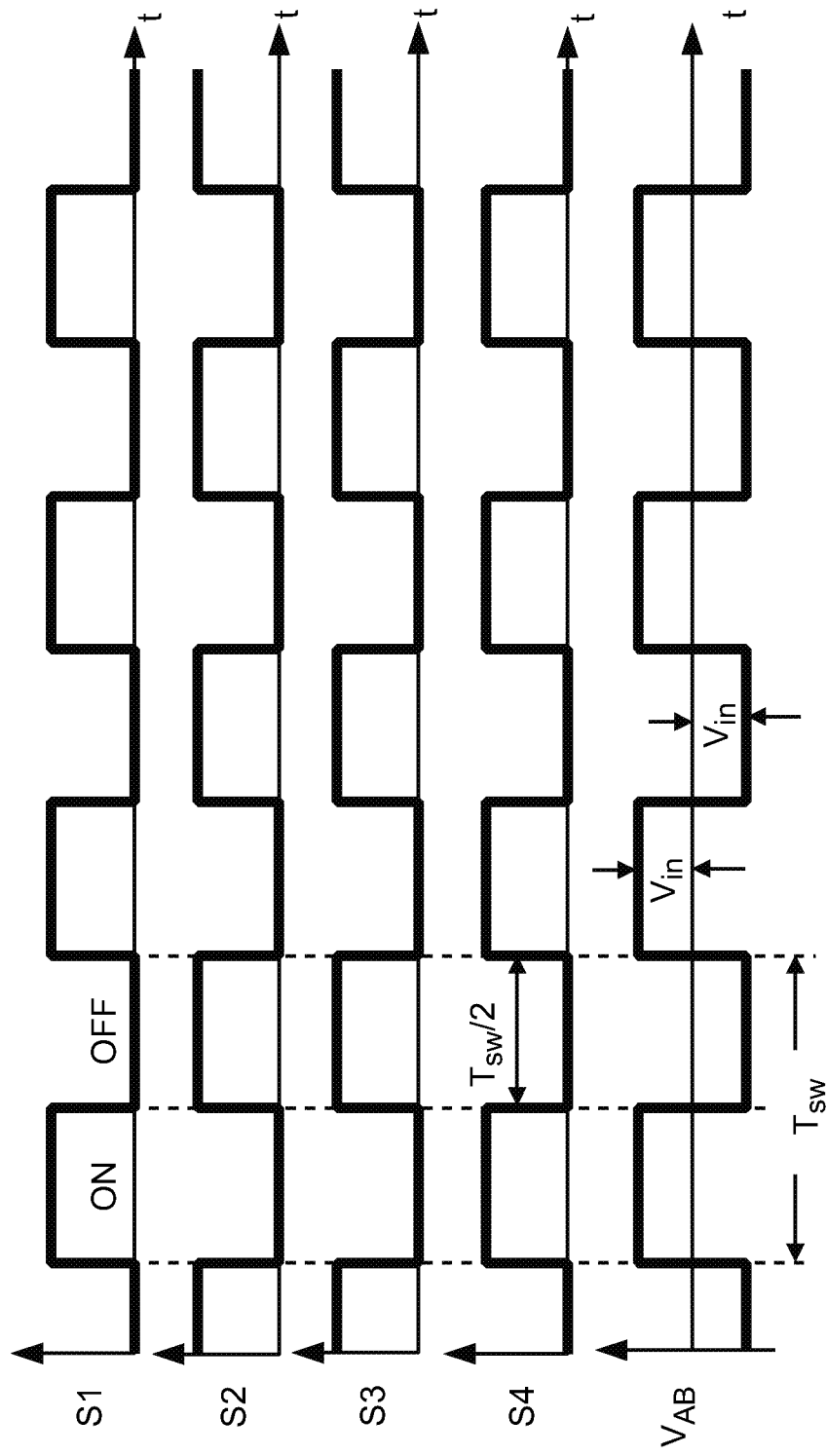
Figure 2A:
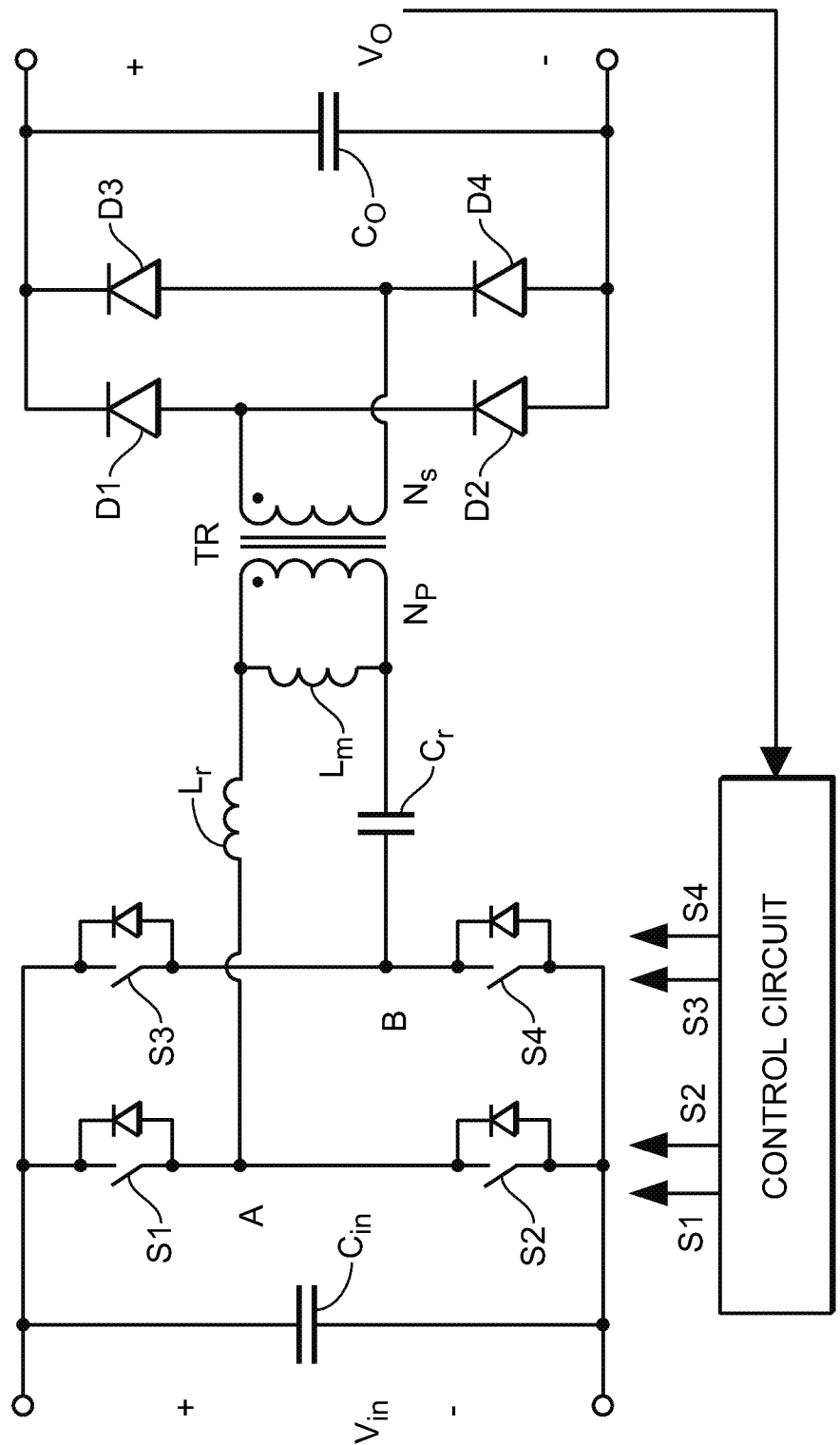
FIGS. 2A and 2B show, respectively, an exemplary conventional full-bridge LLC resonant converter with closed-loop voltage control, and its timing diagrams under phase-shift control for switch control signals and primary-side full-bridge output voltage $V_{AB}$.
Figure 2B:
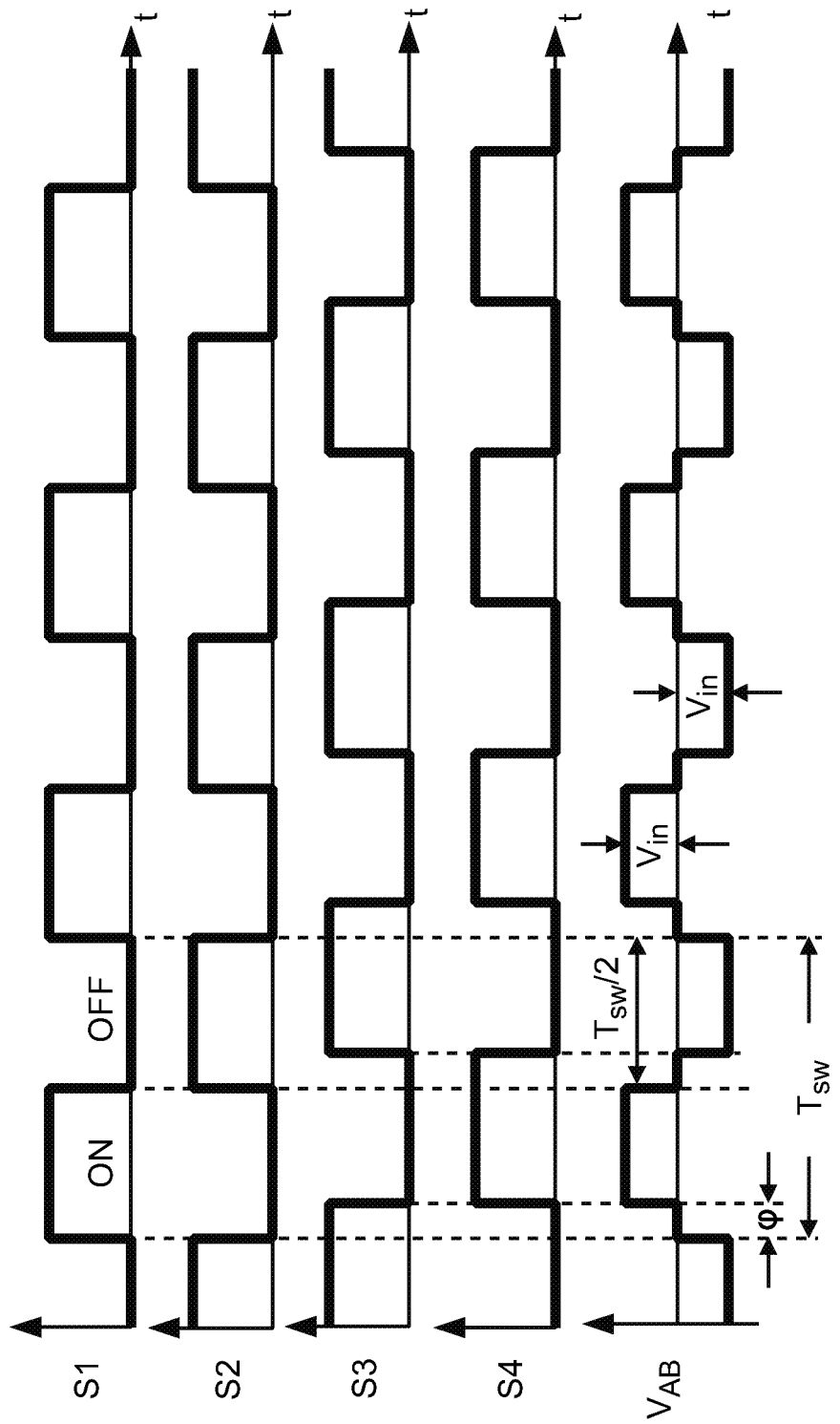
Figure 3A:
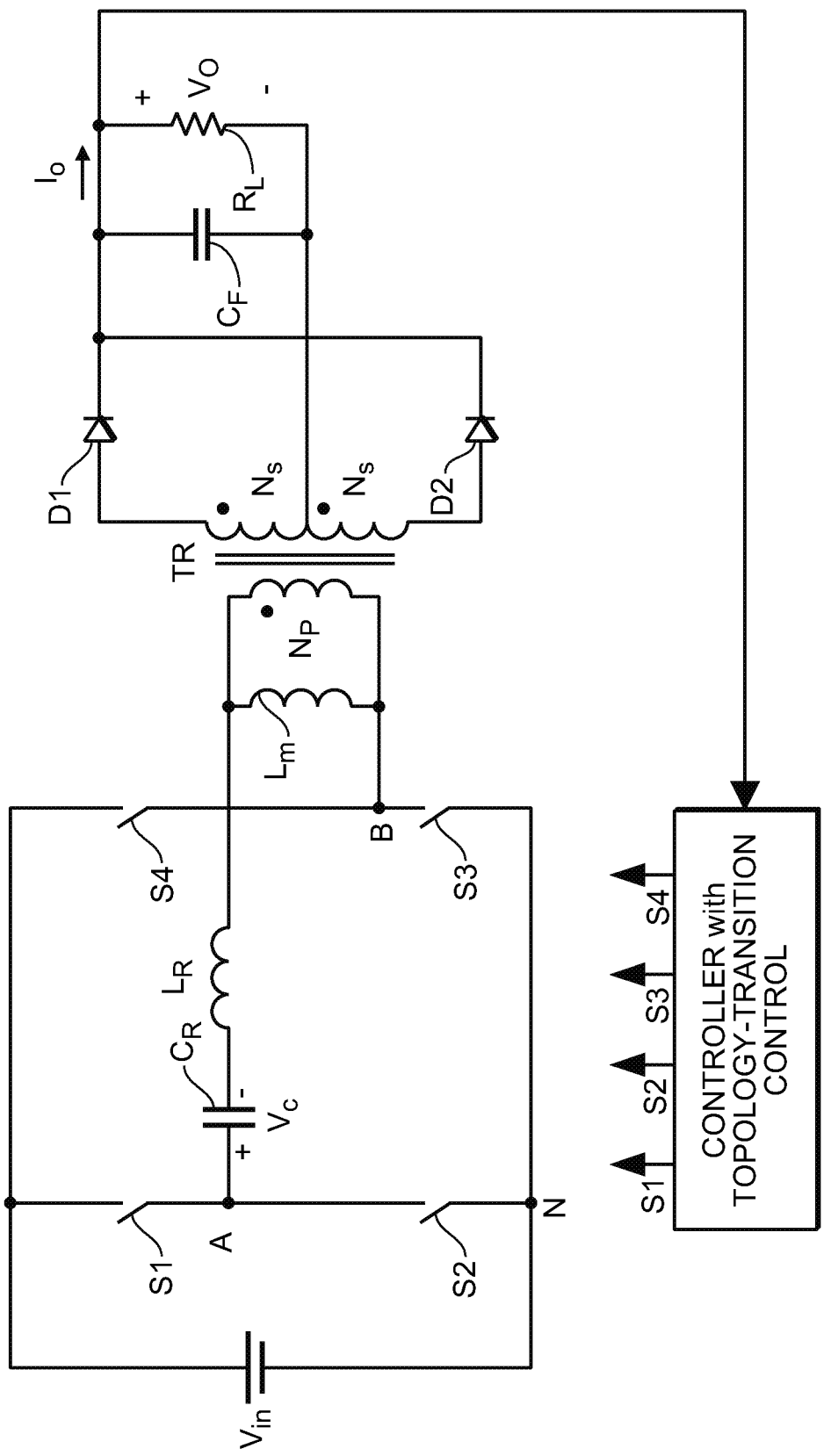
FIGS. 3A and 3B show, respectively, an exemplary conventional full-bridge LLC resonant converter under topology-morphing control, and its timing diagrams for switch control signals during a full-bridge to half-bridge topology transition.
Figure 3B:
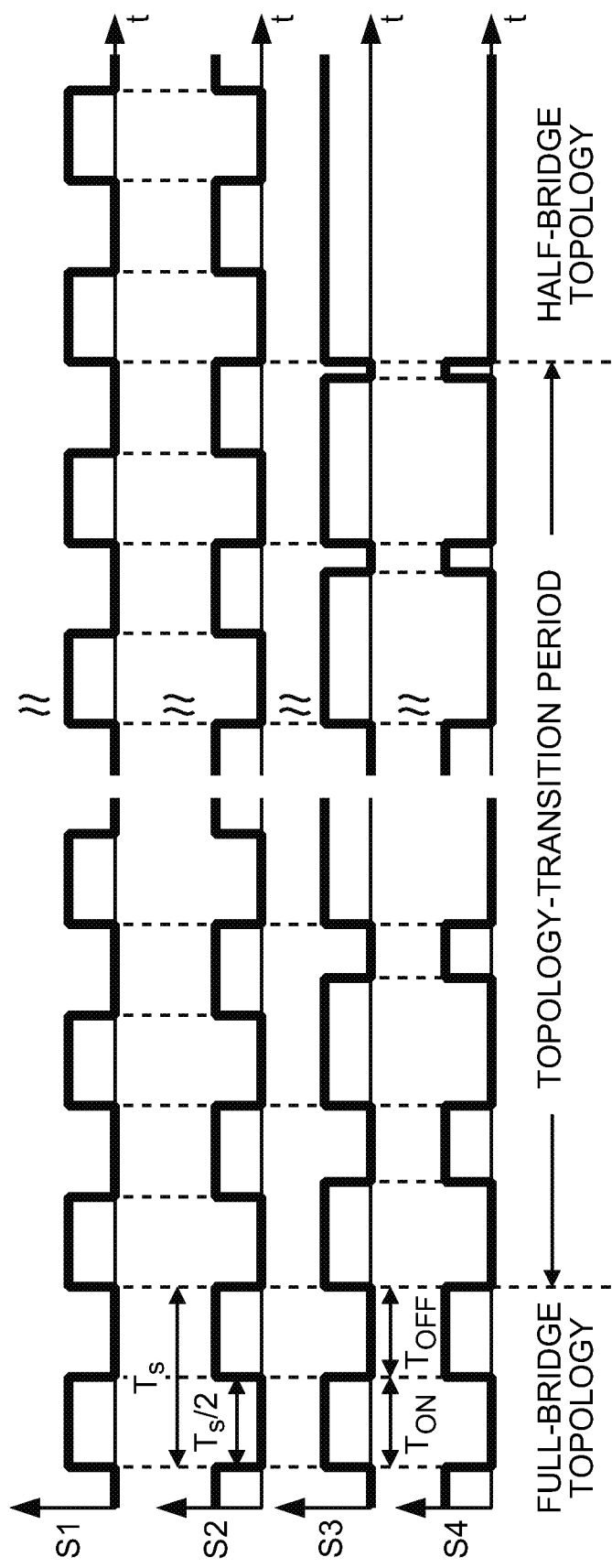
Figure 4:
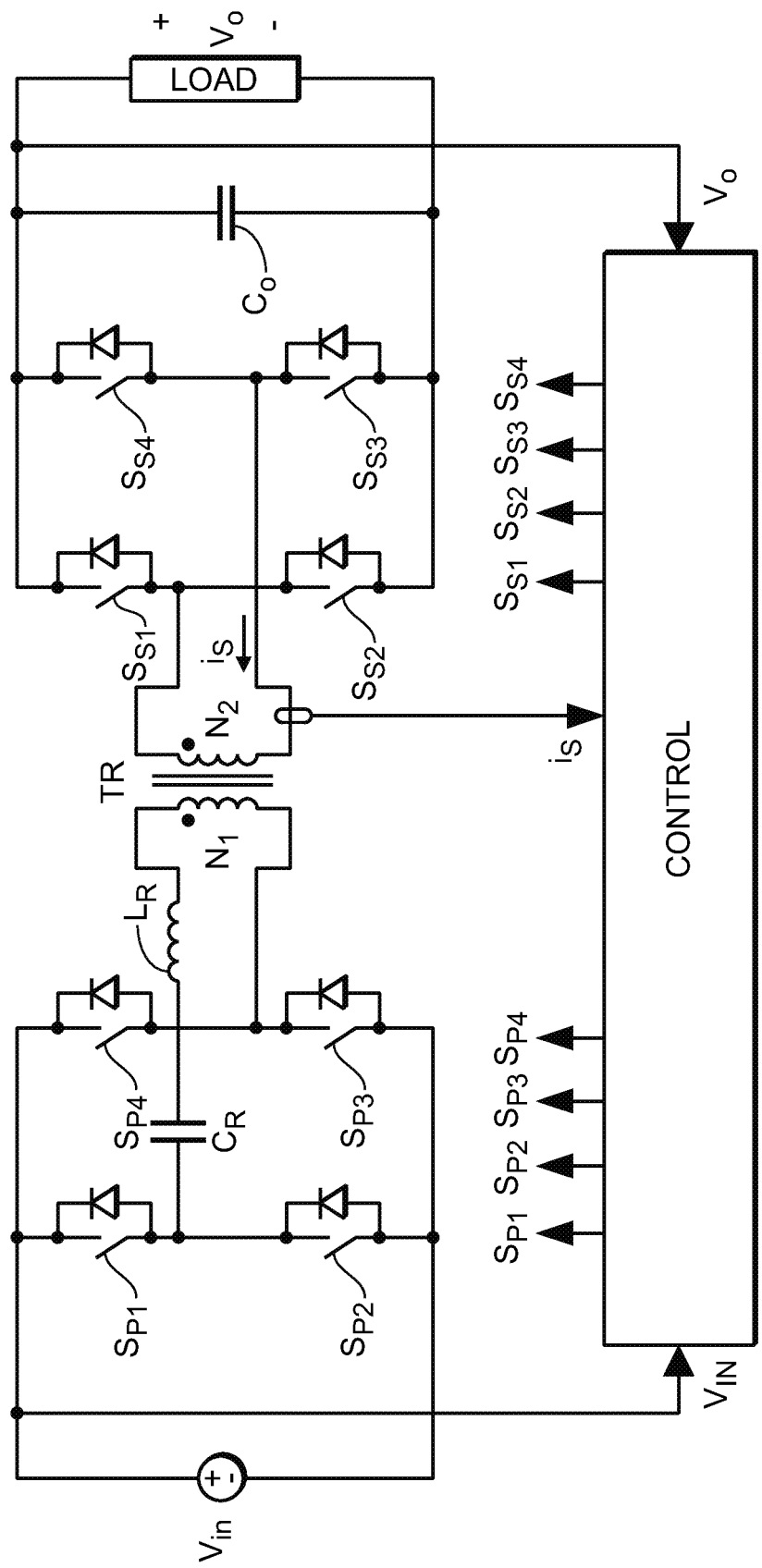
FIG. 4 shows an exemplary conventional full-bridge series-resonant converter under frequency and delay-time control.
Figure 5A:
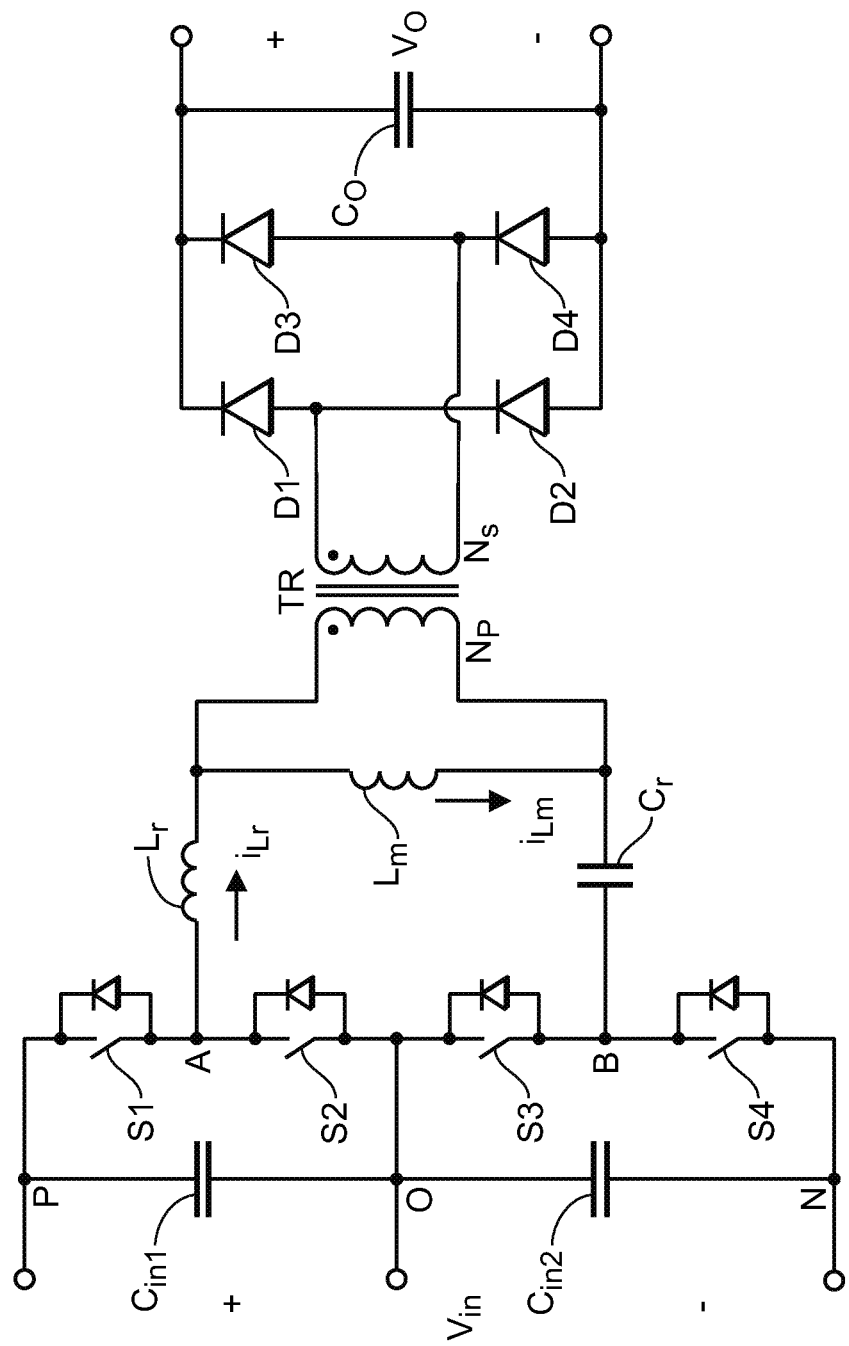
FIGS. 5A and 5B show, respectively, an exemplary serial half-bridge LLC resonant converter and its timing diagrams under asymmetric three-level control for switch control signals S1 to S4 and primary-side output voltage $V_{AB}$.
Figure 5B:
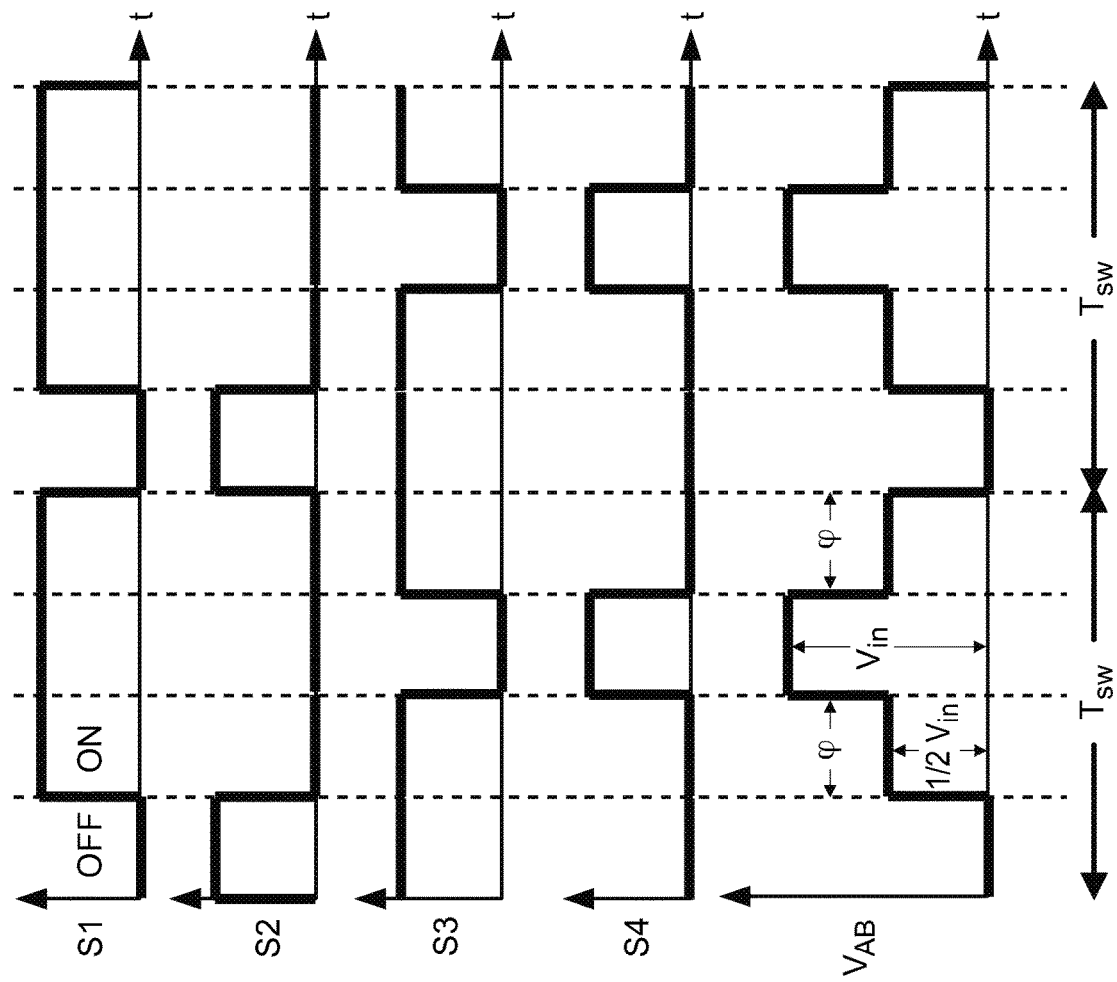
Figure 6A:
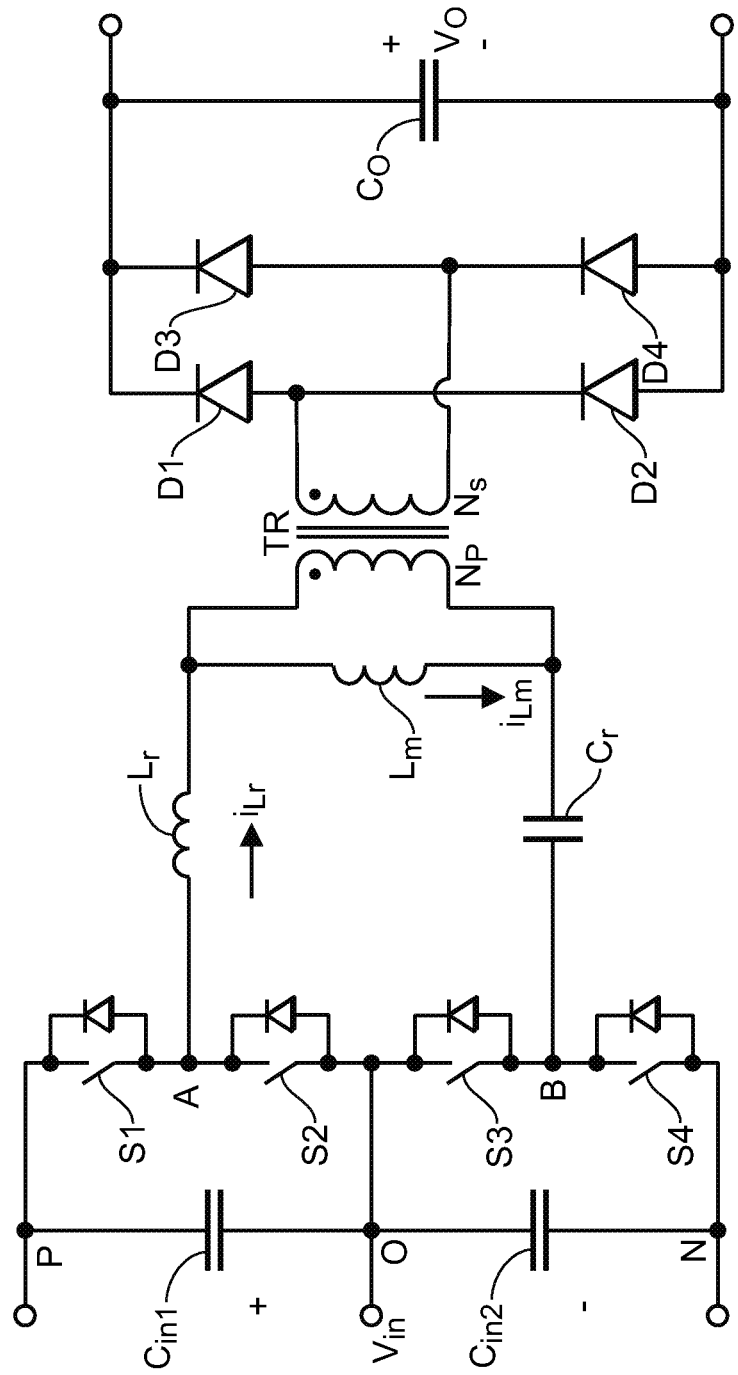
FIGS. 6A and 6B FIG. show, respectively, an exemplary serial half-bridge LLC resonant converter and its timing diagrams under periodically swapping three-level control for switch control signals S1 to S4 and primary-side output voltage $V_{AB}$.
Figure 6B:
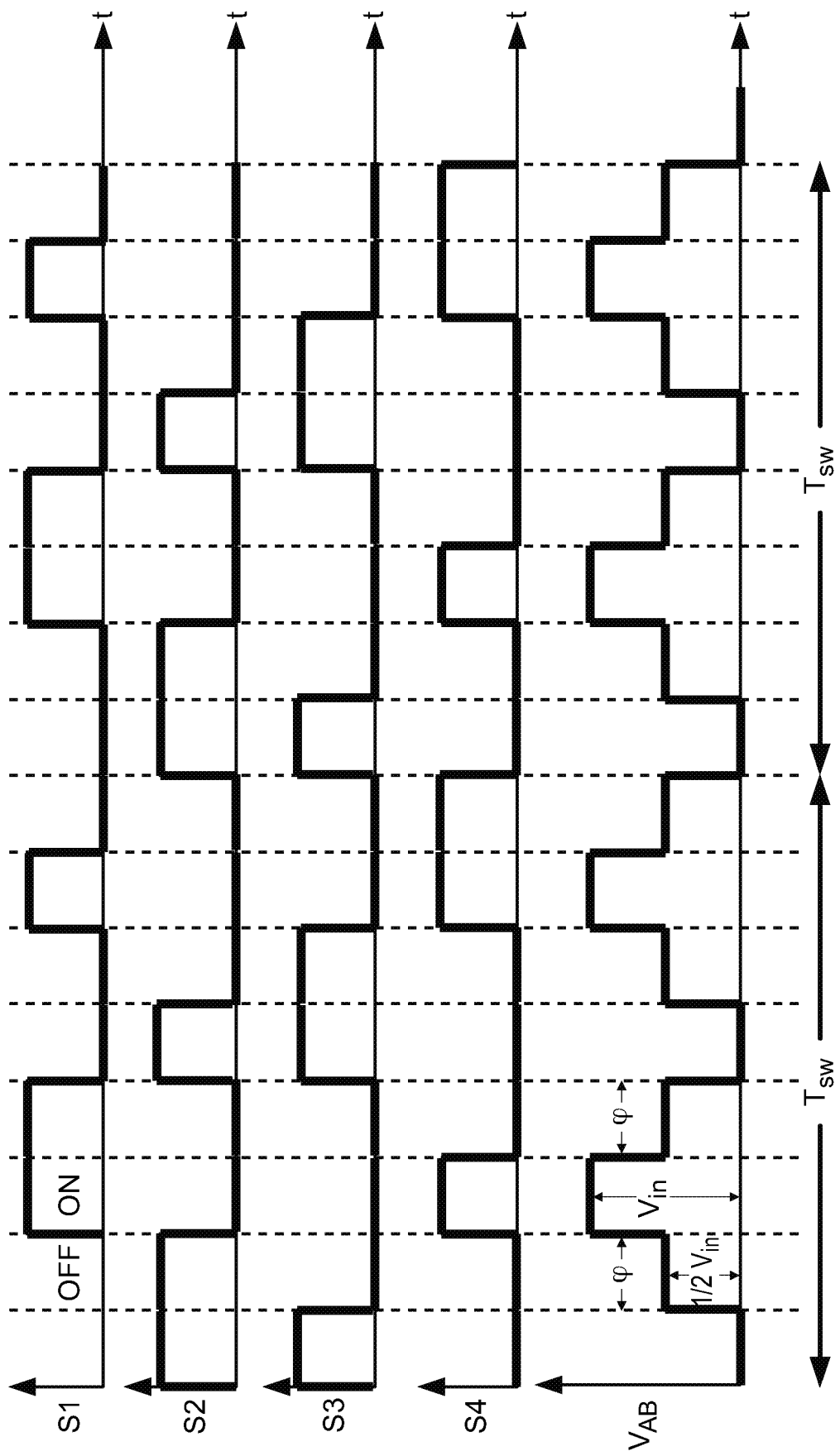
Figure 7A:
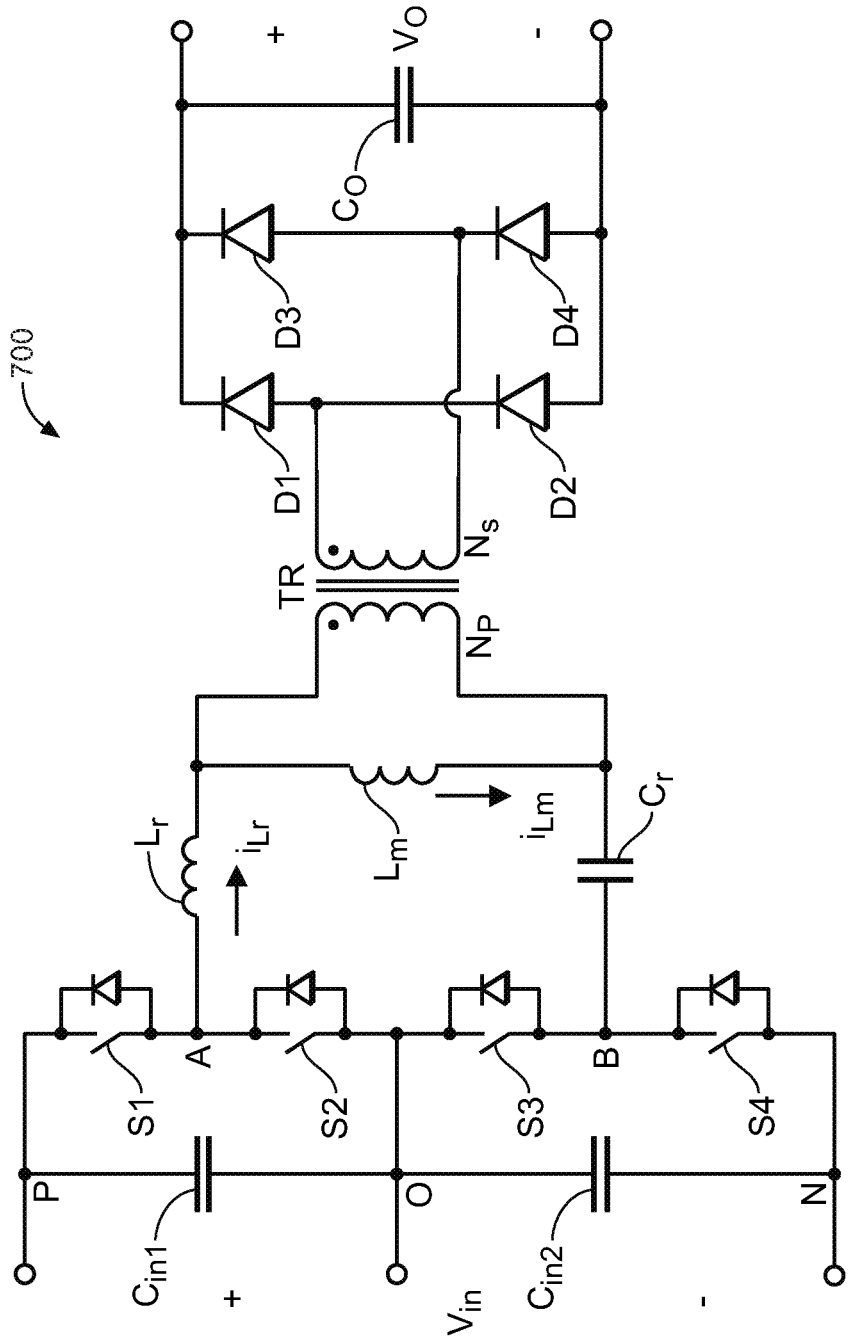
FIGS. 7A, 7B and 7C show, respectively, (i) exemplary serial half-bridge (SHB) LLC resonant converter 700 with a full-wave secondary-side diode rectifier, (ii) its timing diagrams under symmetrical modulation for switch control signals to switching devices $S_1$ to $S_4$ and phase leg output voltage $V_{AB}$, and (iii) its timing diagrams under asymmetrical modulation for switch control signals to switching devices $S_1$ to $S_4$ and phase leg output voltage $V_{AB}$.

To avoid the higher cost associated with a higher input voltage, a multi-level topology may be used to maintain the same device voltage rating for the primary-side bridge. FIG. 7A shows a SHB topology (also known as "stacked buck topology") that provides LLC resonant converter 700 that has a serial half-bridge on the primary-side. As shown in FIG. 7A, the serial half-bridge includes four series-connected switching devices $S_1$ to $S_4$, configured such that each switching device $S_1$ to $S_4$ blocks one-half of the input voltage across input terminals P and N. The input terminals P and N are provided across series-connected input capacitors $C_{in1}$ and $C_{in2}$, and across the switching devices $S_1$ and $S_4$. The common terminal of the input capacitors $C_{in1}$ and $C_{in2}$ is also the common terminal between the switching devices $S_2$ and $S_3$, such that the input capacitor $C_{in1}$ is connected in parallel with the switching devices $S_1$ and $S_2$, and the input capacitor $C_{in2}$ is connected in parallel with the switching devices $S_3$ and $S_4$. A full-wave diode rectifier $D_1$ to $D_4$ is provided on the secondary side. A filter capacitor $C_o$ is provided on the secondary side and configured to provide the output voltage $V_o$ or output current $I_o$ to the load.

A first phase-leg output terminal A is provided at the common terminal between the switching devices $S_1$ and $S_2$, while a second phase-leg output terminal B is provided at the common terminal between the switching devices $S_3$ and $S_4$. Connected across the terminals A and B is a resonant circuit formed by isolation transformer TR and series-connected resonant inductor $L_r$, resonant capacitor $C_r$, and transformer magnetizing inductor $L_m$. The primary-side winding of the isolation transformer TR is connected in parallel with the magnetizing inductor $L_m$. The secondary-side winding of the isolation transformer TR may be either (i) a center-tapped winding with two rectification components, or (ii) a single winding with a full-bridge rectifier. Each of the switching devices $S_1$ to $S_4$ blocks its share of the input voltage in one direction, but each conducts a current in both directions. Each of the switching devices $S_1$ to $S_4$ may be implemented by a semiconductor switch (e.g., MOSFET, IGBT, BJT or another semiconductor switch). Alternately, instead of a diode rectifier circuit, the secondary-side may be implemented by a synchronous rectifier, which reduces conduction loss.

Figure 7B:
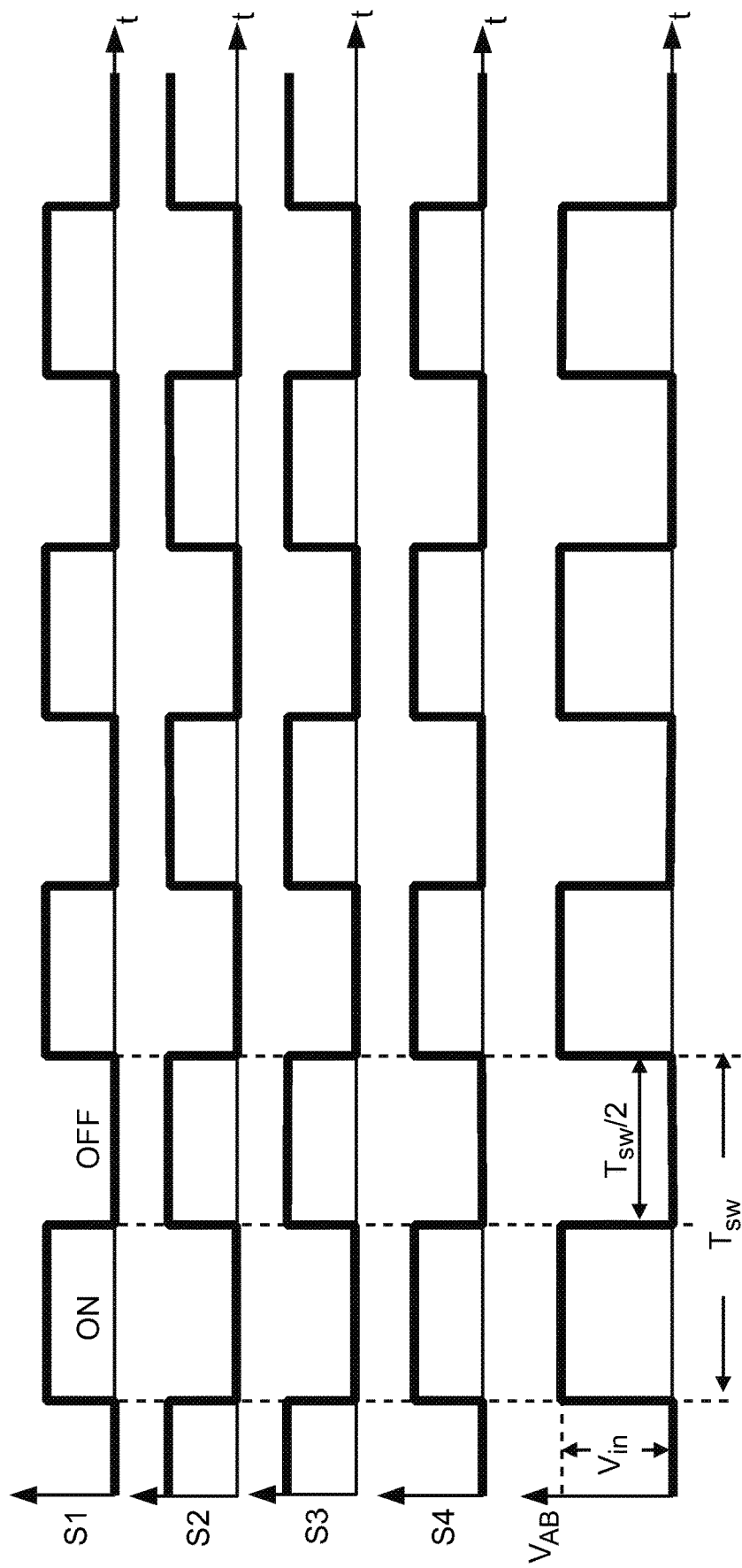
Figure 7C:
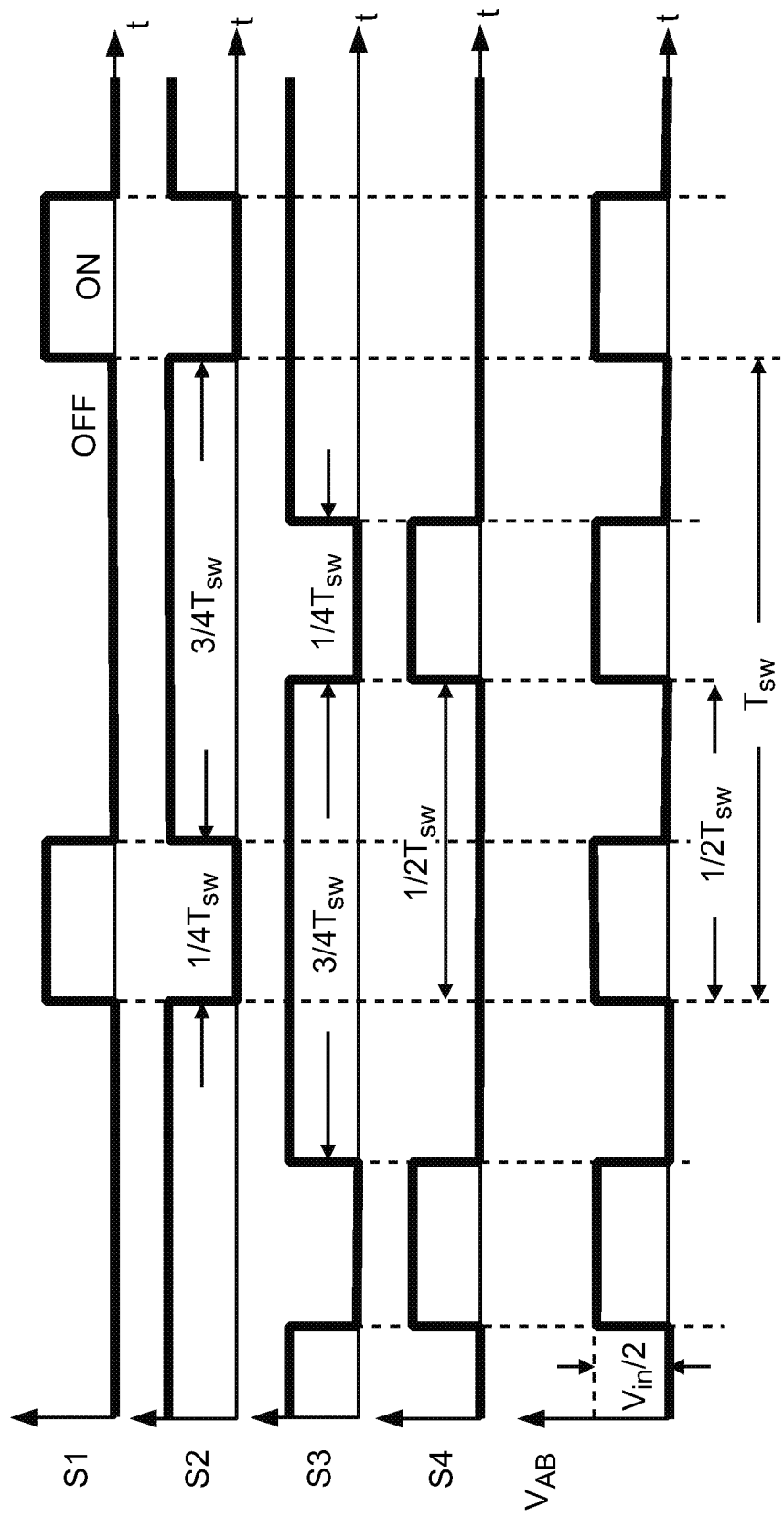

FIGS. 7B and 7C illustrate, respectively, "symmetrical" and "asymmetrical" modulation schemes for the SHB LLC resonant converter 700 of FIG. 7A. Each modulation scheme controls the switch control signals to operate the switching devices $S_1$ to $S_4$. In either modulation scheme, the signals that operate the switching devices $S_1$ and $S_2$ are complementary, and the signals for operating the switching devices $S_3$ and $S_4$ are also complementary. In practice, a small dead-time is inserted between each pair of complementary switch control signals to avoid a phase-leg shoot-through. FIG. 7B shows, under symmetrical modulation, the timing diagrams of the switch control signals for the switching devices $S_1$ to $S_4$ and phase-leg output voltage $V_{AB}$. The switch control signals operating the switching devices $S_1$ and $S_4$ are in-phase signals having the same 50% duty cycle waveform. Likewise, the switch control signals operating the switching devices $S_2$ and $S_3$ are also in-phase signals having the same 50% duty cycle waveform, except that the switch control signals operating the switching devices $S_1$ and $S_4$ are complementary to the switch control signals operating the switching devices $S_2$ and $S_3$. Consequently, the phase leg output voltage $V_{AB}$ (i.e., bridge output voltage) switches between $V_{in}$ and 0 with a 50% duty cycle at the device switching frequency.

FIG. 7C shows, under asymmetrical modulation, the timing diagrams of the switch control signals to the switching devices $S_1$ to $S_4$ and phase-leg output voltage $V_{AB}$. As shown in FIG. 7C, the switch control signals that operate the switching devices $S_1$ and $S_4$ are 25% duty cycle signals that are phase-shifted 180° of each other, while the switch control signals that operate the switching devices $S_2$ and $S_3$ are 75% duty cycle signals that are also phase-shifted 180° of each other. With this asymmetrical modulation, the voltage across the input capacitor $C_{in1}$ is provided as the phase-leg output voltage $V_{AB}$ when the switching devices $S_1$ and $S_3$ are closed, the voltage across the input capacitor $C_{in2}$ is provided as the phase-leg output voltage $V_{AB}$ when the switching devices $S_2$ and $S_4$ are closed, and the phase-leg output voltage $V_{AB}$ is zero volts when the switching devices $S_2$ and $S_3$ are closed. Thus, the phase-leg output voltage $V_{AB}$ switches between $0.5V_{in}$ and 0 volts at 50% duty cycle at twice device switching frequency $f_r$. In either modulation scheme, device switching frequency $f_{sw}$ may be a control variable that helps achieve different control targets.

Symmetrical and asymmetrical modulation schemes of FIGS. 7B and 7C each generates a different phase-leg output voltage $V_{AB}$ across the series-connected $L_r$-$C_r$-$L_m$ resonant circuit; the phase-leg output voltage $V_{AB}$ includes different DC and AC components. During the LLC resonant converter 700 operations, the resonant capacitor $C_r$ blocks the DC component, so that only the AC component appears across the primary-side windings of the isolation transformer TR. When device switching frequency $f_{sw}$ equals the resonant frequency $$f_r = \frac{\sqrt{L_r C_r}}{2\pi},$$

the output voltage $V_O$ equals the average of the product of the rectified AC component of the phase leg output voltage $V_{AB}$ and a transformer voltage gain. As the transformer voltage gain is the turns ratio $$\frac{N_S}{N_P},$$

where $N_S$ and $N_P$ are the numbers of turns in the secondary-side winding and the primary-side winding, respectively, the output voltage $V_O$ is given by:

$$V_0 = \frac{N_P \overline{V_{AB\_ac}}}{N_S},$$

where $$\overline{V_{AB\_ac}}$$

is the average of the rectified AC component of the phase-leg output voltage $V_{AB}$.

For the symmetrical modulation, the AC component of the phase-leg output voltage $V_{AB}$ is a 50% duty cycle bipolar square-wave with amplitude $$\frac{V_{in}}{2}$$

at the device switching frequency $f_{sw}$ such that the DC voltage gain at the resonant frequency $f_r$ is $$\frac{N_S}{2N_P}.$$

For the asymmetrical modulation, the AC component of the phase-leg output voltage $V_{AB}$ is a 50% duty cycle bipolar square-wave with amplitude $$\frac{V_{in}}{4}$$

at twice the device switching frequency $f_{sw}$, such that the DC voltage gain at the resonant frequency $f_r$ is $$\frac{N_S}{2N_P}.$$

Thus, the DC voltage gain at the resonant frequency $f_r$ under symmetrical modulation is twice the DC voltage gain at the resonant frequency $f_r$ under asymmetrical modulation, and the voltage gain for the LLC resonant converter 700 may be adjusted by switching frequency control.

As mentioned above, maximum efficiency is achieved when the LLC resonant converter 700 is operated at the operating point at or very close to the resonant frequency $f_r$. To achieve a wide output voltage range, conventional control changes the device switching frequency $f_r$ to adjust the DC voltage gain. However, switching frequency control moves the operating point away from maximum circuit efficiency. Further, for a very wide output voltage range, even such a control may still be unable to achieve the required DC voltage gain given the fixed circuit parameters.

Figure 8:
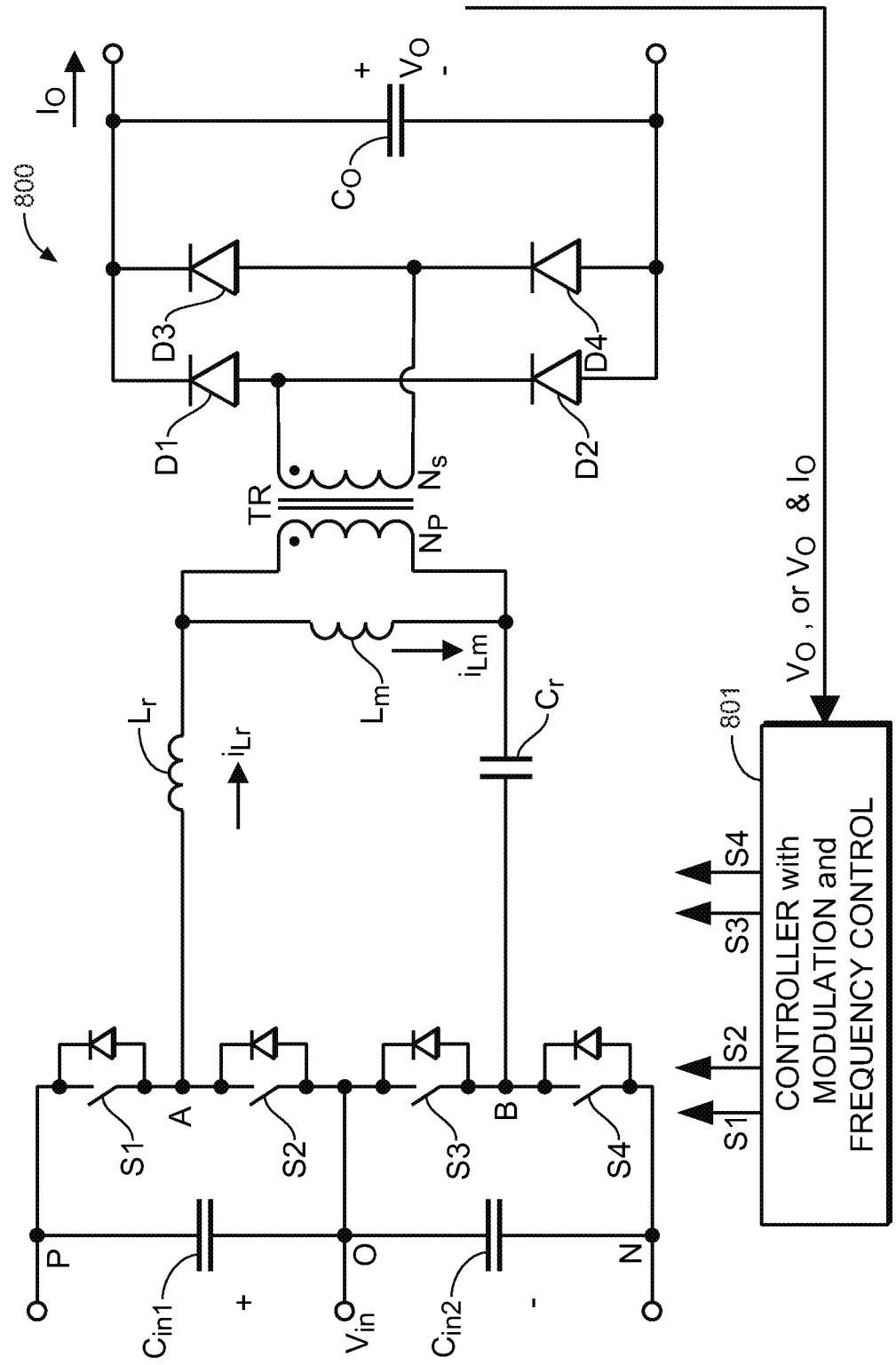
FIG. 8 is a schematic diagram showing SHB LLC resonant converter 800, which includes control circuit 801 that generates switch control signals for switching devices $S_1$ to $S_4$ based on output voltage $V_o$ (and, optionally, output current $I_o$), according to one embodiment of the present invention.

The inventors of the present invention recognize that a SHB LLC resonant converter can provide a very wide output voltage range, while efficiently achieving desirable different DC voltage gains at or near the resonant frequency (i.e., a narrower input switching frequency range), using a combination of different modulation schemes. Moreover, the control method of the embodiment of the present invention achieves the wide output voltage range and the circuit gains even though the circuit parameter values are fixed. FIG. 8 is a schematic diagram showing SHB LLC resonant converter 800, which includes a control circuit 801 that generates switch control signals to switching devices $S_1$ to $S_4$ based on output voltage $V_O$ (and, optionally, output current $I_o$), according to one embodiment of the present invention.

In SHB LLC resonant converter 800, the control circuit 801 may use the output voltage $V_O$ as its main control target. Output current $I_O$ may also be used as either a separate control target or as a feedback signal representative of a load condition. A reference value representative of each control target may be generated internally in the control circuit 801 or from an external source. In an embodiment, the selected modulation scheme may be selected by the control circuit under direction of an external management controller. Based on a difference between the sensed voltage $V_o$ (or the sensed current $I_o$) and the corresponding reference value, the control circuit 801 switches among two or more modulation schemes that operate the switching devices $S_1$ to $S_4$ on the primary-side phase leg of SHB LLC resonant converter 800. One or more of the control targets may be used to determine values of other control parameters, such as device switching frequency $f_{sw}$ and a phase-shift in the selected modulation scheme. The switch control signals that operate the switching devices $S_1$ to $S_4$ on the primary side are generated based on the selected modulation scheme and other control parameter values.

In FIG. 8, the transformer turns ratio $$\frac{Ns}{Np}$$

of the isolation transformer TR, which is merely a scale factor in this instance, is set to 1, to simplify this detailed description. As illustrated in FIGS. 7B and 7C, the symmetrical modulation scheme provides twice the output voltage Vo as the asymmetrical modulation scheme at the device switching frequency $f_{sw}$ at or about the resonant frequency $f_r$. Specifically, under symmetrical modulation, the phase-leg output voltage $V_B$ (and, hence, output voltage $V_o$ also) at the resonant frequency f is $0.5V_{in}$. In one embodiment, the resonant parameters of the isolation transformer TR are such that, when the device switching frequency $f_{sw}$ varies from $0.5f_r$ to $1.4f_r$, the output voltage $V_o$ varies from $0.3V_{in}$ to $0.8V_{in}$. Likewise, under asymmetrical modulation, the phase-leg output voltage $V_B$ (and, hence, output voltage $V_o$ also) at the resonant frequency $f_r$ is $0.25V_{in}$. In the same embodiment, the resonant parameters of the isolation transformer TR are such that, when the device switching frequency $f_{sw}$ varies from $0.25f_r$ to $0.8f_r$, the output voltage $V_o$ varies from $0.125V_{in}$ to $0.4V_{in}$. (Recall that the device switching frequency $f_r$ is only half the frequency of the phase-leg output voltage $V_{AB}$.) Accordingly, the present invention further provides a control method that combines a selection of a modulation scheme and frequency control to achieve a predetermined output voltage range. (The modulation schemes may overlap in their respective output voltage regulation ranges.) Modulation scheme selection under the embodiment of the present invention may be based, for example, on control parameters such as voltage control target, load condition, and allowable operating frequency range. When one or more of the conditions change such that a modulation scheme different from the current scheme is preferred, the control circuit 801 effectuates a transition from the current modulation scheme to the preferred modulation scheme.

In the embodiment described above, SHB LLC resonant converter 800 may have an output voltage range $V_o$ between $0.125V_{in}$ and $0.8V_{in}$, with the device switching frequency $f_{sw}$ ranged between $0.25f_r$ to $1.6f_r$. The maximum-to-minimum DC gain ratio is 6.4, and the maximum device switching frequency $f_{sw}$ is only $1.6f_r$. For a low output voltage, the device switching frequency $f_{sw}$ is not required to increase significantly, as in the case of conventional frequency control, thereby significantly switching loss. (In fact, the device switching frequency $f_{sw}$ is even reduced when the frequency-doubling asymmetrical modulation scheme is used for the low output voltage.) The maximum device switching frequency $f_{sw}$ is largely reduced under a method of the embodiment of the present invention especially at very low output voltage, at very light load condition or both. By adjusting circuit parameter values, an even higher maximum-to-minimum DC gain ratio can be achieved, over the same narrow device switching frequency range, which is not achieved in SHB LLC resonant converters using conventional control.

Figure 9A:
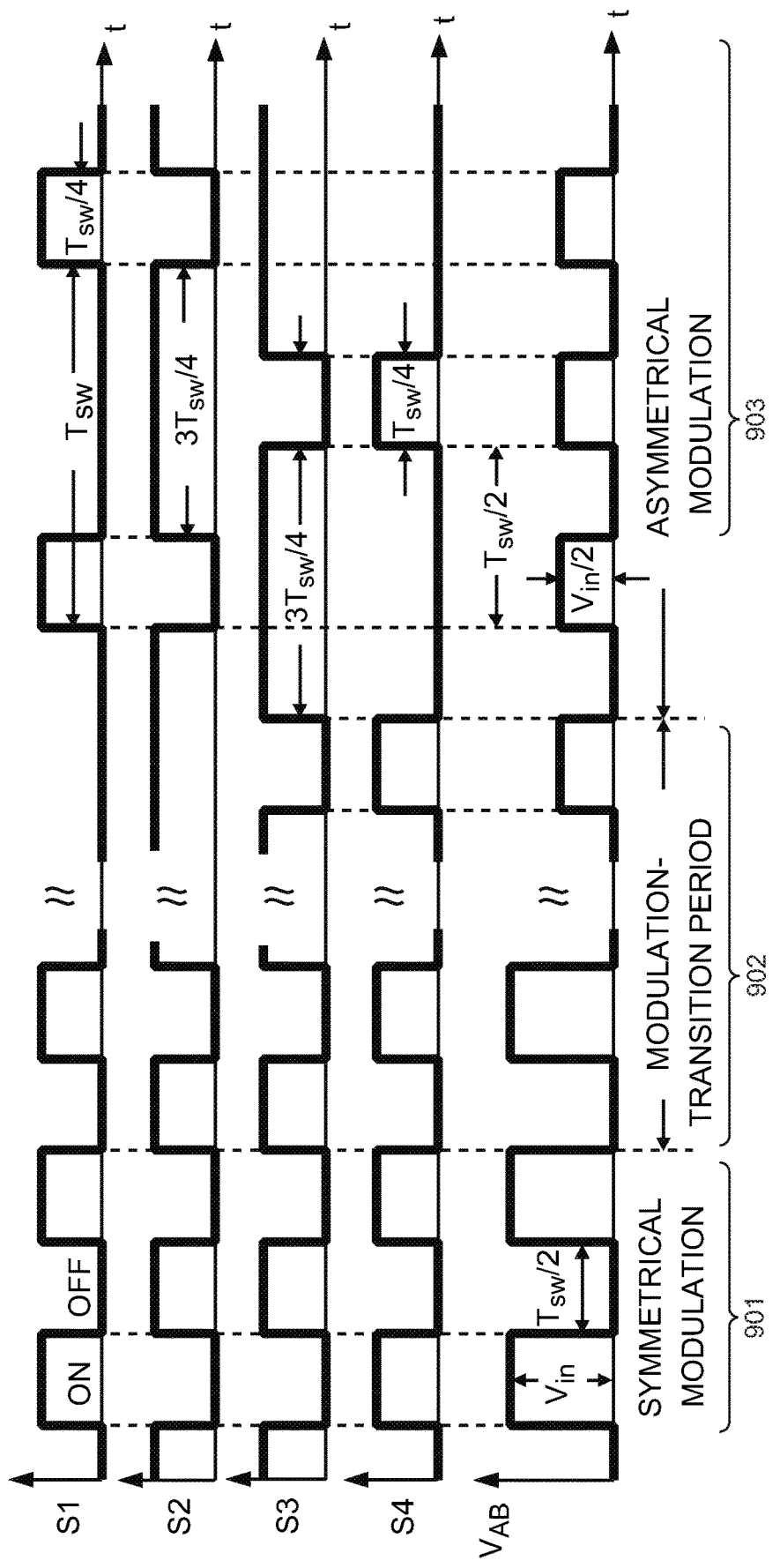
FIGS. 9A and 9B illustrate, respectively, switch control signals for switching devices $S_1$ to $S_4$ and phase-leg output voltage $V_B$, as the control scheme switches (i) from a symmetrical modulation scheme to an asymmetrical modulation scheme, and (ii) from an asymmetrical modulation scheme to a symmetrical modulation scheme, according to one embodiment of the present invention.
Figure 9B:
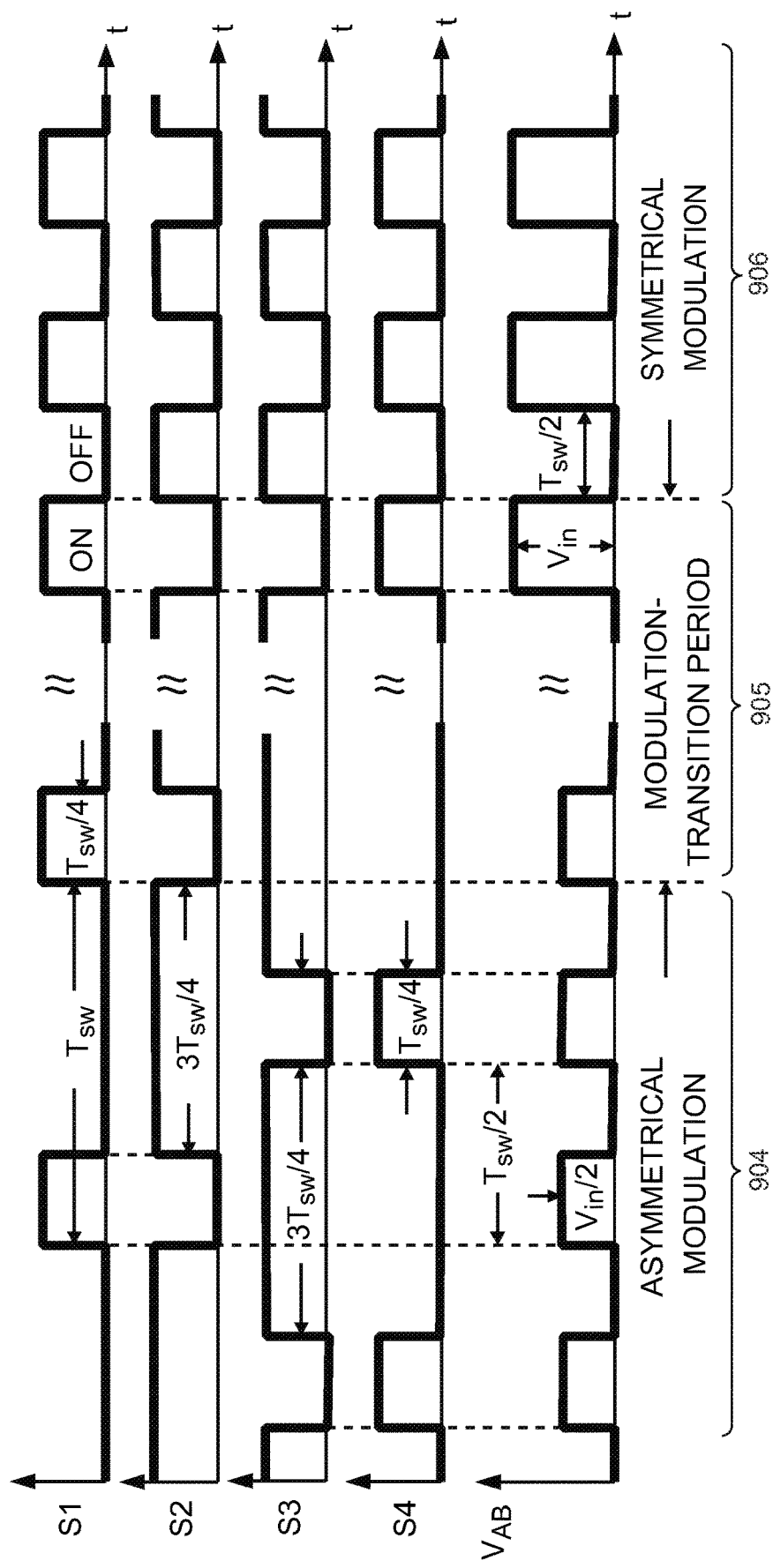

FIGS. 9A and 9B illustrate, respectively, switch control signals for the switching devices $S_1$ and $S_4$ and phase-leg output voltage $V_{AB}$, as the control scheme switches (i) from a symmetrical modulation scheme to an asymmetrical modulation scheme, and (ii) from an asymmetrical modulation scheme to a symmetrical modulation scheme, according to one embodiment of the present invention. FIG. 9A illustrates a transition from a symmetrical modulation scheme (interval 901) to an asymmetrical modulation scheme (interval 903) when the output voltage control target changes from a high voltage to a low voltage in the output voltage range. Transition period 902 between the modulation schemes can be implemented in different ways, such as frequency shift, phase shift, duty cycle shift, or any of their combinations. Likewise, FIG. 9B illustrates a transition from an asymmetrical modulation scheme (interval 904) to a symmetrical modulation scheme (interval 906) when the output voltage control target changes from a low voltage to a high voltage in the output voltage range. Transition period 905 between the modulation schemes can be implemented in the way as in the transition of FIG. 9A, i.e., using control parameters such as frequency shift, phase shift, duty cycle shift, or any of their combinations, but in reverse order. Of course, any other suitable transition control methods may also be used.

Three-Level Modulation

Figure 10A:
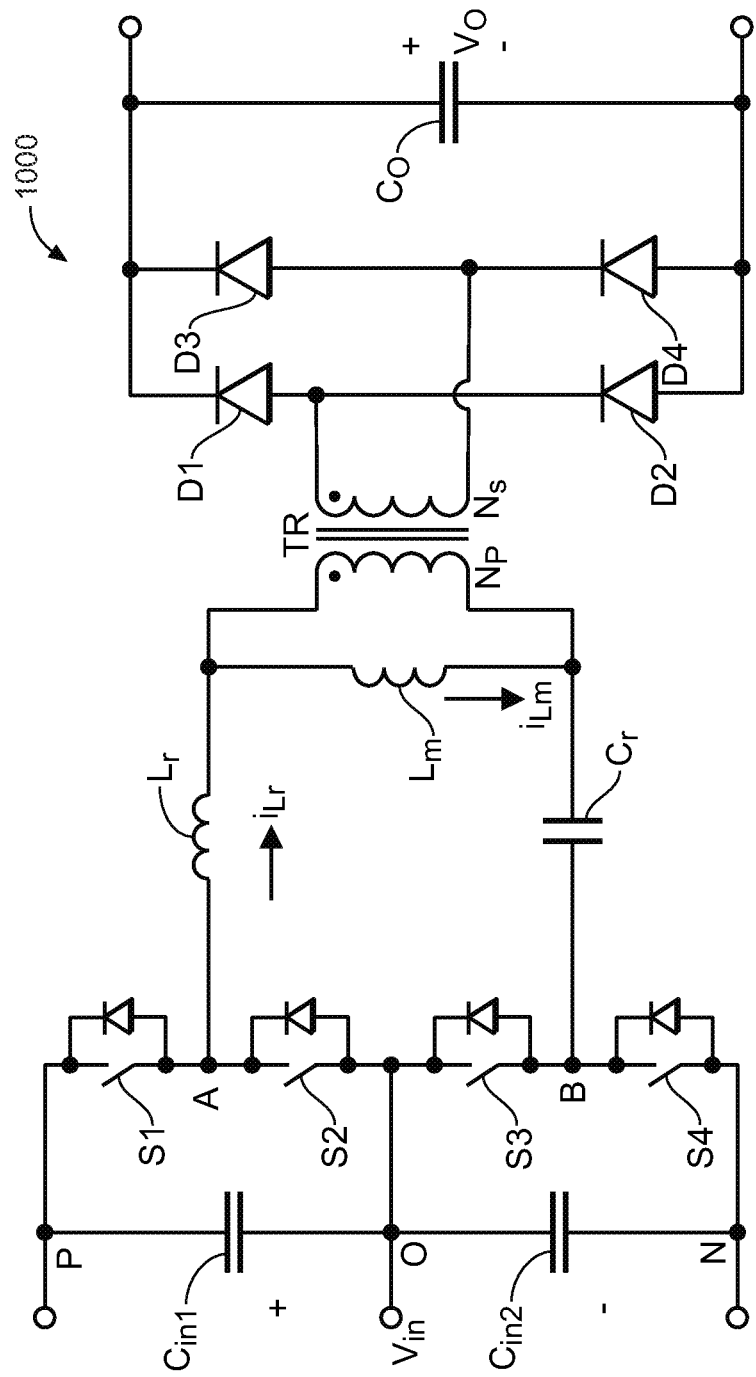
FIGS. 10A and 10B show, respectively, serial half-bridge LLC resonant converter 1000 and its timing diagrams of (i) the control signals for primary switching devices $S_1$ to $S_4$, under a three-level modulation scheme, and (ii) primary-side output voltage $V_B$.
Figure 10B:
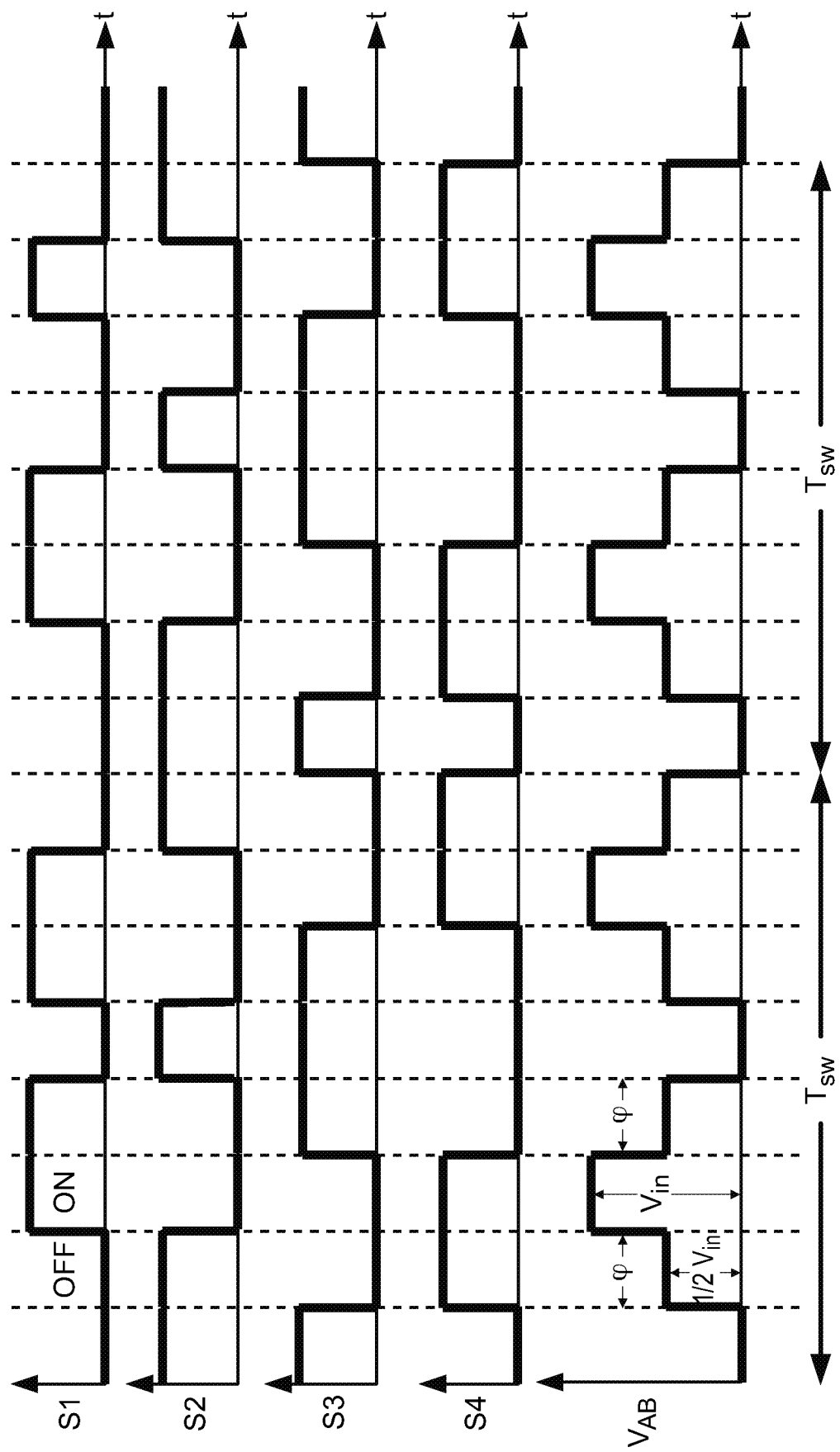

According to one embodiment of the present invention, FIG. 10B illustrates a three-level modulation scheme for the signals operating primary switching devices $S_1$, $S_2$, $S_3$ and $S_4$ of SHB LLC resonant converter 1000 of FIG. 10A. The signals that operate the switching devices $S_1$ and $S_2$ are complementary, and the signals for operating the switching devices $S_3$ and $S_4$ are also complementary. In practice, a small dead-time is inserted between each pair of complementary switch signals to avoid a phase-leg shoot-through. In this embodiment, based on the output voltage or the output current, the control circuit is configurable to generate the first, second, third, and fourth switch control signals $S_1$ to $S_4$ according to a first modulation scheme in which (i) the first and the second switch control signals $S_1$, $S_2$ are substantially complementary with each other and the third and the fourth switch control signals $S_3$, $S_4$ are substantially complementary with each other, (ii) the first, second, third, and fourth switch control signals $S_1$, $S_2$, $S_3$, $S_4$ are periodic with a common switching period $T_{sw}$, (iii) within the common switching period $T_{sw}$, (1) each switch control signal has two rising edges and two falling edges; and (2) the first rising edge of the first switch control signal $S_1$ lags the first rising edge of the fourth switch control signal $S_4$ by a first predetermined time, while the second rising edge of the first switch control signal $S_1$ leads the second rising edge for the fourth switch control signal $S_4$ by a second predetermined time, and (iv) the control circuit varies the switching period, the first predetermined time, and the second predetermined time.

FIG. 10B shows the timing diagrams of the signals to primary switching devices $S_1$ to $S_4$ and SHB phase-leg output voltage $V_{BA}$. In switching period $T_{sw}$, each of primary switching devices $S_1$, $S_2$, $S_3$ and $S_4$ is turned on twice and turned off twice. Each time it is turned on, primary switching device $S_1$ or $S_4$ has a fixed "on" duration that spans 25% of switching period $T_{sw}$, such that the accumulated "on" duration is 50% of switching period $T_{sw}$. As shown in FIG. 10B, during switching period $T_{sw}$, the first rising edge for primary switching device $S_1$ lags the first of rising edge for primary switching device $S_4$, while the second rising edge for primary switching device $S_1$ leads the second rising edge for primary switching device $S_4$. The lead and lag times are each φ, as shown in FIG. 10B. In addition, the first rising edge for primary switching device $S_1$ leads the second rising edge for primary switching device $S_4$ by ½ $T_{sw}$. Operating primary switching devices $S_1$, $S_2$, $S_3$, and $S_4$ in this manner, phase-leg output voltage $V_{AB}$ has three different voltage levels. In this embodiment, (i) when the first and fourth switching devices $S_1$, $S_4$ are both non-conducting, the voltage across the first and second electrical nodes goes to a first voltage level, (ii) when one of the first and fourth switching devices $S_1$, $S_4$ is conducting, the voltage across the first and second electrical nodes goes to a second voltage level, and (iii) when the first and fourth switching devices $S_1$, $S_4$ are both conducting, the voltage across the first electrical node goes to a third voltage level. The first voltage level may be ground, the second voltage level may be substantially one-half the input signal, and the second voltage level may be substantially the input signal. When primary switching devices $S_1$ and $S_4$ are both "on" or conducting, phase-leg output voltage $V_{AB}$ equals $V_{in}$. When primary switching devices $S_2$ and $S_4$ are both "on," or when primary switching devices $S_1$ and $S_3$ are both "on," phase-leg output voltage $V_{AB}$ equals $0.5V_{in}$. When primary switching devices $S_2$ and $S_3$ are both "on", phase-leg output voltage $V_{AB}$ equals zero volts.

Thus, the waveform of phase-leg output voltage $V_{AB}$ is periodical with a period that is half switching period $T_{sw}$. As duration φ corresponds to the duration when primary switching devices $S_2$ and $S_4$ are both "on," or when primary switching devices $S_1$ and $S_3$ are both "on," duration e determines the duration over which phase-leg output voltage $V_{AB}$ equals $½V_{in}$. Switching frequency $f_{sw}$ (hence, switching period $T_{sw}$) and duration φ are the control variables for setting different control targets.

Key Waveforms and Stages Analysis

In this detailed description, to simplify the analysis of the operations, ripple voltages of input capacitor $C_{in}$ and output capacitor $C_O$, as shown in FIG. 10A, are assumed negligible and thus may be represented by constant-voltage source $V_{in}$ and $V_O$. Also, the semiconductor circuit elements herein are each assumed to have zero resistance in its "on" or conducting state (i.e., they are considered short circuits). However, the output capacitances of the primary switching devices are not neglected.

Figure 11:
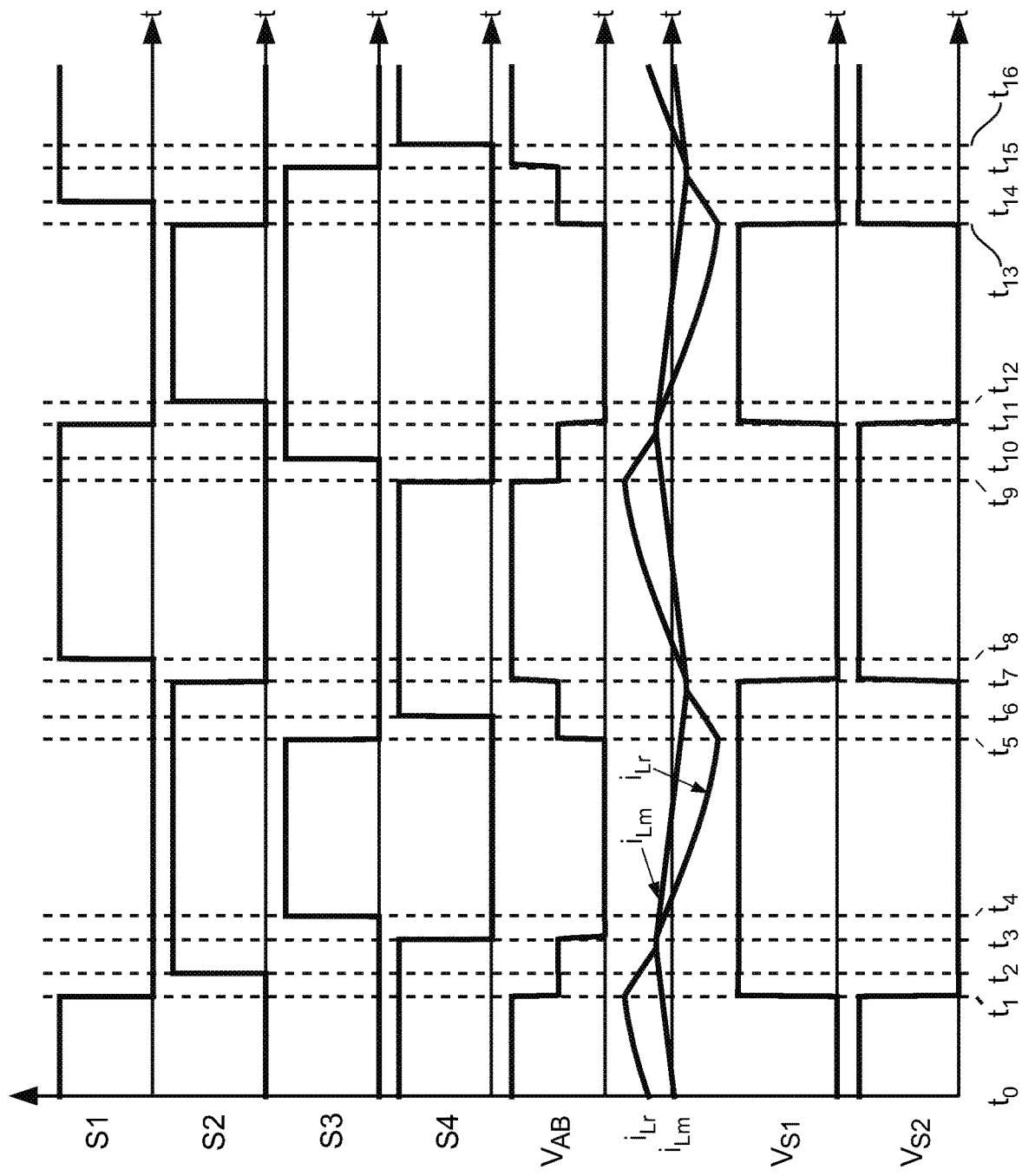
FIG. 11 shows key waveforms of SHB LLC resonant converter 1000 of FIG. 10A during switching cycle Tsw.

FIG. 11 shows key waveforms of SHB LLC resonant converter 1000 of FIG. 10A during switching cycle $T_{sw}$. FIG. 11 shows switch control voltages $S_1$, $S_2$, $S_3$ and $S_4$ (i.e., positive voltages indicate primary switching devices $S_1$ to $S_4$, respectively, to be in the "on" state), primary-side output voltage $V_{AB}$, current $i_{Lr}$ in resonant inductor $L_r$, current $i_{Lm}$ in magnetizing inductor $L_m$, and voltages $V_{S1}$ and $V_{S2}$ across primary switching devices $S_1$ and $S_2$. FIG. 11 indicates signal transitions at times $t_1$, $t_2$, $t_3$, $t_4$, $t_5$, $t_6$, $t_7$, $t_8$, $t_9$, $t_{10}$, $t_{11}$, $t_{12}$, $t_{13}$, $t_{14}$, $t_{15}$, and $t_{16}$.

Figure 12A:
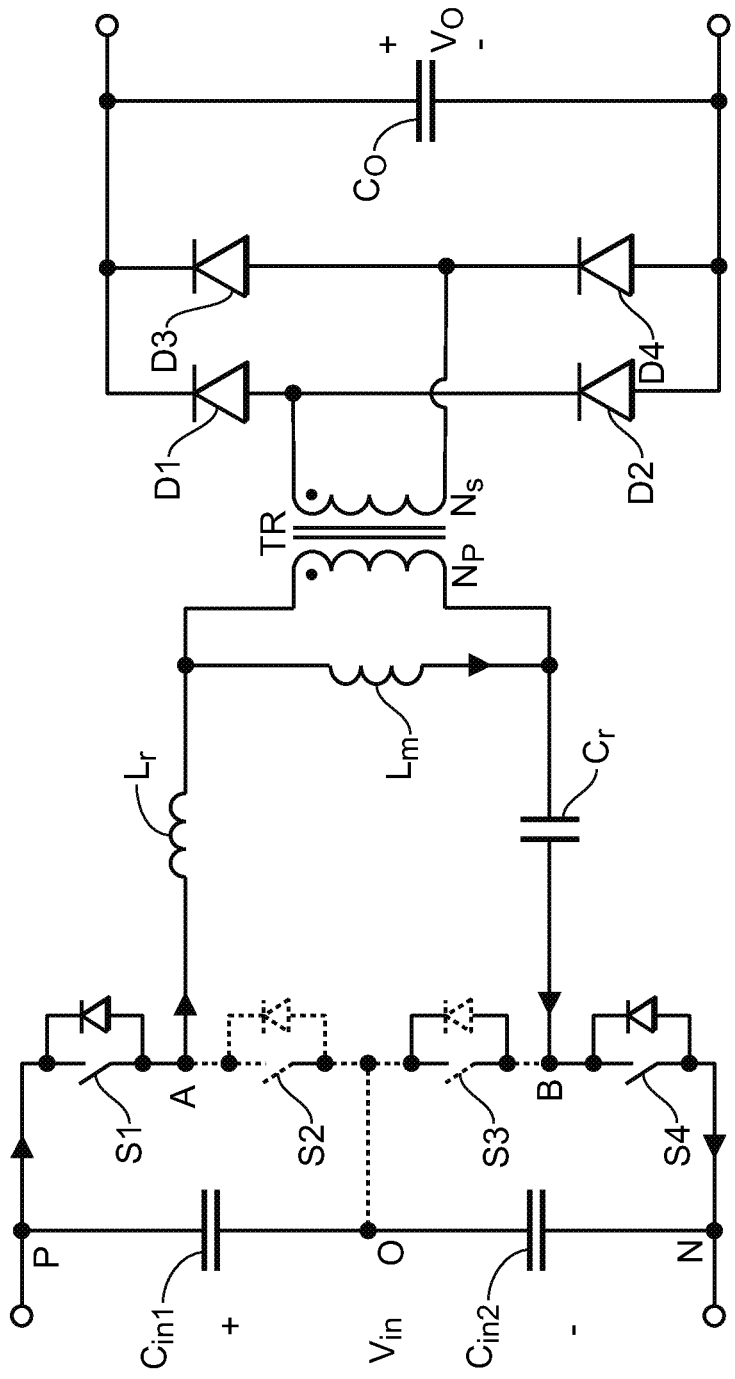
FIGS. 12A-12P show sixteen operation stages of SHB LLC resonant converter 1000 under the 3-level modulation scheme of the embodiment of the present invention, corresponding to time periods ($t_0$, $t_1$), ($t_1$, $t_2$), ($t_2$, $t_3$), ($t_3$, $t_4$), ($t_4$, $t_5$), ($t_5$, $t_6$), ($t_6$, $t_7$), ($t_7$, $t_8$), ($t_8$, $t_9$), ($t_9$, $t_{10}$), ($t_{10}$, $t_{11}$), ($t_{11}$, $t_{12}$), ($t_{12}$, $t_{13}$), ($t_{13}$, $t_{14}$), ($t_{14}$, $t_{15}$), and ($t_{15}$, $t_{16}$), respectively.
Figure 12B:
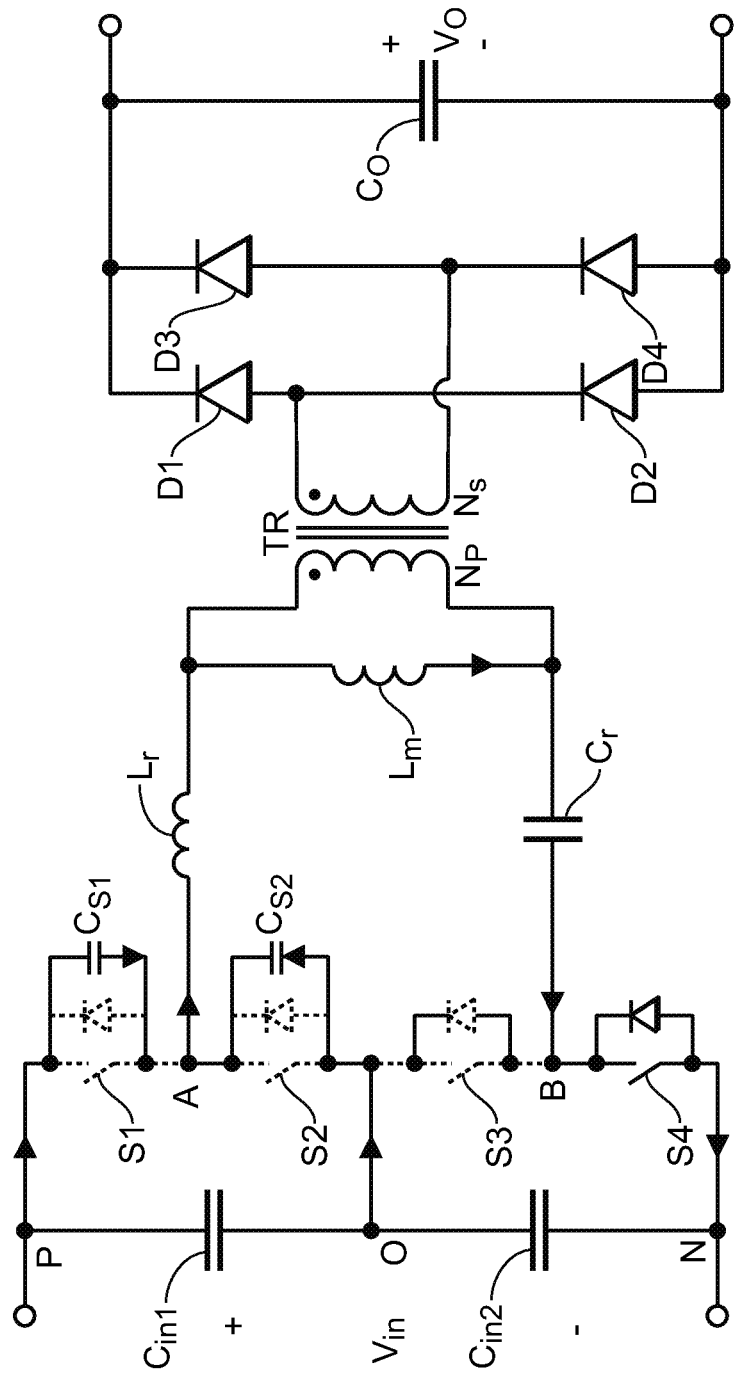
Figure 12C:
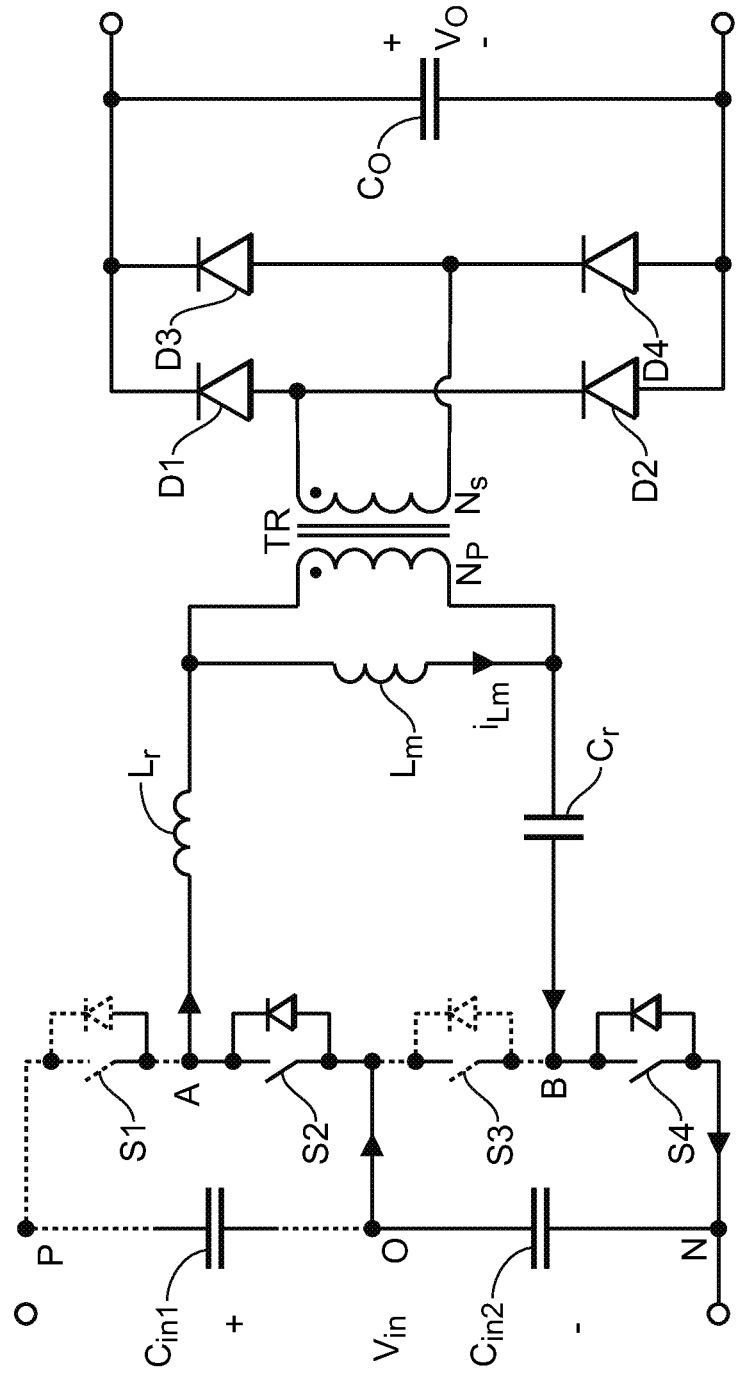
Figure 12D:
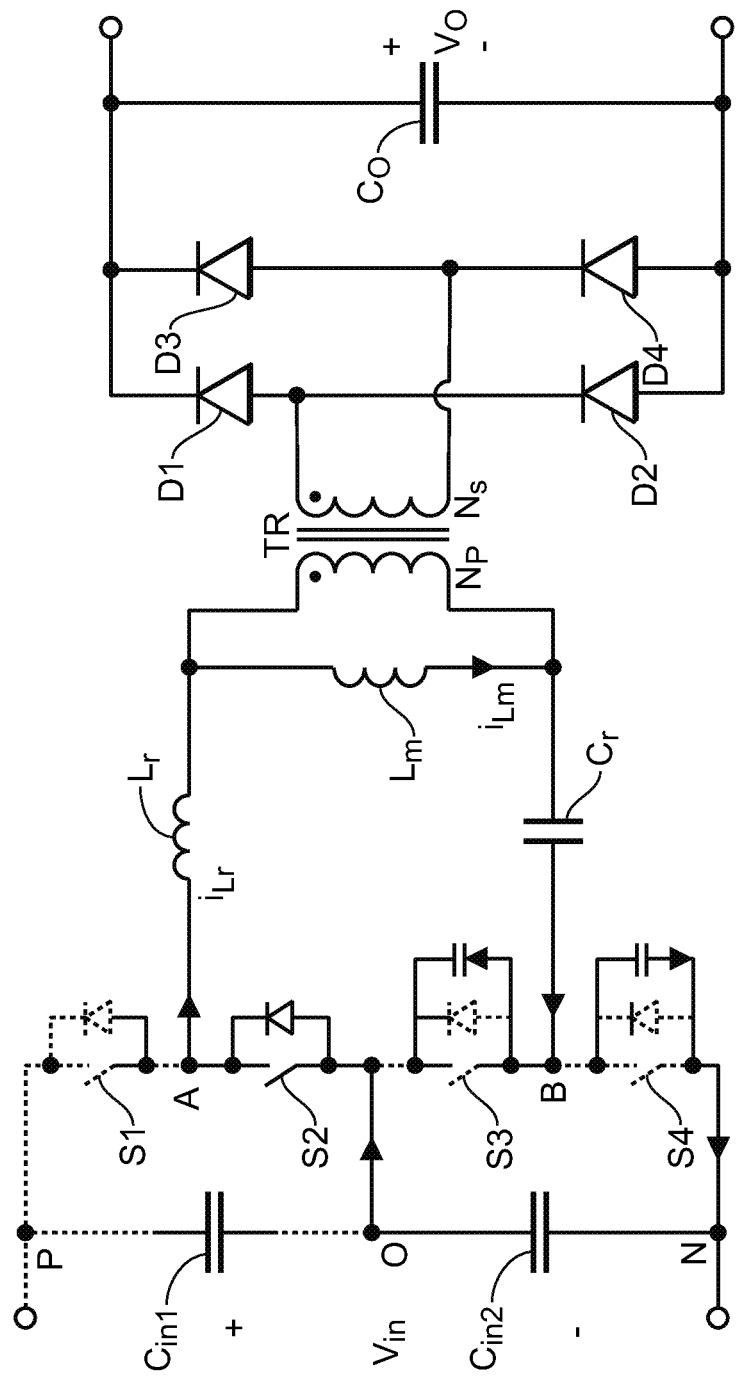
Figure 12E:
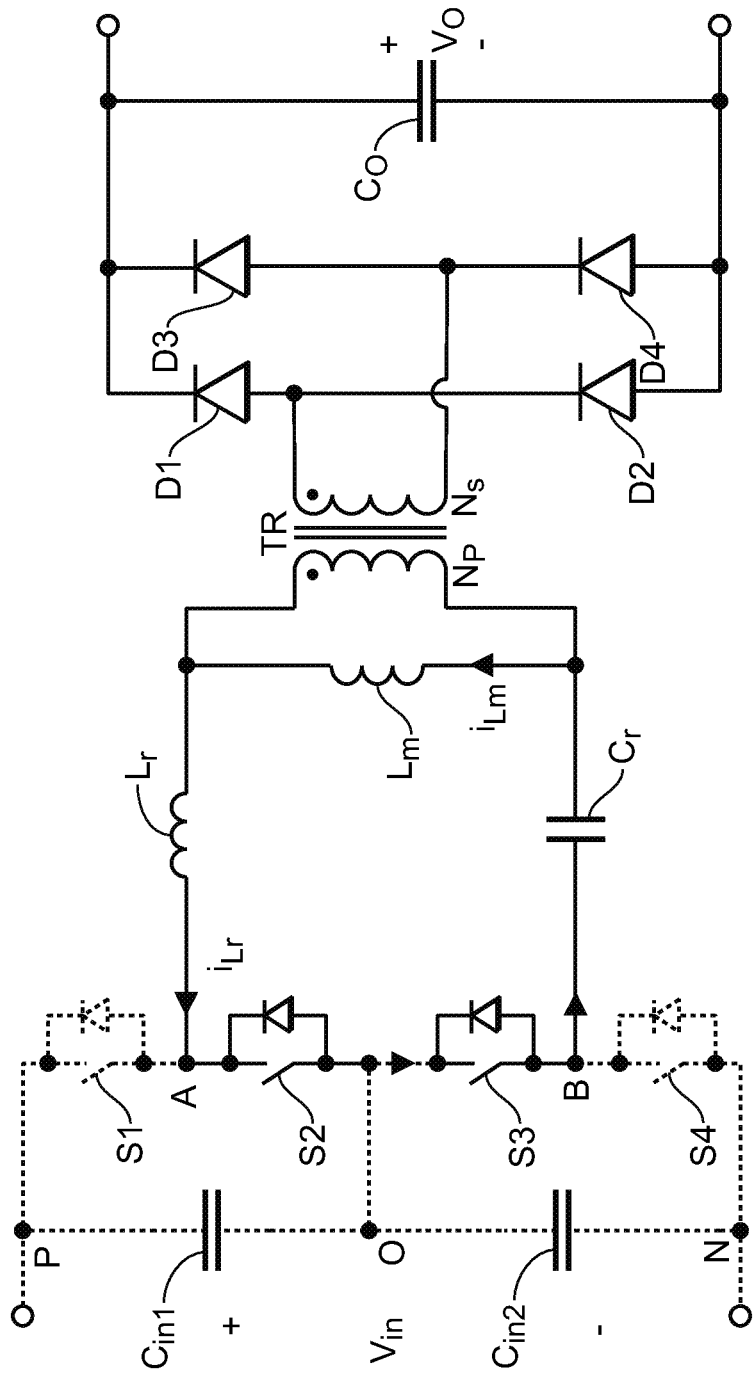
Figure 12F:
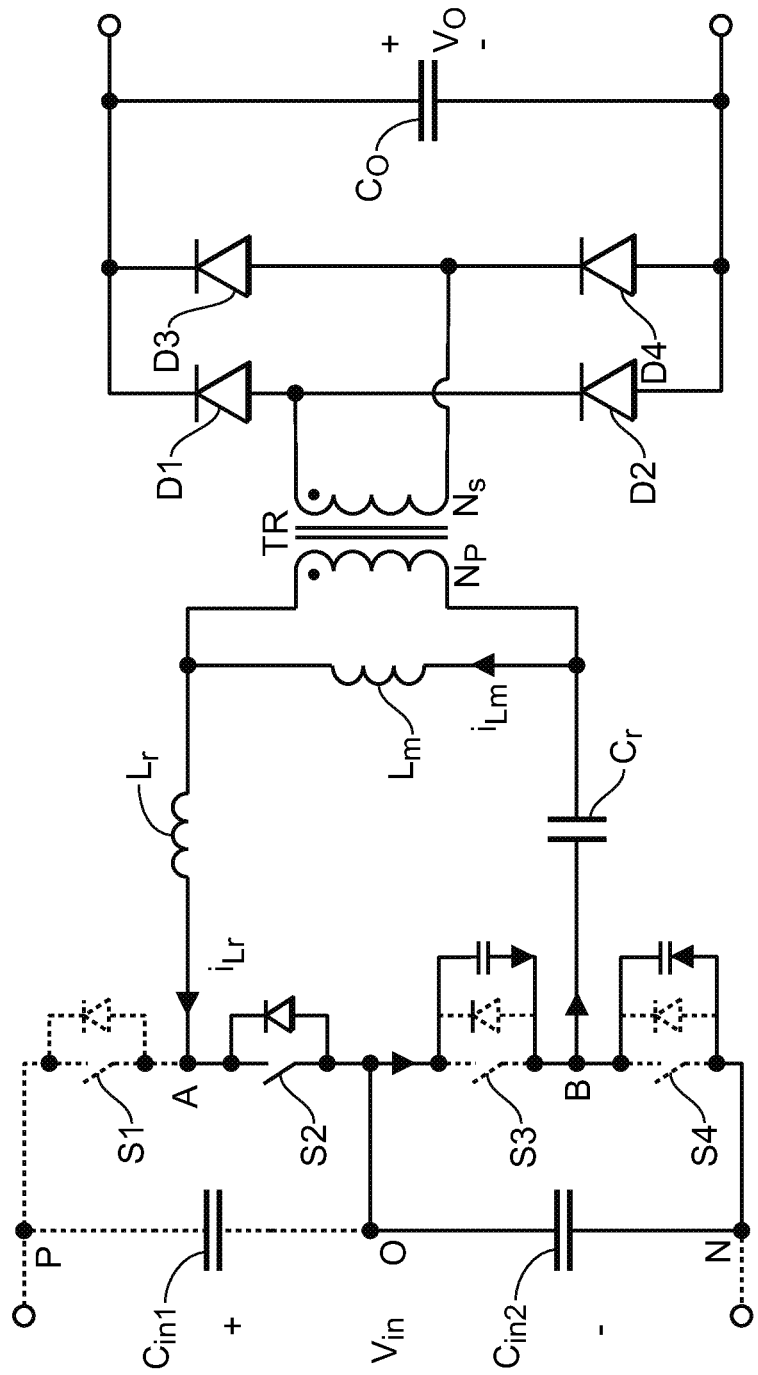
Figure 12G:
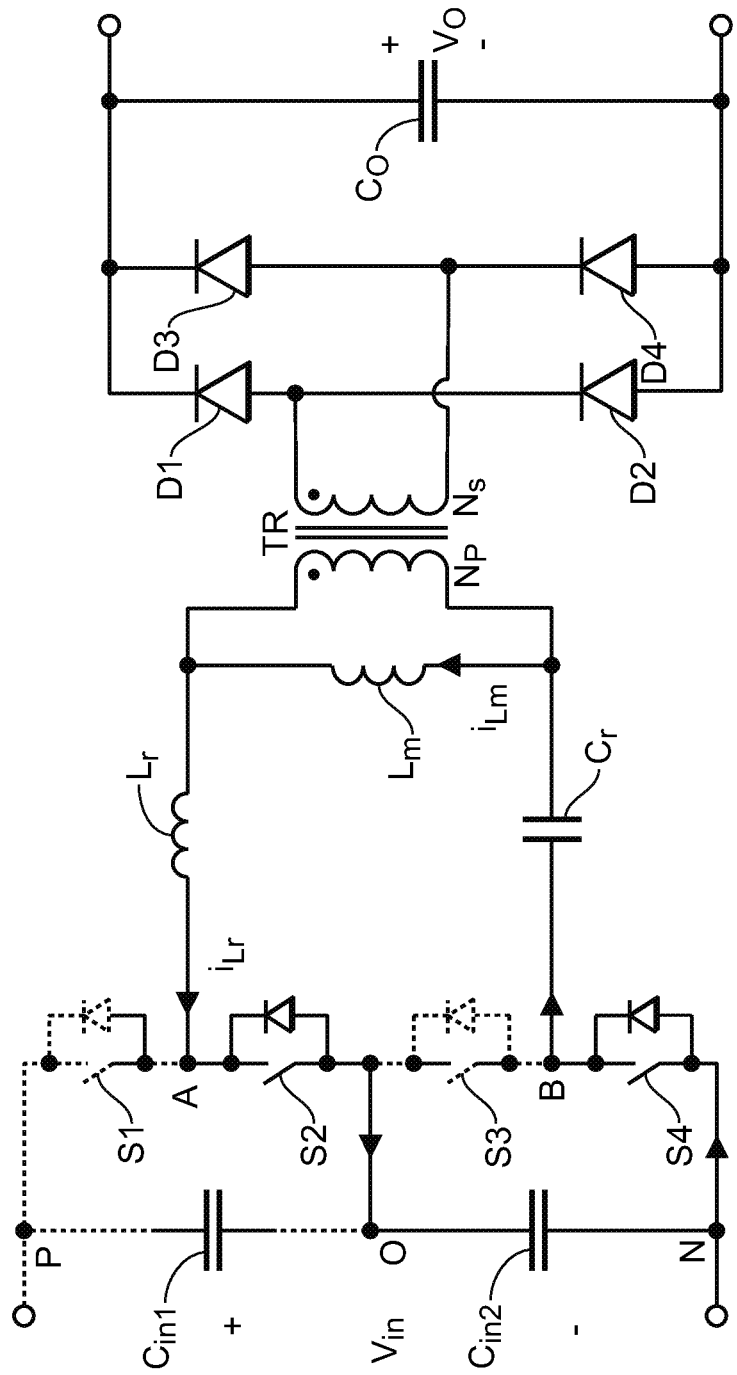
Figure 12H:
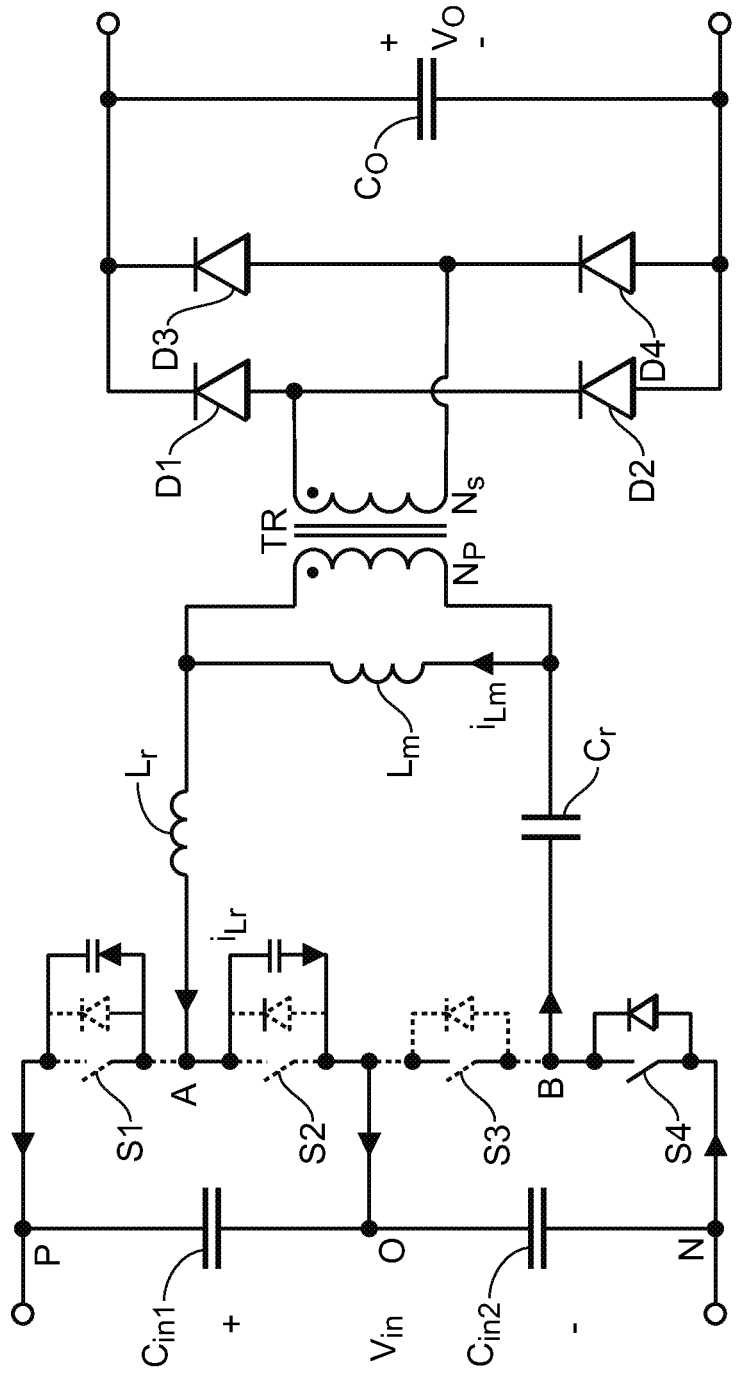
Figure 12I:
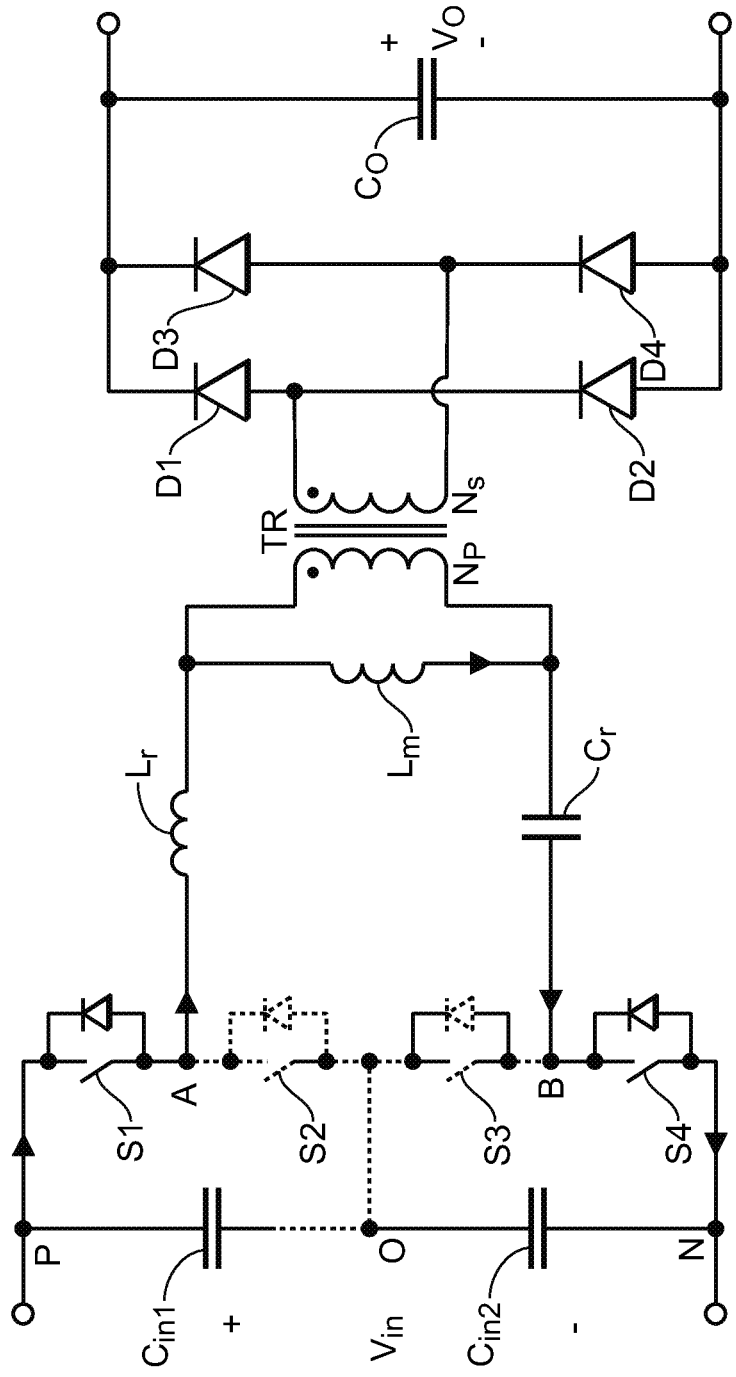
Figure 12J:
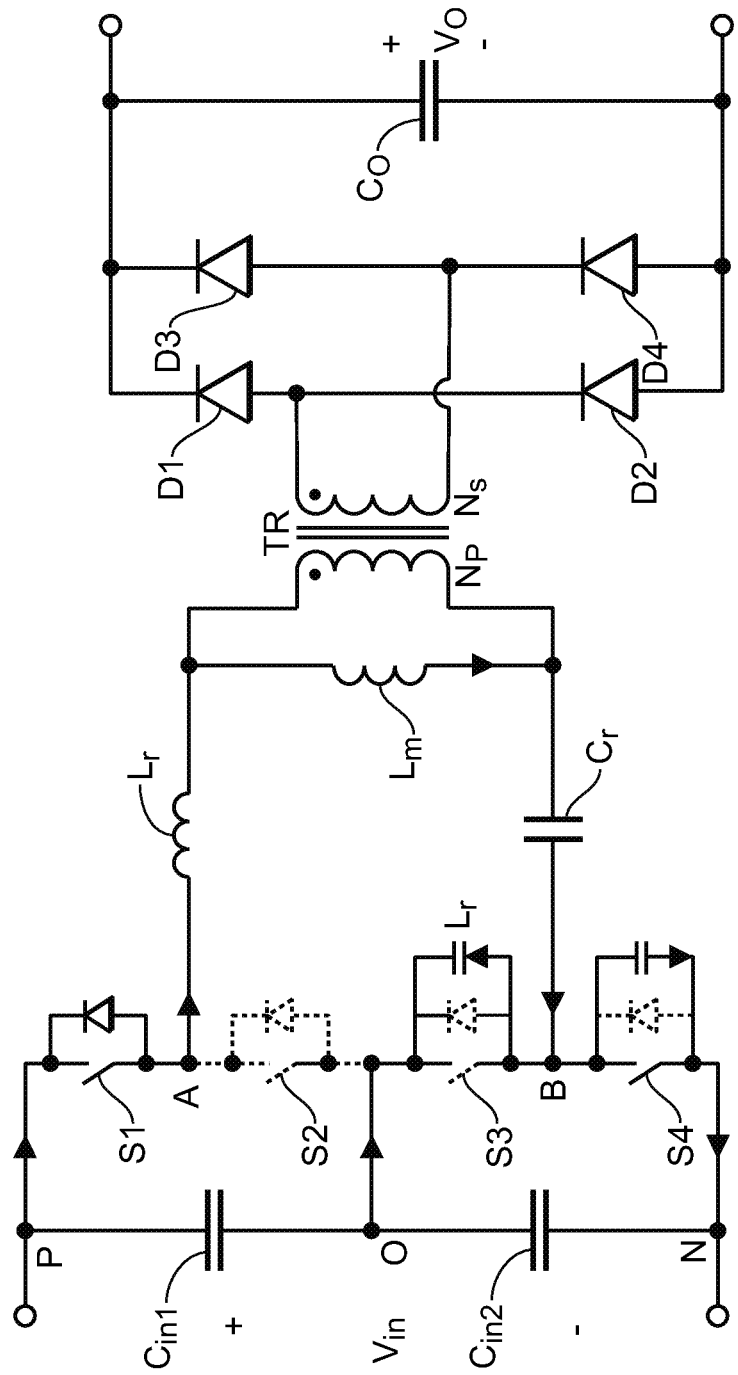
Figure 12K:
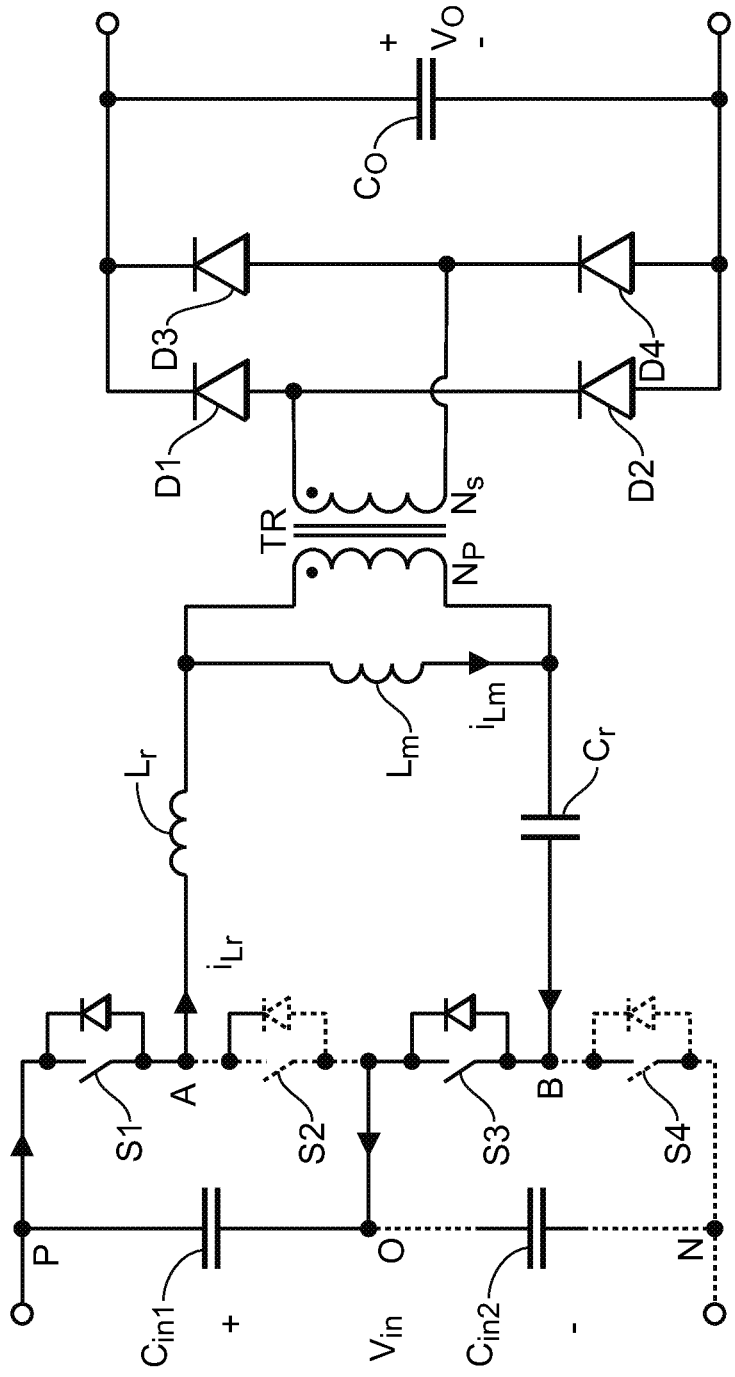
Figure 12L:
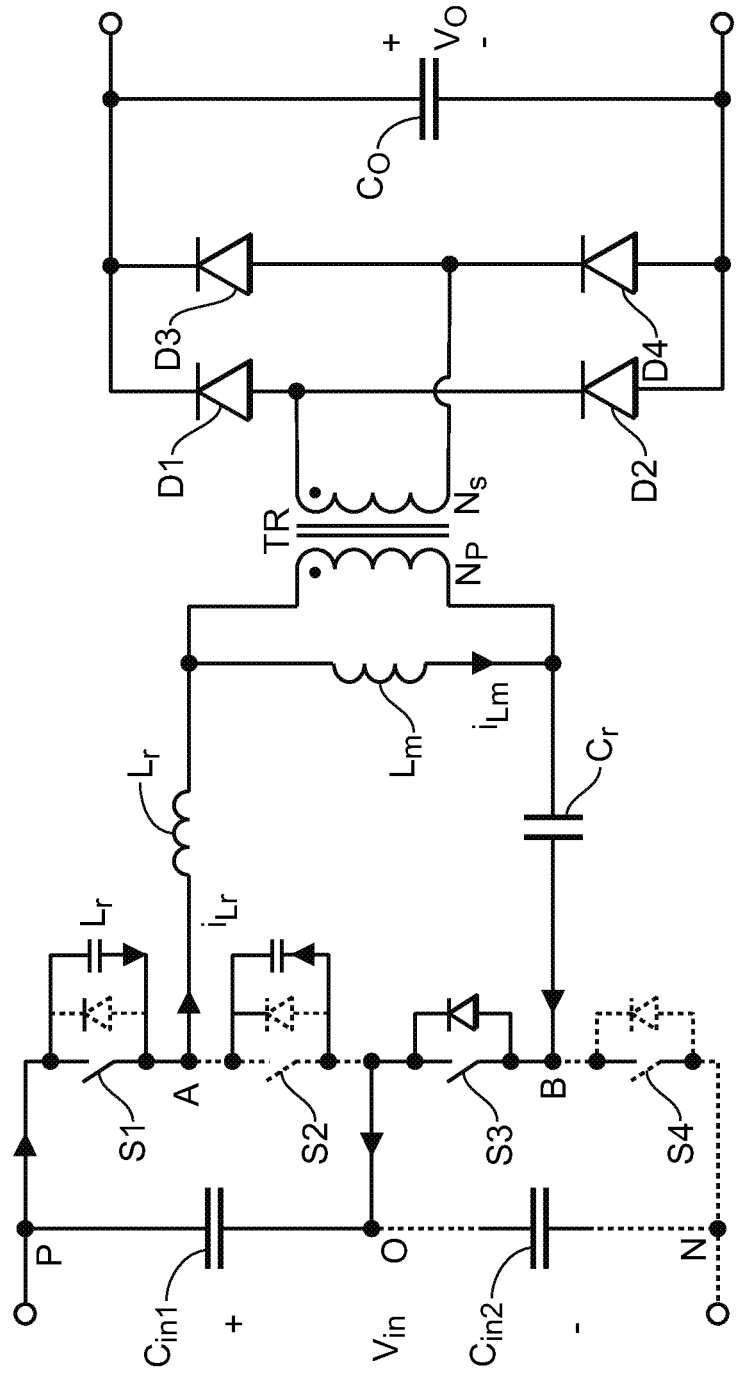
Figure 12M:
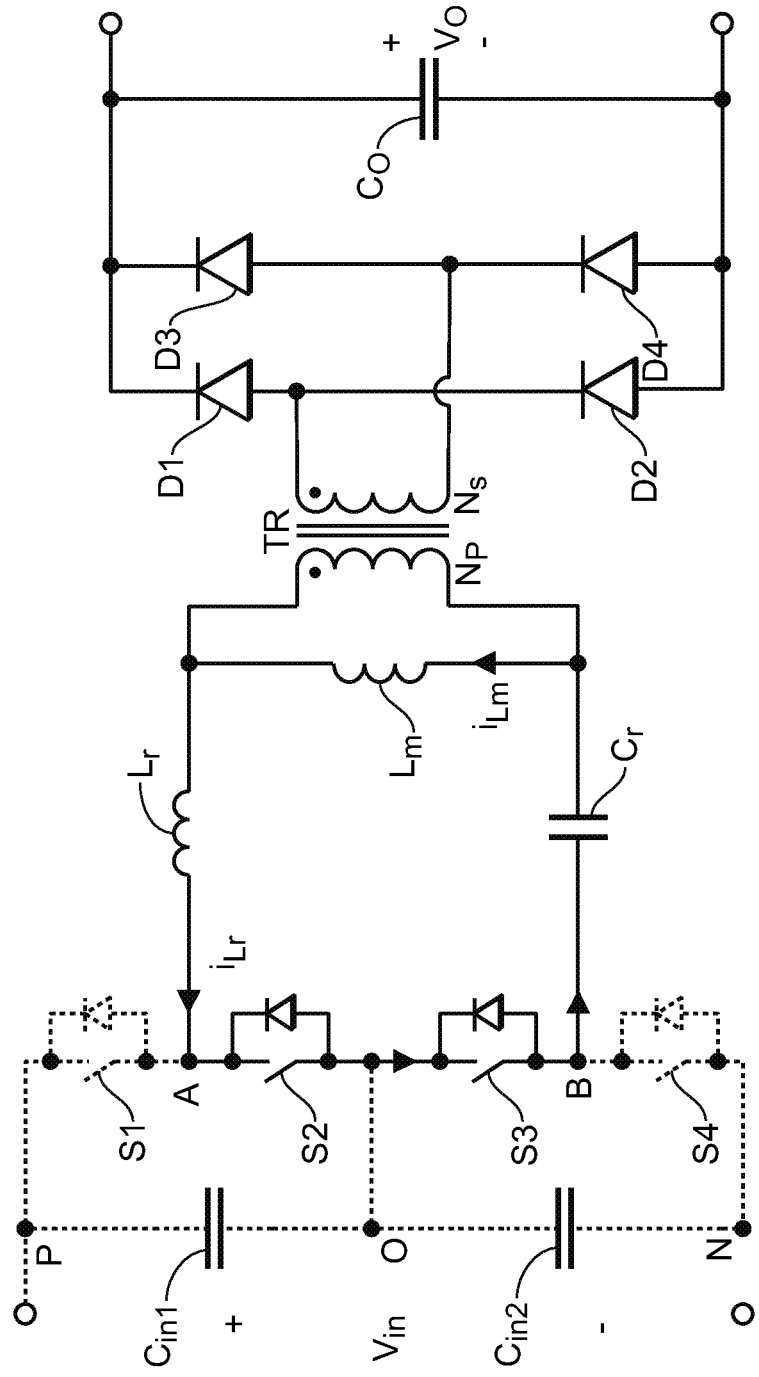
Figure 12N:
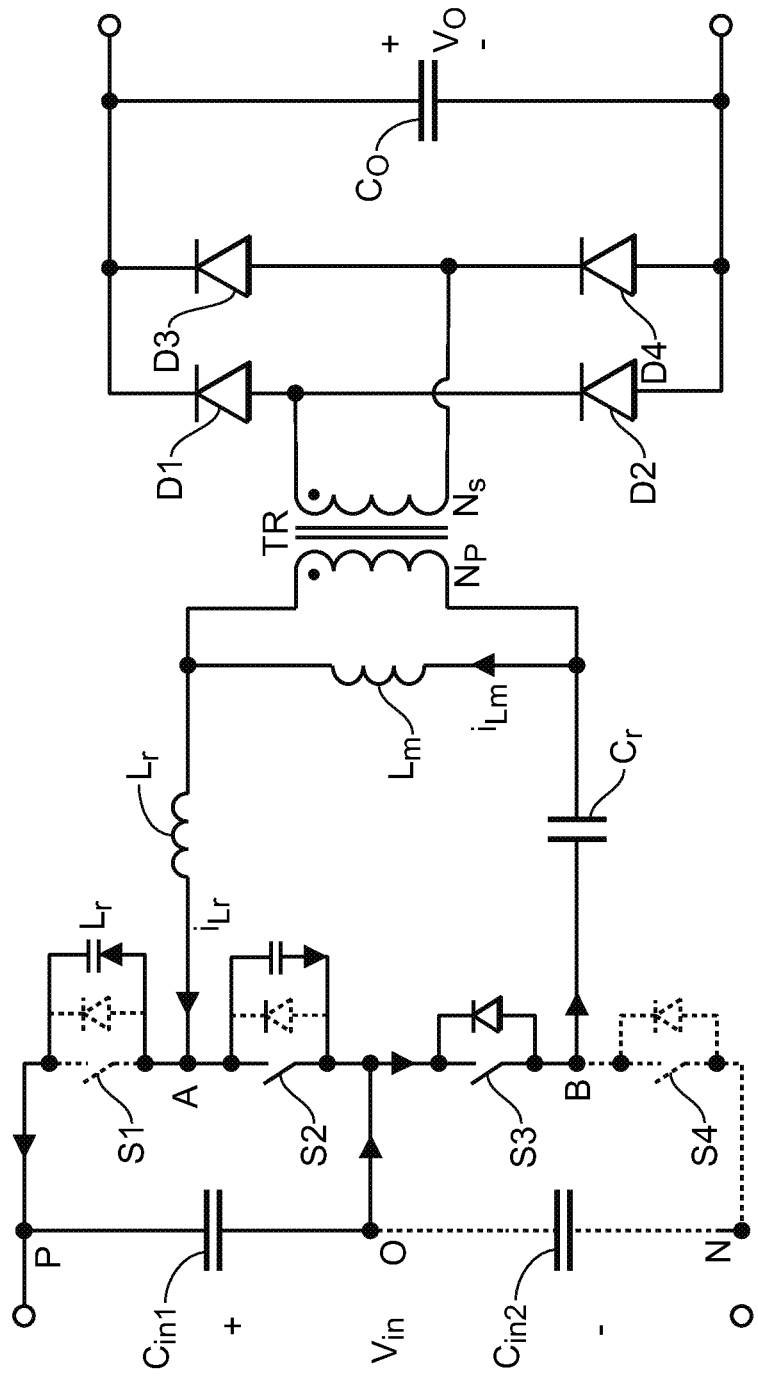
Figure 12O:
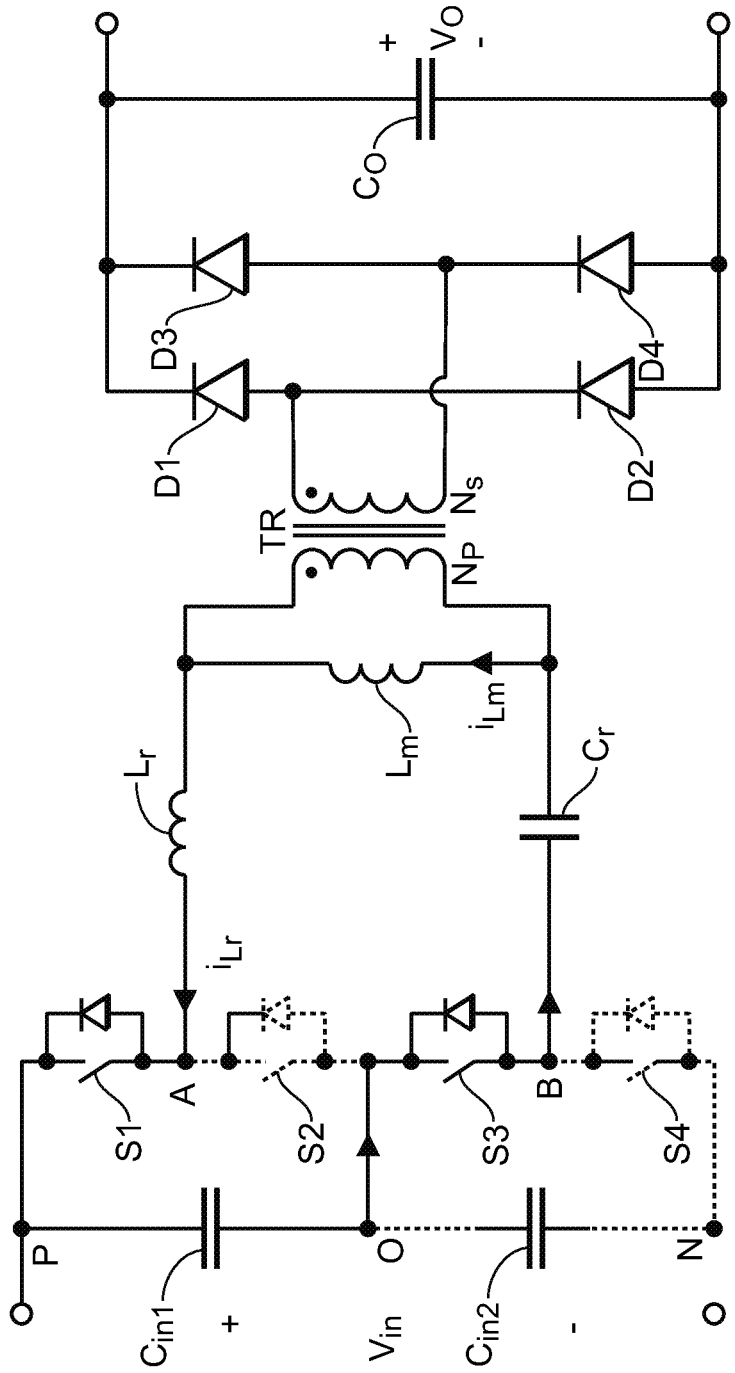
Figure 12P:
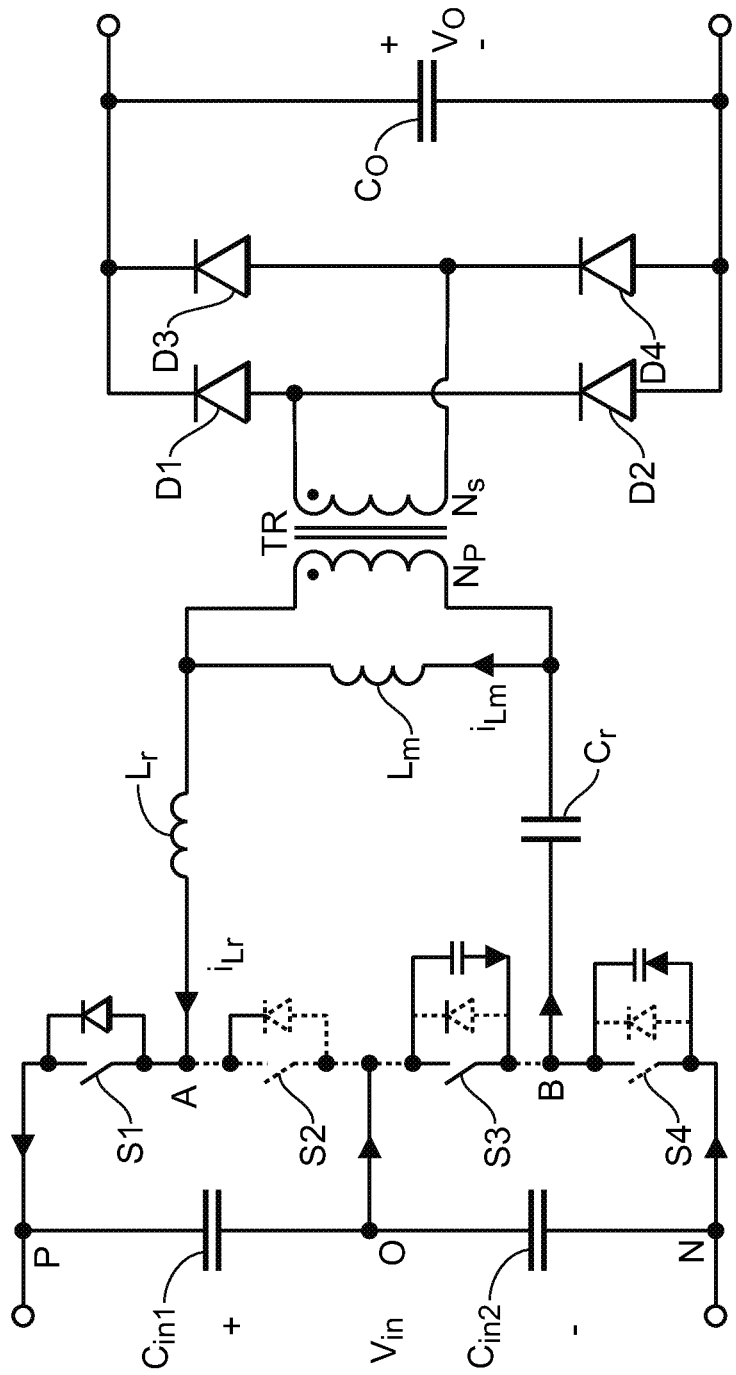

In conjunction with FIG. 11, FIGS. 12A-12P show sixteen operation stages of SHB LLC resonant converter 1000 under the 3-level modulation scheme of the embodiment of the present invention, corresponding to time periods ($t_0$, $t_1$), ($t_1$, $t_2$), ($t_2$, $t_3$), ($t_3$, $t_4$), ($t_4$, $t_5$), ($t_5$, $t_6$), ($t_6$, $t_7$), ($t_7$, $t_8$), ($t_8$, $t_9$), ($t_9$, $t_{10}$), ($t_{10}$, $t_{11}$), ($t_{11}$, $t_{12}$), ($t_{12}$, $t_{13}$), ($t_{13}$, $t_{14}$), ($t_{14}$, $t_{15}$) and ($t_{15}$, $t_{16}$), respectively. In FIGS. 12A-12P, an open or "off" switching device is indicated by dash-lines (e.g., in FIG. 12A, primary switching devices $S_2$ and $S_3$ are open). Also, parasitic capacitors of primary switching devices $S_1$, $S_2$, $S_3$ and $S_4$ are represented by capacitors $C_{S1}$, $C_{S2}$, $C_{S3}$ and $C_{S4}$, respectively.

During time period ($t_0$, $t_1$), as shown in FIG. 12A, resonant current $i_{Lr}$ increases and flows in resonant inductor $L_r$, transformer TR, magnetizing inductor $L_m$, resonant capacitor $C_r$, and primary switching devices $S_1$ and $S_4$. Phase-leg output voltage $V_{AB}$ equals input voltage $V_{in}$.

During time period ($t_1$, $t_2$), as shown in FIG. 12B, capacitor $C_{S1}$ charges to ½ $V_{in}$ and capacitor $C_{S2}$ completely discharges (i.e., to zero volts across), after primary switching device $S_1$ becomes open. Current $i_{Lr}$ begins to decrease. Phase-leg output voltage $V_{AB}$ falls to $½V_{in}$, as a result of the charging and discharging in capacitors $C_{S1}$ and $C_{S2}$.

During time period ($t_2$, $t_3$), as shown in FIG. 12C, primary switching device $S_2$ turns on at zero volts (i.e., at "ZVS" condition, with no switching loss). Phase-leg output voltage $V_{AB}$ remains at $½V_{in}$ and current $i_{Lr}$ continues to decrease.

During time period ($t_3$, $t_4$), as shown in FIG. 12D, capacitor $C_{S4}$ charges to $½V_{in}$ and capacitor $C_{S3}$ discharges completely, after primary switching device $S_4$ is turned off. Phase-leg output voltage $V_{AB}$ goes to zero volts, as a result of the charging and discharging in capacitors $C_{S4}$ and $C_{S3}$. Current $i_{Lr}$ continues to decrease.

During time period ($t_4$, $t_5$), as shown in FIG. 12E, primary switching device $S_3$ turns on at ZVS condition. Phase-leg output voltage $V_{AB}$ remains at zero volts and current $i_{Lr}$ continues to decrease.

During time period ($t_5$, $t_6$), as shown in FIG. 12F, capacitor $C_{S3}$ charges to ½ $V_{in}$ and capacitor $C_{S4}$ discharges completely, after primary switching device $S_3$ is turned off. Phase-leg output voltage $V_{AB}$ rises to ½ $V_{in}$ and current $i_{Lr}$ begins to increase, as a result of the charging and discharging in capacitors $C_{S3}$ and $C_{S4}$.

During time period ($t_6$, $t_7$), as shown in FIG. 12G, primary switching device $S_4$ turns on at ZVS condition. Phase-leg output voltage $V_{AB}$ remains at $½V_{in}$ and current $i_{Lr}$ continues to increase.

During time period ($t_7$, $t_8$), as shown in FIG. 12H, capacitor $C_{S2}$ charges to ½ $V_{in}$ and capacitor Cs, discharges completely, after primary switching device $S_2$ is turned off. Phase-leg output voltage $V_{AB}$ becomes $V_{in}$, as a result of the charging and discharging in capacitors $C_{S2}$ and $C_{S1}$. Current $i_{Lr}$ continues to increase.

During time period ($t_8$, $t_9$), as shown in FIG. 12I, primary switching device $S_1$ turns on at ZVS condition. Phase-leg output voltage $V_{AB}$ remains at $½V_{in}$ and current $i_{Lr}$ continues to increase.

During time period ($t_9$, $t_{10}$), as shown in FIG. 12J, capacitor $C_{S4}$ charges to ½ $V_{in}$ and capacitor $C_{S3}$ completely discharges, after primary switching device $S_4$ becomes open. Current $i_{Lr}$ begins to decrease. Phase-leg output voltage $V_{AB}$ falls to ½ $V_{in}$, as a result of the charging and discharging in capacitors $C_{S4}$ and $C_{S3}$.

During time period ($t_{10}$, $t_{11}$), as shown in FIG. 12K, primary switching device $S_3$ turns on at ZVS condition. Phase-leg output voltage $V_{AB}$ remains at ½ $V_{in}$ and current $i_{Lr}$ continues to decrease.

During time period ($t_{11}$, $t_{12}$), as shown in FIG. 12L, capacitor $C_{S1}$ charges to ½ $V_{in}$ and capacitor $C_{S2}$ discharges completely, after primary switching device $S_1$ is turned off.

Phase-leg output voltage $V_{AB}$ goes to zero volts, as a result of the charging and discharging in capacitors Cs, and $C_{S2}$. Current $i_{Lr}$ continues to decrease.

During time period ($t_{12}$, $t_{13}$), as shown in FIG. 12M, primary switching device $S_2$ turns on at ZVS condition. Phase-leg output voltage $V_{AB}$ remains at zero volts and current $i_{Lr}$ continues to decrease.

During time period ($t_{13}$, $t_{14}$), as shown in FIG. 12N, capacitor $C_{S2}$ charges to ½ $V_{in}$ and capacitor Cs, discharges completely, after primary switching device $S_2$ is turned off. Phase-leg output voltage $V_{AB}$ rises to A $V_{in}$ and current $i_{Lr}$ begins to increase, as a result of the charging and discharging in capacitors $C_{S2}$ and $C_{S1}$.

During time period ($t_{14}$, $t_{15}$), as shown in FIG. 12O, primary switching device $S_1$ turns on at ZVS condition. Phase-leg output voltage $V_{AB}$ remains at ½$V_{in}$ and current $i_{Lr}$ continues to increase.

During time period ($t_{15}$, $t_{16}$), as shown in FIG. 12P, capacitor $C_{S3}$ charges to ½ $V_{in}$ and capacitor $C_{S4}$ discharges completely, after primary switching device $S_3$ is turned off. Phase-leg output voltage $V_{AB}$ becomes $V_{in}$, as a result of the charging and discharging in capacitors $C_{S3}$ and $C_{S4}$. Current $i_{Lr}$ continues to increase.

As all the primary switching devices turn on at ZVS conditions, the 3-level modulation scheme of the embodiment of the present invention significantly reduce total switching loss.

Advantages of the Three-Level Modulation Scheme of the Present Invention: A. Reducing Output Voltage The three-level modulation scheme of the embodiment of the present invention generates, across the series-connected $L_r$-$C_r$-$L_m$ resonant circuit, controllable phase-leg output voltage $V_{AB}$, which includes DC and AC components. In this embodiment, during LLC resonant converter operations, resonant capacitor $C_r$ blocks the DC component, so that only the AC component appears across the primary-side windings of transformer TR. When device switching frequency $f_{sw}$ equals resonant frequency $$f_r = \frac{\sqrt{L_r C_r}}{2\pi}$$

and when duration φ=0, output voltage $V_O$ equals the average of the product of the rectified AC component of phase-leg output voltage $V_{AB}$ and transformer TR's voltage gain. As transformer TR's voltage gain is the turns ratio $$\frac{N_S}{N_P},$$

where $N_S$ and $N_P$ are the numbers of turns in the secondary-side winding and the primary-side winding, respectively, output voltage $V_O$ is given by:

$$V_0 = \frac{N_P \overline{V_{AB\_ac}}}{N_S},$$

where $V_{AB,ac}$ is the average of the rectified AC component of phase-leg output voltage $V_{AB}$. For a desired value of duration φ, the average voltage of the rectified AC component reduces, if switching frequency $f_r$ is fixed. Accordingly, output voltage $V_O$ also decreases. Thus, the three-level modulation scheme of the embodiment of the present invention can be used to regulate output voltage $V_O$ without affecting switching frequency $f_r$.

B. Balancing the Current Stress in Each Primary Switching Device

Figure 13:
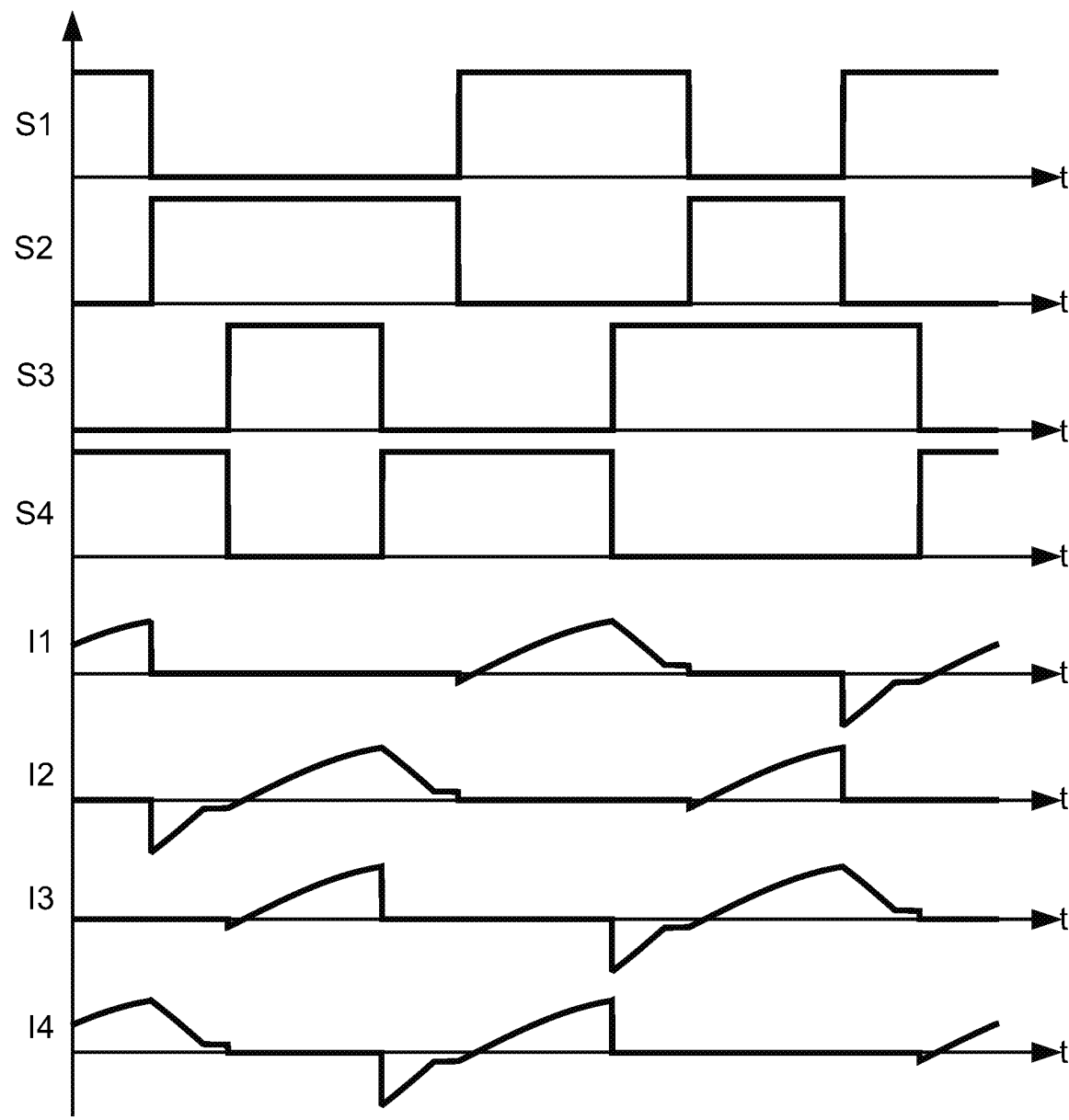
FIG. 13 shows control switch voltages $S_1$ to $S_4$ in primary switching devices $S_1$ to $S_4$, and the contemporaneous currents $I_1$ to $I_4$ flowing through them during switching period $T_{SW}$, under the three-level modulation scheme of the embodiment of the present invention, without accounting for the effects of any dead-time.

The "on"-resistance of a power device gives rise to a conduction loss. In SHB LLC resonant converter 1000 of FIG. 10A, primary switching devices $S_1$ to $S_4$ incur conduction loss when they are conducting. FIG. 13 shows control switch voltages $S_1$ to $S_4$ in primary switching devices $S_1$ to $S_4$, and the contemporaneous currents $I_1$ to $I_4$ flowing through them during switching period $T_{sw}$, under the three-level modulation scheme of the embodiment of the present invention, without accounting for the effects of any deadtime. Currents $I_1$ to $I_4$ have the same root-mean-square (RMS) value, thereby balancing the thermal stress equally among the primary switching devices. Consequently, longer life in these devices may be expected, increasing the reliability of SHB LLC resonant converter 1000.

DC-Link Capacitor Voltage Balancing

Ideally, when the top and bottom capacitors (e.g., capacitors $C_{in1}$ and $C_{in2}$) deliver the same power to the resonant tank under the three-level modulation scheme of the embodiment of the present invention, their DC-link capacitor voltage is automatically balanced without any additional control. However, both the parameter mismatch of the equivalent series resistances (ESRs) and the capacitances of the DC-link capacitors and the timing mismatch of the switch control or gate signals are inevitable in any practical SHB LLC resonant converter. These mismatches result in DC-link capacitor voltage imbalances.

The embodiment of the present invention provides a method to balance the DC-link capacitor voltages and to keep the SHB LLC resonant converter operating in a safe range. When capacitor $C_{in1}$ has a greater voltage than capacitor $C_{in2}$, all transitions in the switch control signals to primary switching devices $S_1$ and $S_2$ are delayed by a short time period and all transitions in the switch control signals to primary switching devices $S_3$ and $S_4$ are brought forward by the same amount. Similarly, when capacitor $C_{in2}$ has a greater voltage than capacitor $C_{in1}$, all transitions in the switch control signals to primary switching devices $S_1$ and $S_2$ are brought forward by a short time period and all transitions in the switch control signals to primary switching devices $S_3$ and $S_4$ are delayed by the same amount. The short time period adjustment preferably should not exceed a predetermined limit, for example 5% of the switching period $T_{sw}$, to avoid any adverse effect on the normal operations of the SHB LLC resonant converter.

Achieving a Wide Output Voltage Range Operation by Combining Pulse Frequency Modulation (PFM) with the Three-Level Modulation Scheme As mentioned above, maximum efficiency is achieved when the SHB LLC resonant converter is operated at an operating point at or very close to resonant frequency $f_r$. To achieve a wide output voltage range, conventional control modulates switching frequency $f_{sw}$ to adjust the DC voltage gain. However, switching frequency control moves the operating point away from maximum circuit efficiency. Further, for a very wide output voltage range, even such switching frequency control is unable to achieve the required DC voltage gain due to the fixed circuit parameters.

Figure 14:
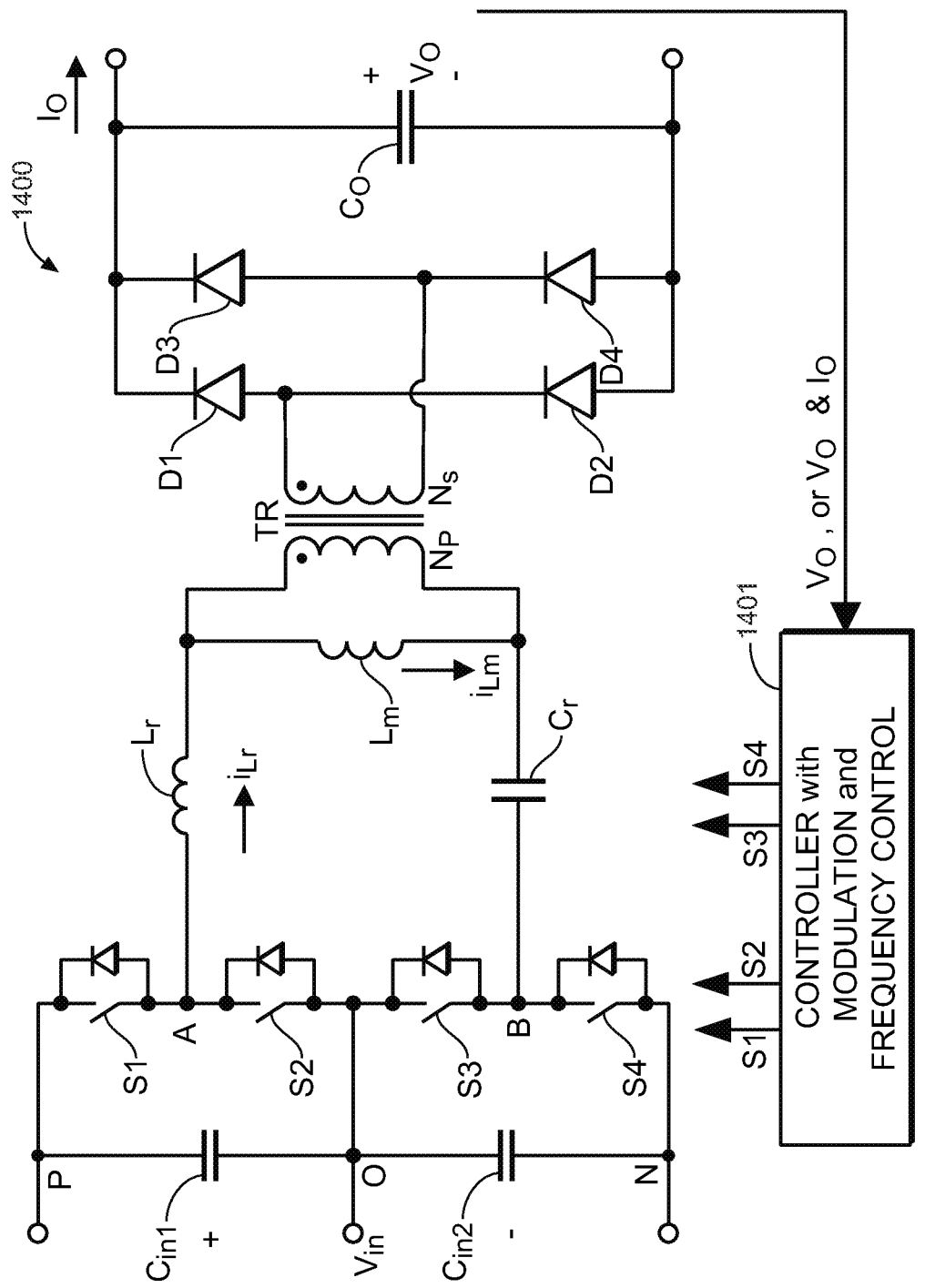
FIG. 14 is a schematic diagram showing SHB LLC resonant converter 1400, which includes control circuit 1401 that generates switch control signals to primary switching devices $S_1$ to $S_4$ based on output voltage $V_O$ (and, optionally, output current $I_O$), according to one embodiment of the present invention.

The inventors of the present invention recognize that an SHB LLC resonant converter can provide a wide output voltage range, while efficiently achieving desirable different DC voltage gains at or near the resonant frequency (i.e., a narrower input switching frequency range), using a combination of different modulation schemes. Moreover, the three-level modulation scheme of the embodiment of the present invention achieves the wide output voltage range and the circuit gains even when the circuit parameter values are fixed. FIG. 14 is a schematic diagram showing SHB LLC resonant converter 1400, which includes control circuit 1401 that generates switch control signals to primary switching devices $S_1$ to $S_4$ based on output voltage $V_O$ (and, optionally, output current $I_O$), according to one embodiment of the present invention.

Control circuit 1401 in SHB LLC resonant converter 1400 may use output voltage $V_O$ as its main control target. Output current $I_O$ may also be used as either a separate control target or a feedback signal representative of a load condition. A reference value representative of each control target may be generated internally in control circuit 1401 or from an external source. Based on a difference between the sensed voltage $V_O$ (or the sensed current $I_O$) and the corresponding reference value, control circuit 1401 switches among two or more modulation schemes that operate switching devices $S_1$ to $S_4$ on the primary-side phase leg of SHB LLC resonant controller 1401. One or more of the control targets may be used to determine values of other control parameters, such as switching frequency $f_{sw}$ and duty cycles of signals in the selected modulation scheme. The signals that operate primary-side switching devices $S_1$ to $S_4$ are generated based on the selected modulation scheme and other control parameter values.

The conventional symmetrical frequency modulation scheme provides a desired output voltage gain by varying the switching frequency $f_{sw}$ about resonant frequency $f_r$. While the proposed three-level modulation scheme provides extra output voltage gains at the maximum allowable switching frequency by controlling the durations the primary switching devices are conducting. Accordingly, the embodiment of the present invention provides a control method that combines a selected modulation scheme and frequency control to achieve a predetermined output voltage range. (The modulation schemes may overlap in their respective output voltage regulation ranges.) Modulation scheme selection of the embodiment under the present invention may be based, for example, on control parameters such as voltage control targets, load conditions, and an allowable operating frequency range.

Modulation Transition

Figure 15A:
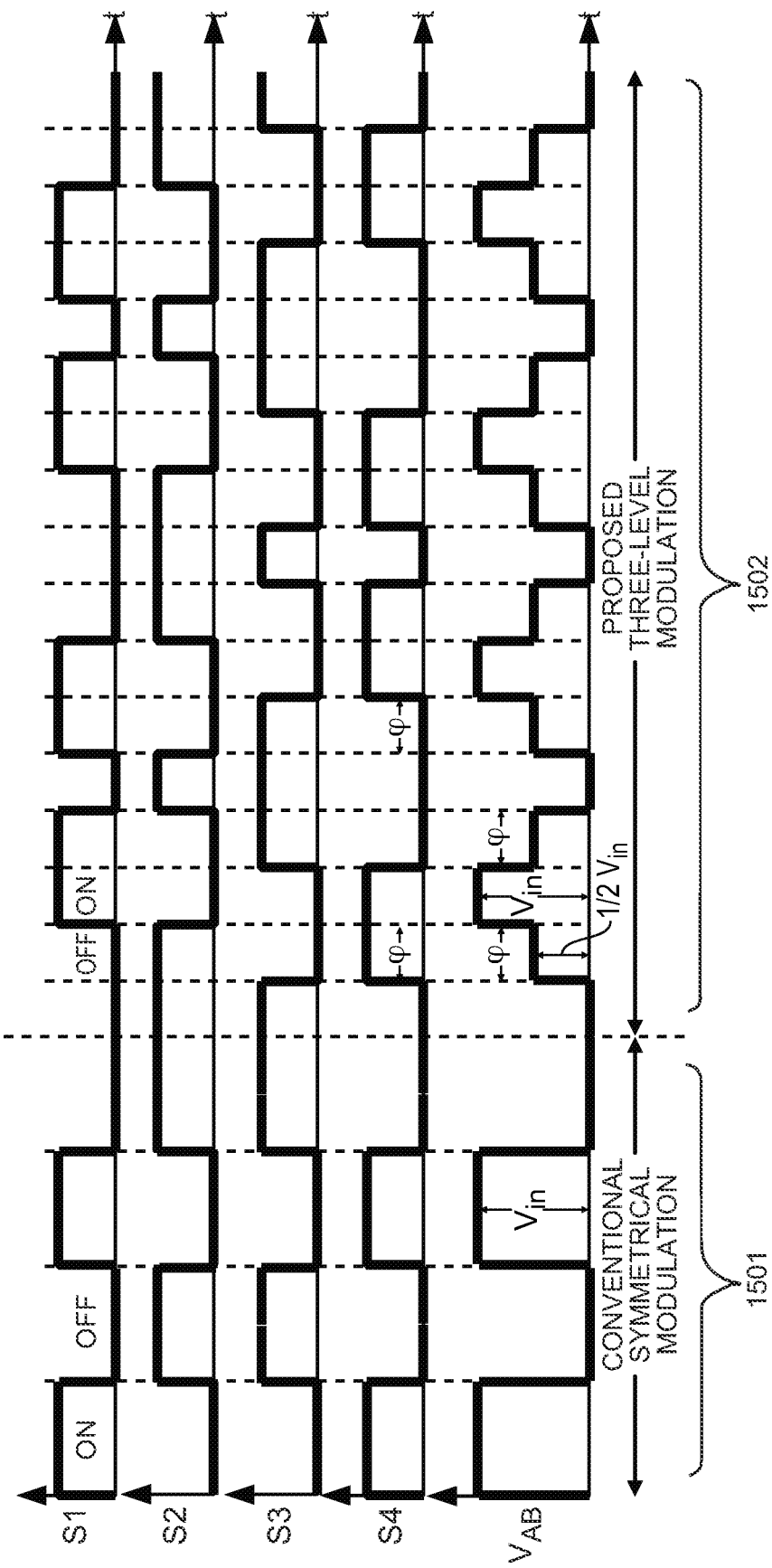
FIG. 15A illustrates control signals for primary switching devices $S_1$ to $S_4$ and phase-leg output voltage $V_{AB}$, as the control scheme switches from a symmetrical modulation scheme to a three-level modulation scheme.
Figure 15B:
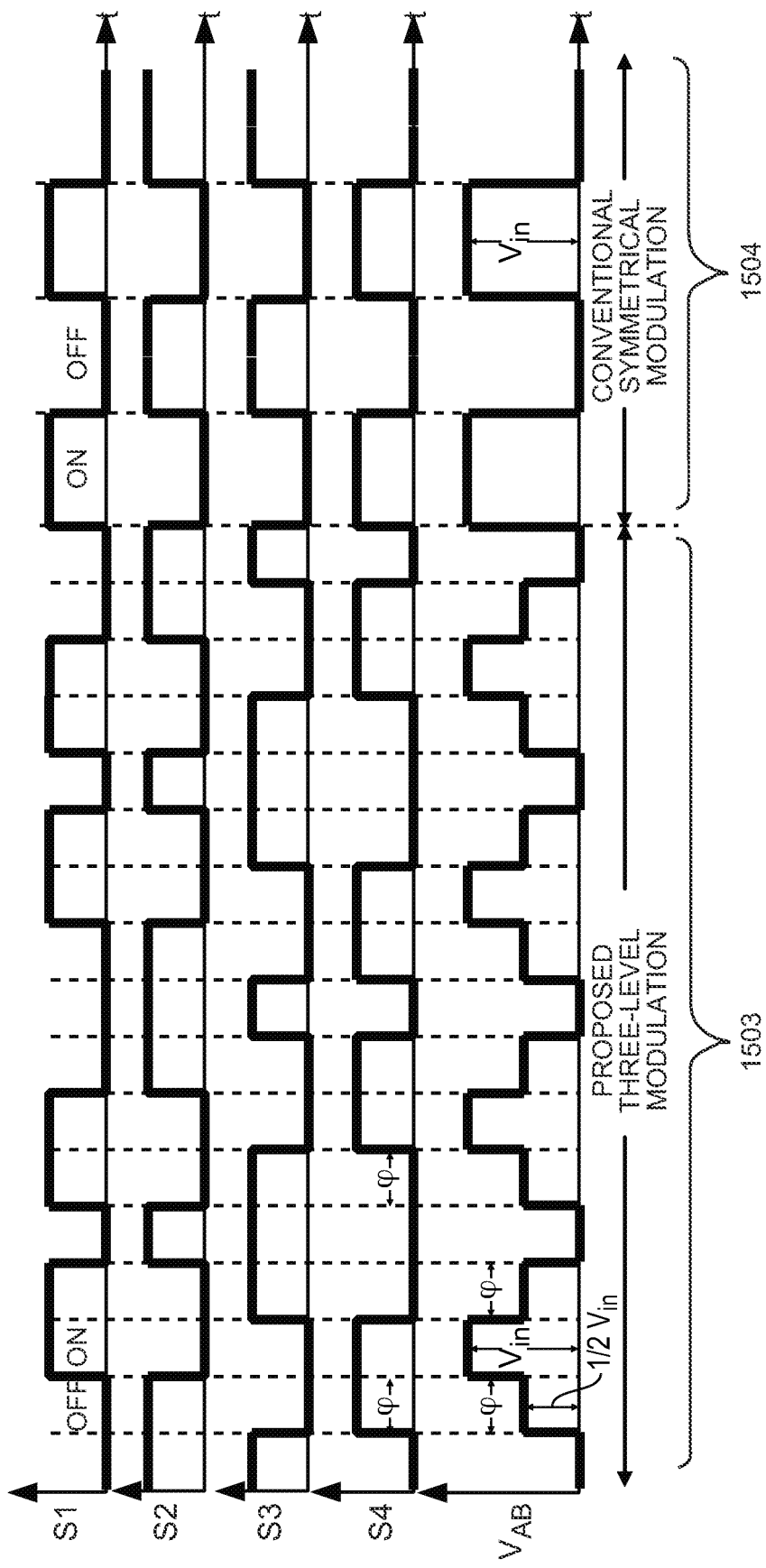
FIG. 15B illustrates control signals for primary switching devices $S_1$ to $S_4$ and phase-leg output voltage $V_{AB}$, as the control scheme switches from a three-level modulation scheme to a symmetrical modulation scheme, according to one embodiment of the present invention.

FIG. 15A illustrates, in SHB LLC resonant converter 1400, control signals for primary switching devices $S_1$ to $S_4$ and phase-leg output voltage $V_{AB}$, as the control scheme switches from a symmetrical modulation scheme to a three-level modulation scheme. FIG. 15B illustrates, in SHB LLC resonant converter 1400, control signals for primary switching devices $S_1$ to $S_4$ and phase-leg output voltage $V_{AB}$, as the control scheme switches from a three-level modulation scheme to a symmetrical modulation scheme, according to one embodiment of the present invention. As shown in FIG. 15A, switching from a symmetrical modulation scheme (interval 1501) to the three-level modulation scheme (interval 1502) of the embodiment of the present invention requires no transition period, as the control target for phase-leg output voltage $V_{AB}$ changes from a high voltage to a low voltage in output voltage $V_O$. Likewise, as shown in FIG. 15B, switching from the three-level modulation scheme of the embodiment of the present invention (interval 1503) to a symmetrical modulation scheme (interval 1504) also requires no transition period, as the control target for phase-leg output voltage $V_{AB}$ changes from a low voltage to a high voltage in output voltage $V_O$. In one embodiment, the symmetrical modulation scheme includes variable-frequency modulation. In another embodiment, the symmetrical modulation scheme includes constant-frequency modulation.

Extension for Other Topologies

Figure 16A:
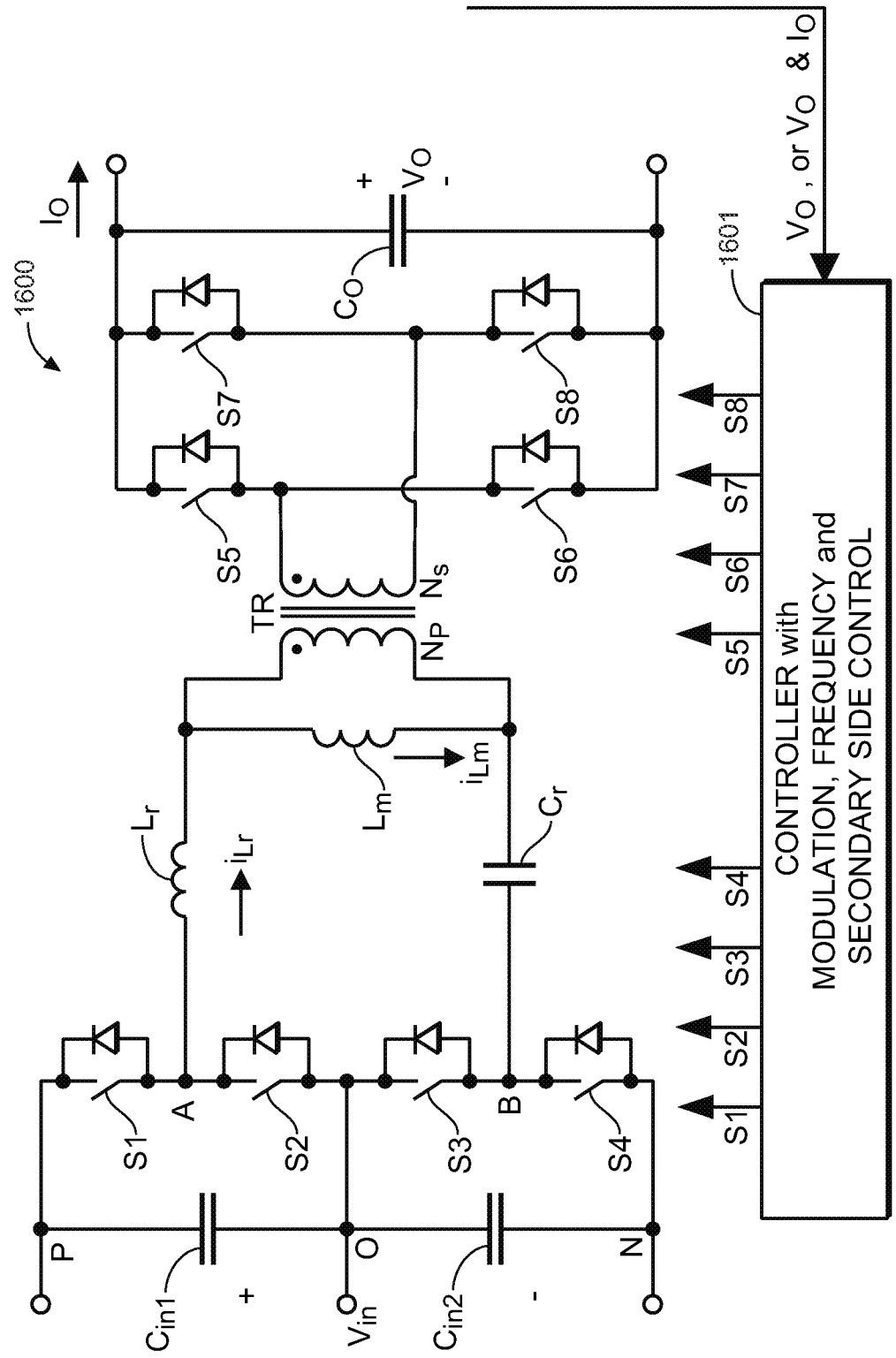
FIGS. 16A and 16B show, respectively, (i) SHB LLC resonant converter 1600 with a full-bridge synchronous rectifier on the secondary side, and (ii) SHB LLC resonant converter 1650 with center-tapped transformer TR and synchronous rectifiers $S_5$ and $S_6$ on the secondary side, according to one embodiment of the present invention.
Figure 16B:
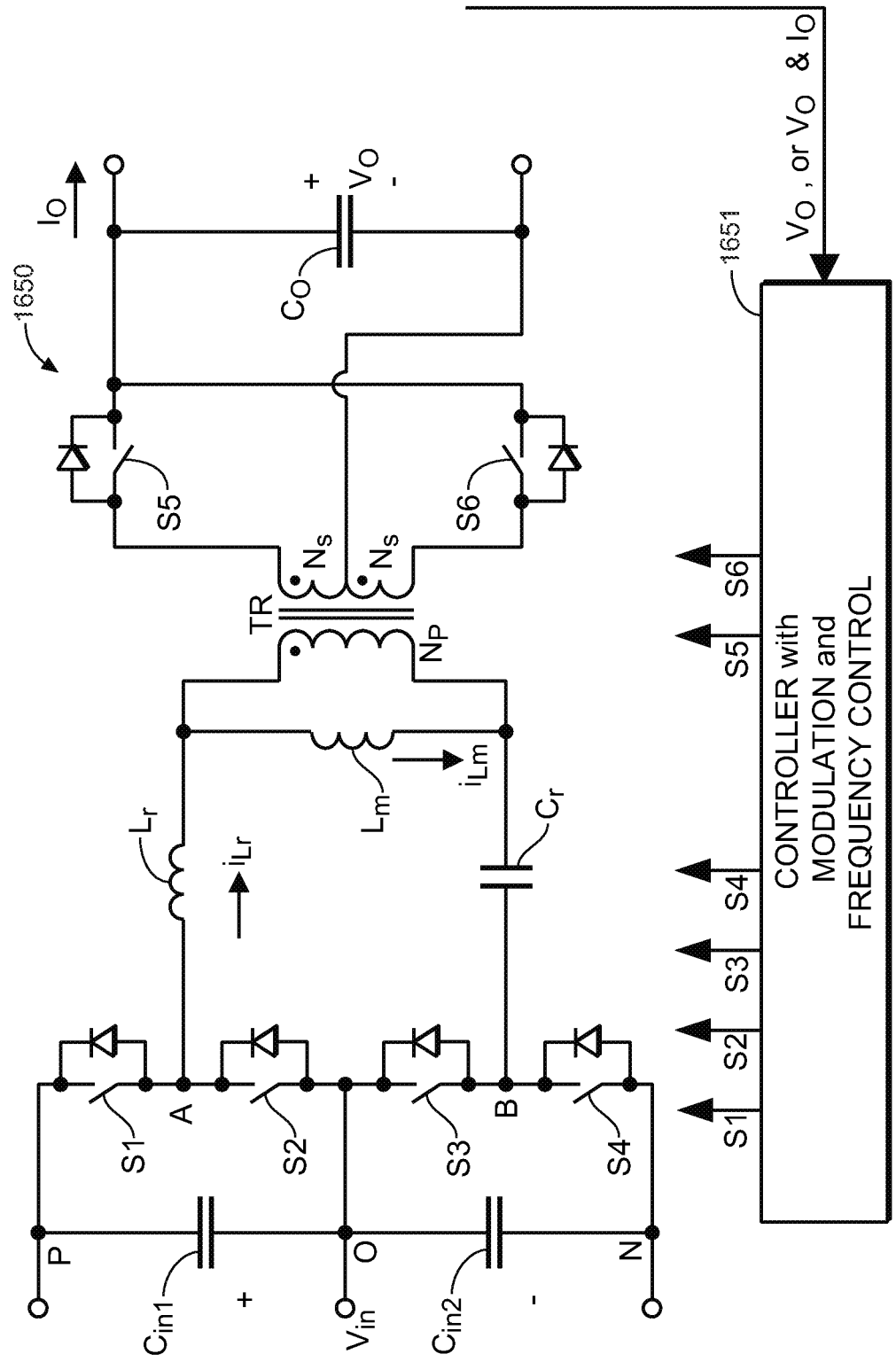

The embodiment of the present invention is equally applicable in SHB LLC resonant converters with other secondary-side topologies to provide a wide output voltage range with the same beneficial narrow device switching frequency. FIGS. 16A and 16B show, respectively, (i) SHB LLC resonant converter 1600 with a full-bridge synchronous rectifier on the secondary side, and (ii) SHB LLC resonant converter 1650 with center-tapped transformer TR and synchronous rectifiers $S_5$ and $S_6$ on the secondary side, according to one embodiment of the present invention. In the SHB LLC resonant converter 1600, the control circuit 1601 may combine the methods discussed with respect to FIG. 10B above with conventional secondary-side control schemes to generate the signals to operate the switching devices $S_1$ to $S_4$ on the primary-side and the switching devices $S_5$ to $S_8$ on the secondary-side. In the SHB LLC resonant converter 1650, the control circuit 1651 may combine the methods discussed with respect to FIG. 10B above with conventional secondary-side control schemes to generate the signals to operate the switching devices $S_1$ to $S_4$ on the primary-side and the switching devices $S_5$ and $S_6$ on the secondary-side. The embodiment of the present invention is equally applicable to an SHB LLC resonant converter in which the switching devices $S_5$ to $S_8$ on the secondary-side of SHB LLC resonant converter 1600, or the switching devices $S_5$ to $S_6$ on the secondary-side of SHB LLC resonant converter 1650, are replaced by diodes.

Figure 17A:
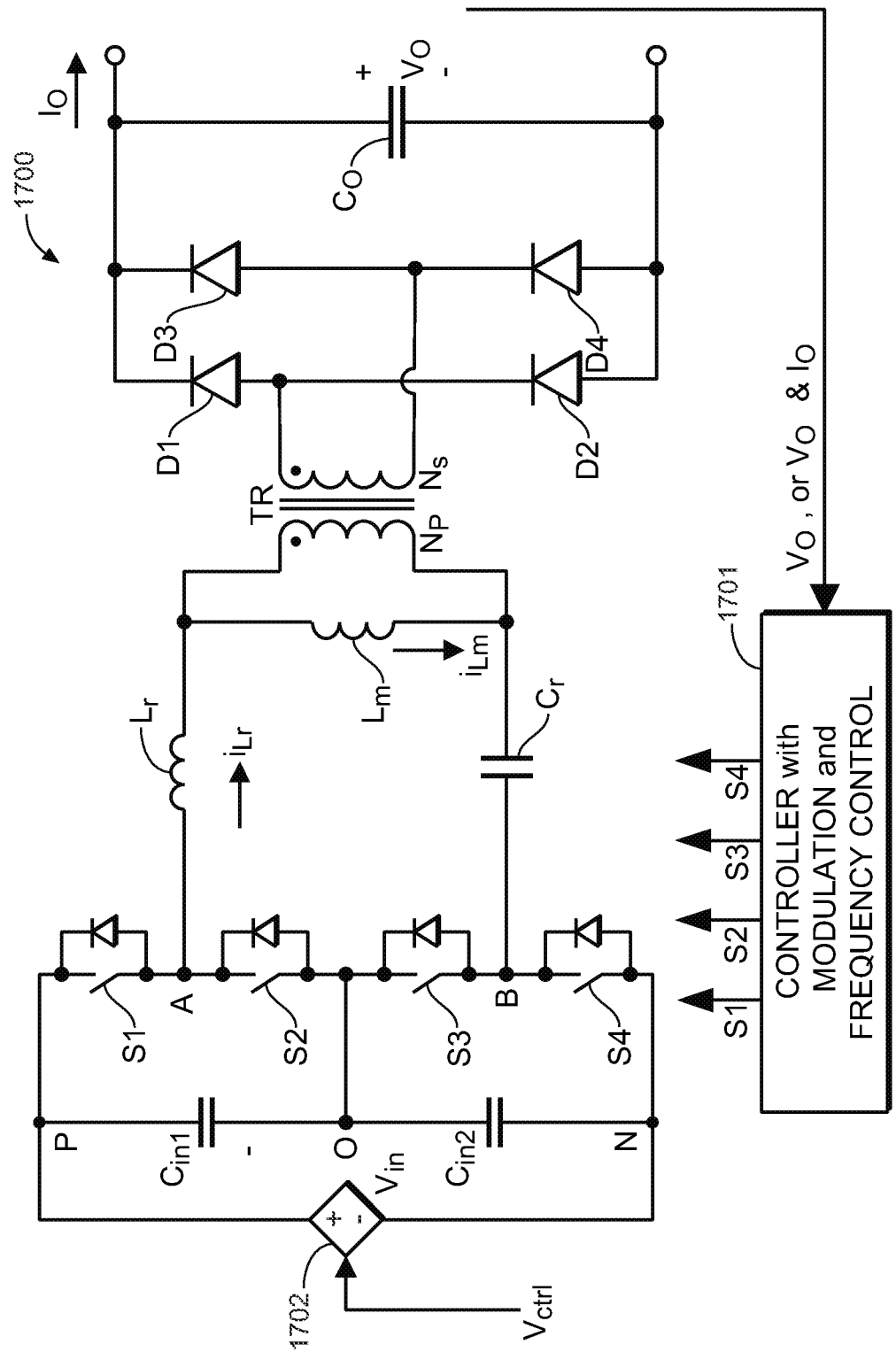
FIGS. 17A, and 17B show, respectively, (i) SHB LLC resonant converter 1700 with variable DC input voltage source 1702, and (i) SHB LLC resonant converter 1750 with DC input voltages $V_{in1}$ and $V_{in2}$, respectively, controlled according to one embodiment of the present invention.
Figure 17B:
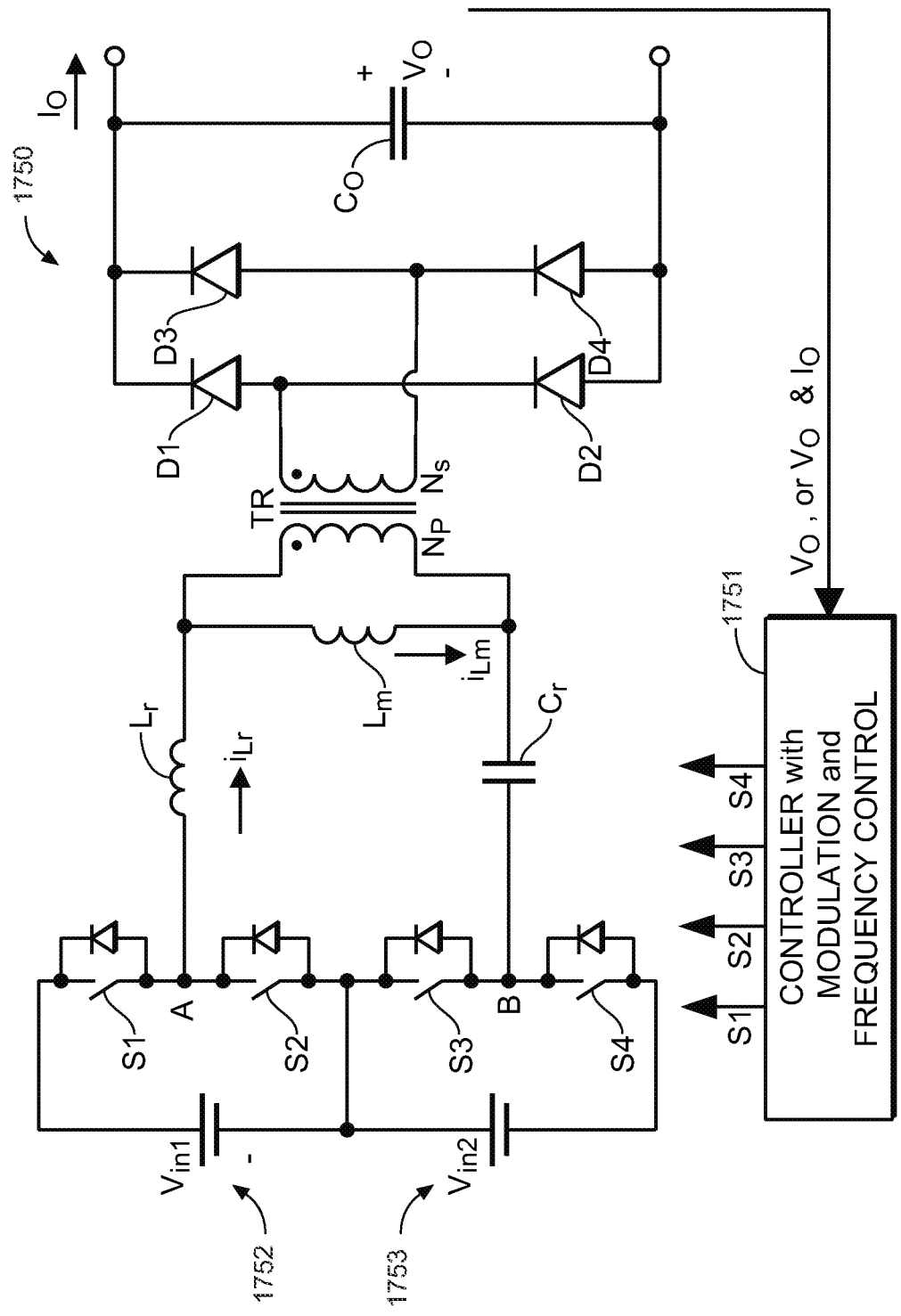

The embodiment of the present invention is also applicable to SHB LLC resonant converters with a variable DC input voltage, or with two different input voltages, such as shown in FIGS. 17A and 17B, respectively. FIGS. 17A, and 17B show, respectively, (i) SHB LLC resonant converter 1700 with variable DC input voltage source 1702, and (i) SHB LLC resonant converter 1750 with DC input voltages $V_{in1}$ and $V_{in2}$ respectively, controlled according to one embodiment of the present invention. As shown in FIG. 17A, variable DC input voltage source 1702 may be controlled by signal $V_{ctrl}$, which may be internally generated or provided externally. Combining a control method for signal $V_{ctrl}$ with any of the methods of the embodiments of the present invention discussed above may further extend the output voltage range or further reduce the device switching frequency range of the SHB LLC resonant converter 1700.

In a further embodiment, the efficiency of a SHB LLC resonant converter operating in a very wide input or output voltage range may be improved by recognizing that, for the same turns-ratio of the transformer Np/Ns and the same values in resonant-tank components Lr, Cr, and Lm, the DC voltage gain under the three-level modulation mode is usually higher than that under the two-level asymmetrical half-input voltage modulation mode. Consequently, the three-level modulation mode is more suitable for a higher DC Voltage gain application, while the two-level asymmetrical half-input voltage modulation mode is more suitable for a lower DC voltage gain application. Since the converter can operate under one modulation mode and transit to another modulation mode, optimized performance can be obtained by a proper control in a SHB LLC resonant converter operating in a very wide input or output voltage range.

In its simplest form, a controller that allows transitioning between the three-level modulation mode and the two-level asymmetrical half-input voltage modulation mode, and vice versa, may be implemented so that the switching devices are interrupted briefly to transition between the switching patterns of these modulation modes. Because no power is transferred between the input and output terminals during the transition, under this approach, the output variable (usually an output voltage or a current) dips (i.e., during the transition, the value of the output variable decreases below the steady-state value). Under this approach, to reduce the dip and to keep the output variable to within its specified range during a topology transition, energy storage may be increased in an output filter. On the other hand, the controller without interrupting the switching patterns that allows transitioning between the two modulation modes may be implemented. Because the two modulation modes have totally different switching patterns, the instant transition can cause severe oscillation and voltage spike in the system so the converter may be damaged.

According to one embodiment of the present invention, a SHB LLC resonant converter based on trajectory control capable of transitioning modulation modes without interruption of switching devices (i.e., during a transition, all switching devices remain modulated) and without introducing oscillation during or after the transition is provided, while maintaining the all system variables within the specified limits without any additional components.

Figure 18A:
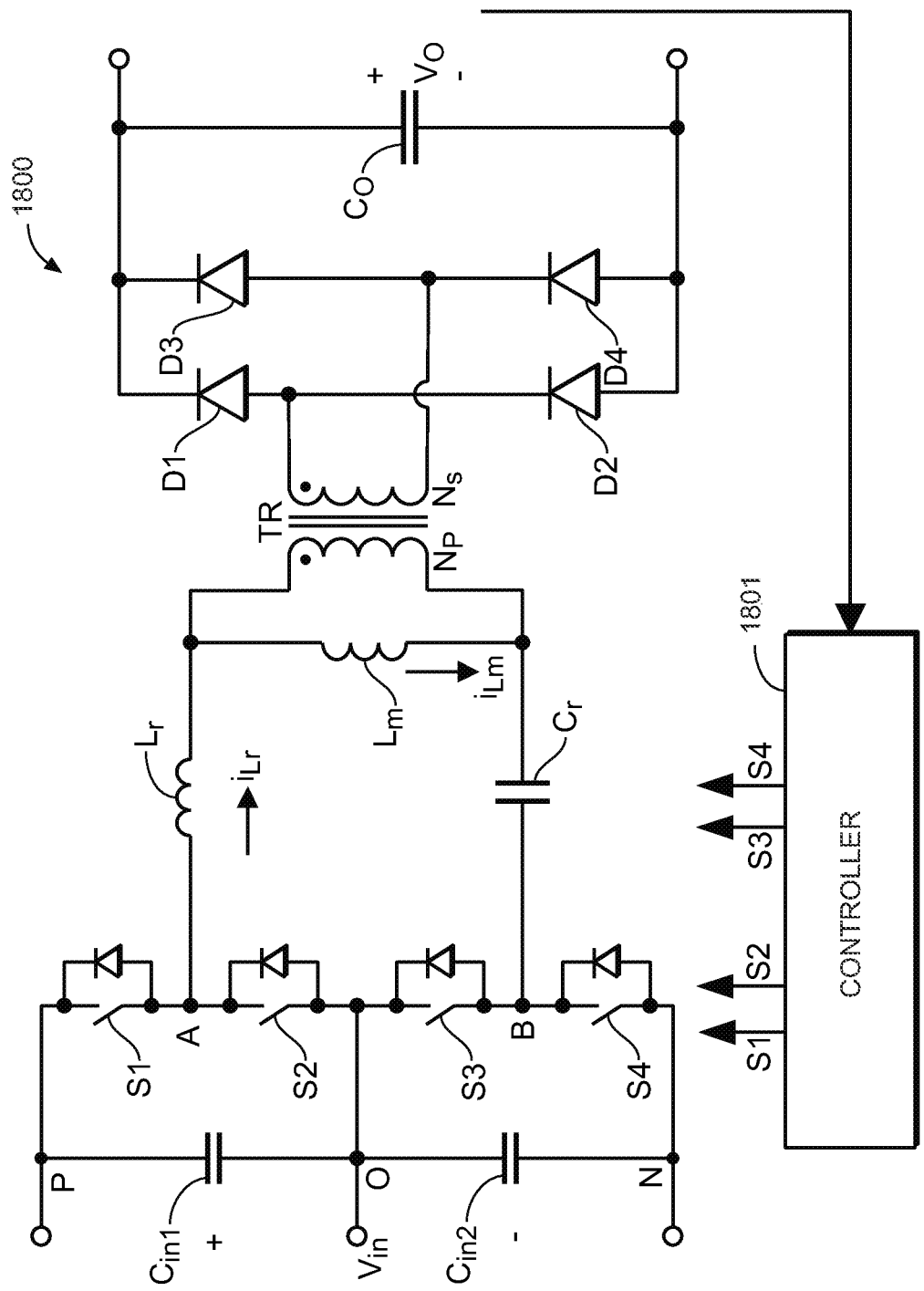
FIGS. 18A, 18B, 18C, and 18D show an exemplary circuit diagram of a serial half-bridge LLC resonant converter 1800 with modulation transition controller 1801, the timing diagrams of switching devices $S_1$ to $S_4$ during a three-level modulation to two-level modulation transition, the timing diagrams of switching devices $S_1$ to $S_4$ during a two-level modulation to three-level modulation transition, and the trajectories when the converter operates under the two-level modulation and three-level modulation before the transition, respectively, in accordance with one embodiment of the present invention.
Figure 18B:
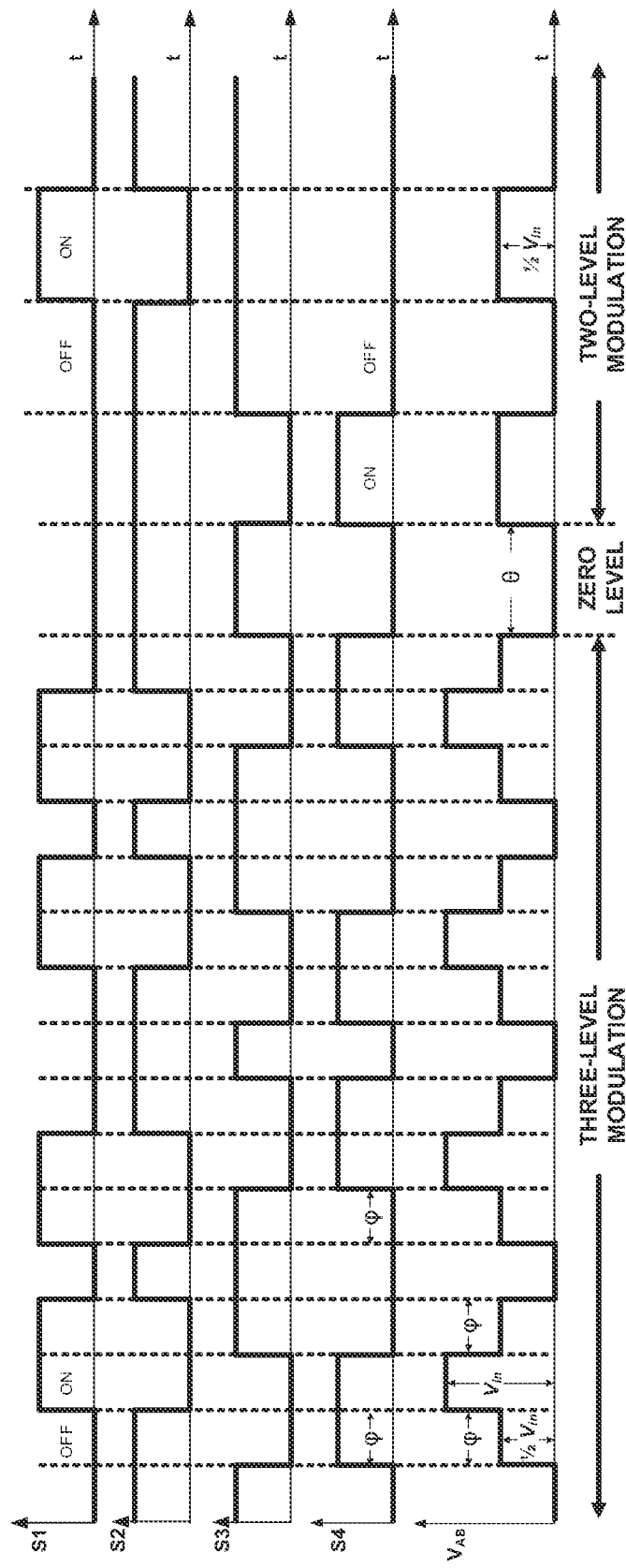
Figure 18C:
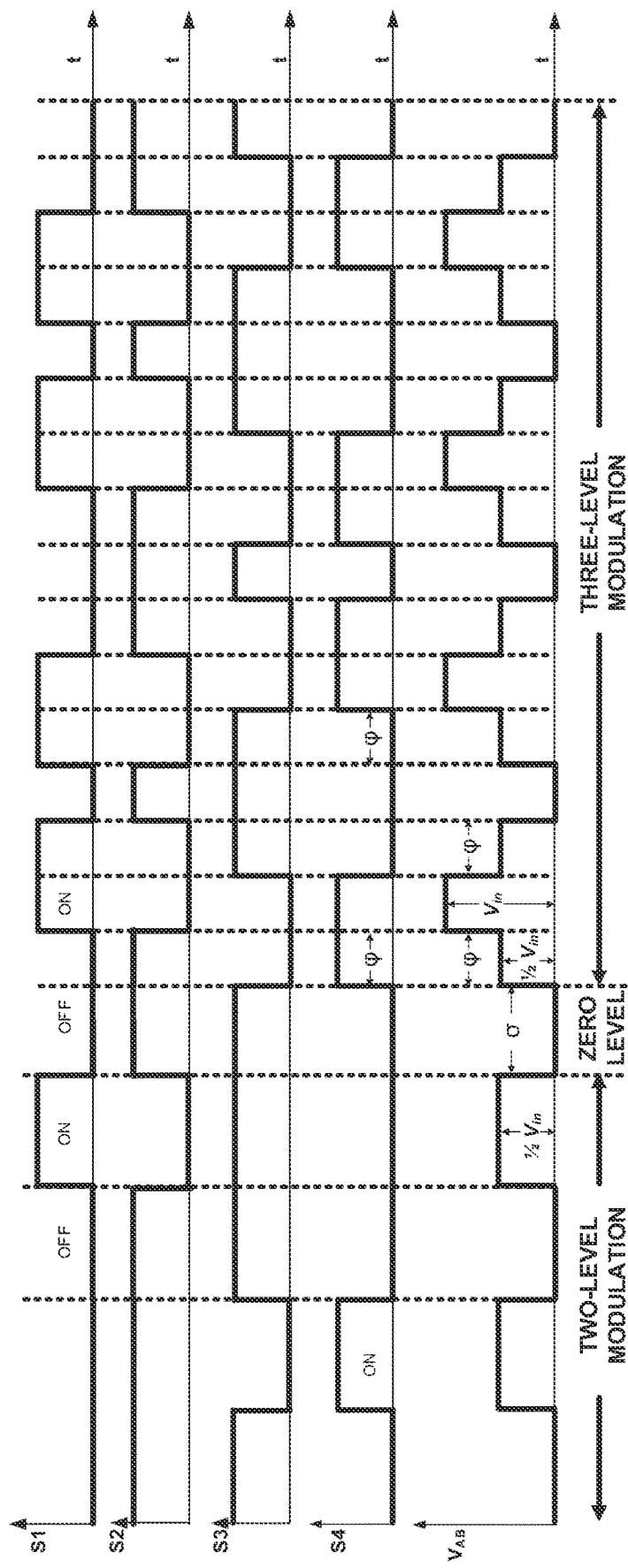

FIG. 18A illustrate a SHB LLC resonant converter 1800 capable of transitioning modulation mode between three-level modulation mode and the two-level asymmetrical half-input voltage modulation mode without introducing circuit oscillation and parameter spikes in the system, according to one embodiment of the present invention. FIG. 18A shows a SHB LLC resonant converter 1800 that operates under either three-level modulation mode or the two-level asymmetrical half-input voltage modulation mode. In the circuit of FIG. 18A, the transitions between the two modulation modes for the circuit of FIG. 18A are accomplished by trajectory control. For example, FIG. 18B illustrates switching signals for switching devices $S_1$ and $S_4$ during a transition from the three-level modulation mode to the two-level asymmetrical half-input voltage modulation mode. During operation under three-level modulation mode, switching devices $S_1$ to $S_4$ are operated with fixed switching frequency and variable phase shift angle φ. When a transition is initiated, the controller 1801 firstly generates the last ½ $V_{in}$ voltage level following the high voltage level of $V_A$, which is the transition starting point. Then, the controller 1801 generates the dedicated gate signals to form a zero voltage level of $V_{AB}$, which duration is θ. After the zero level, the controller 1801 generates the two-level modulation mode gate signals and the transition is completed. FIG. 18C illustrates switching signals for switching devices $S_1$ and $S_4$ during a transition from two-level asymmetrical half-input voltage modulation mode to three-level modulation mode. As shown in FIG. 18C, when a transition is initiated, the controller 1801 firstly generates the last ½ $V_{in}$ voltage level of $V_{AB}$ under two-level modulation mode, which is the transition starting point. Then, the controller 1801 generates the dedicated gate signals to form a zero voltage level of $V_{AB}$, which duration is a. After the zero level, the controller 1801 generates the three-level modulation mode gate signals and the transition is completed.

Figure 18D:
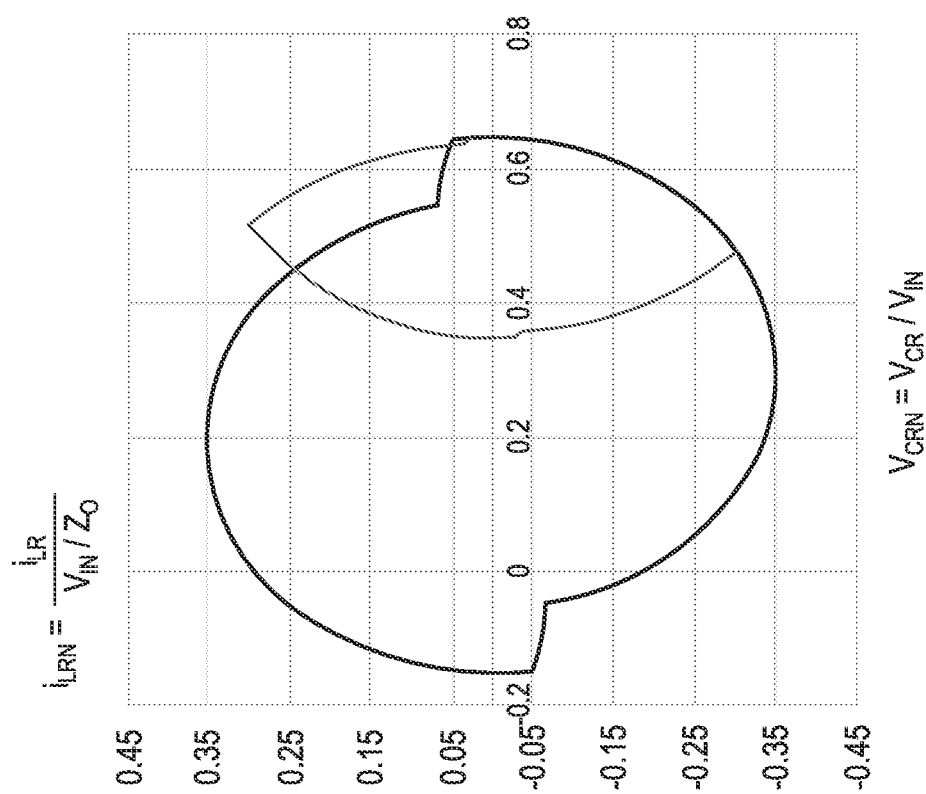

The output voltage at which the transition happens is determined by the resonant tank energy, which is usually indicated by the trajectory of normalized resonant voltage $V_{CRN}$ and normalized resonant current $i_{LRN}$. FIG. 18D shows one trajectory under three-level modulation mode and another trajectory under two-level modulation mode. The dark trajectory represents the trajectory under the two-level modulation mode. The shallow trajectory represents the trajectory under the three-level modulation mode. A part of the three-level trajectory and a part of the two-level trajectory are overlapped, meaning the origin and the radius of these two parts are the same. In other words, the resonant tank energy stored in the resonant elements are the same. Therefore, the transition could happen at the beginning of the overlapped trajectory so that there is little energy mismatch in resonant tank before and after the transition. And the optimal transition performance can be obtained.

Figure 19A:
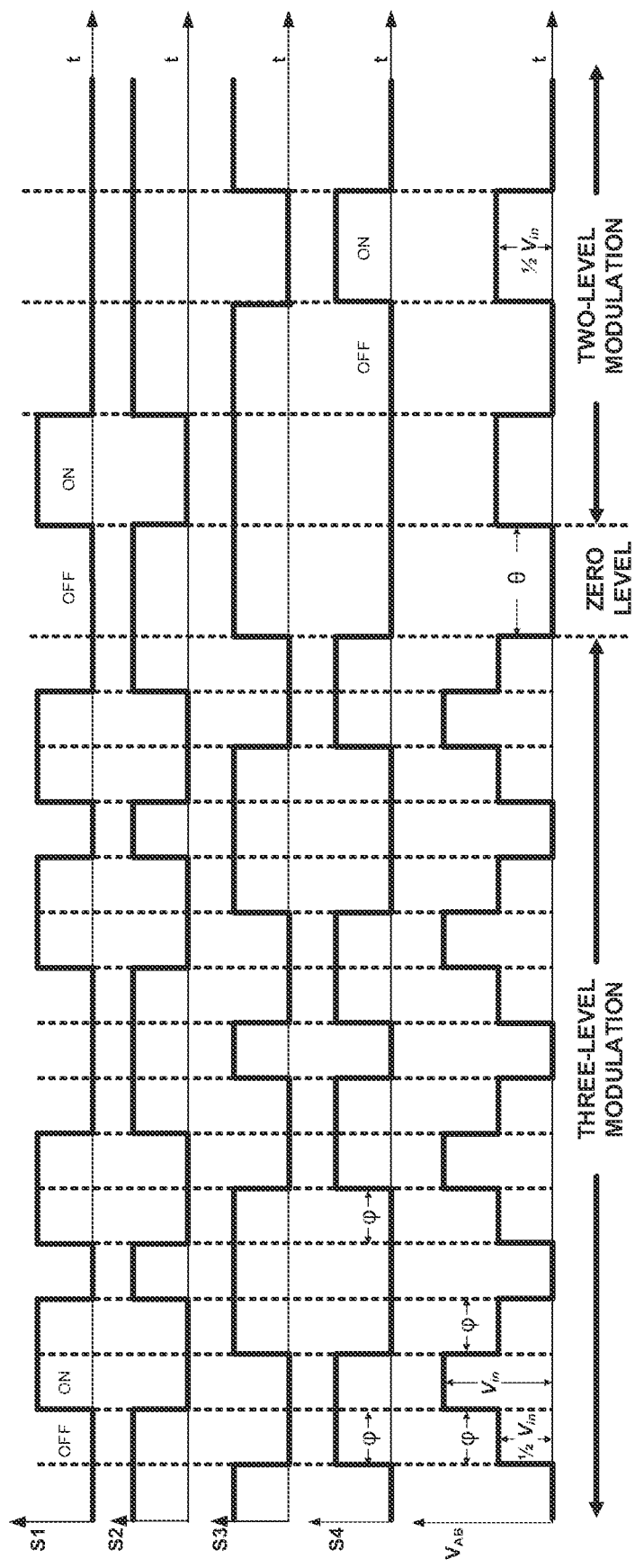
FIGS. 19A, 19B and 19C show, respectively, other possible timing diagrams of switching devices $S_1$ to $S_4$ during a three-level modulation to two-level modulation transition.
Figure 19B:
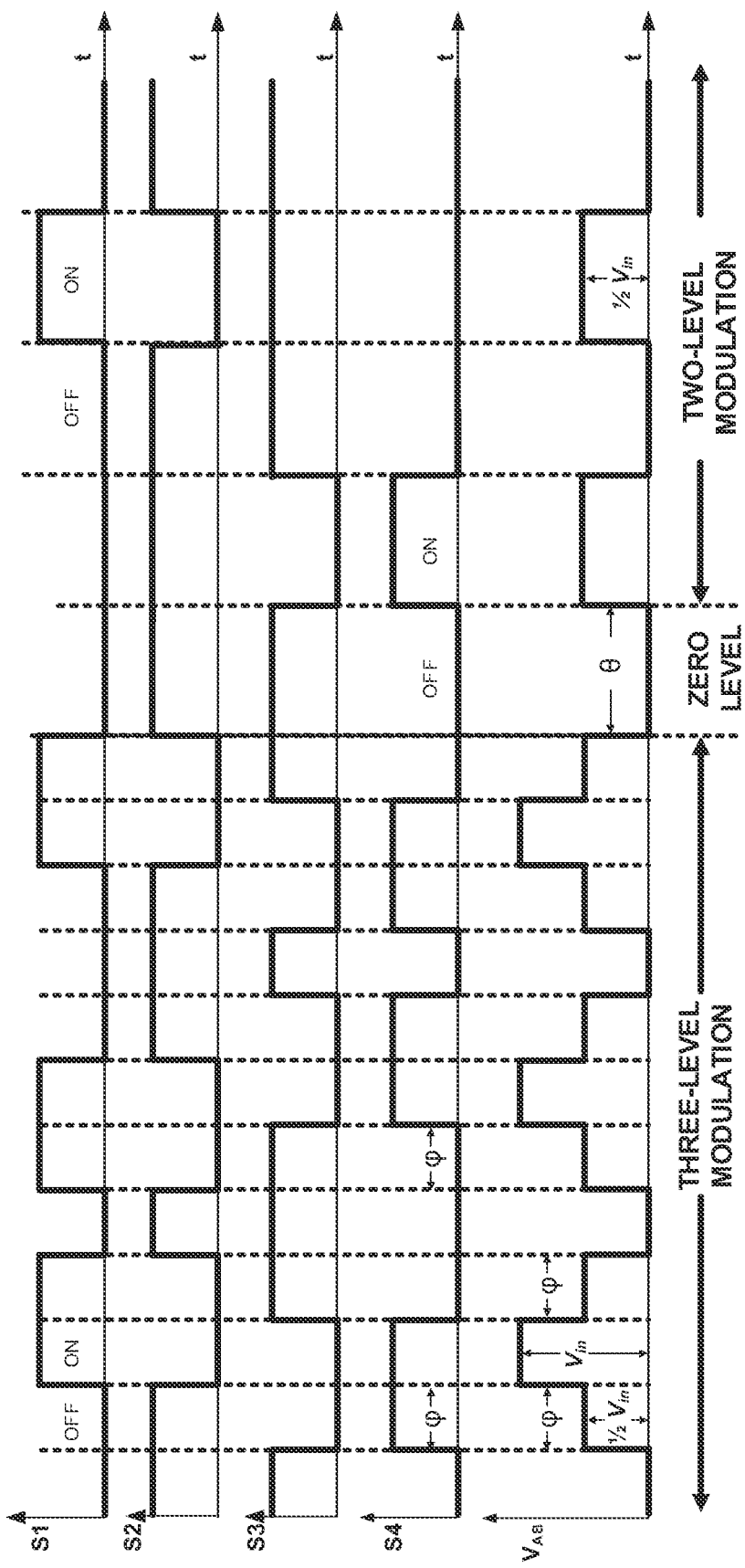
Figure 19C:
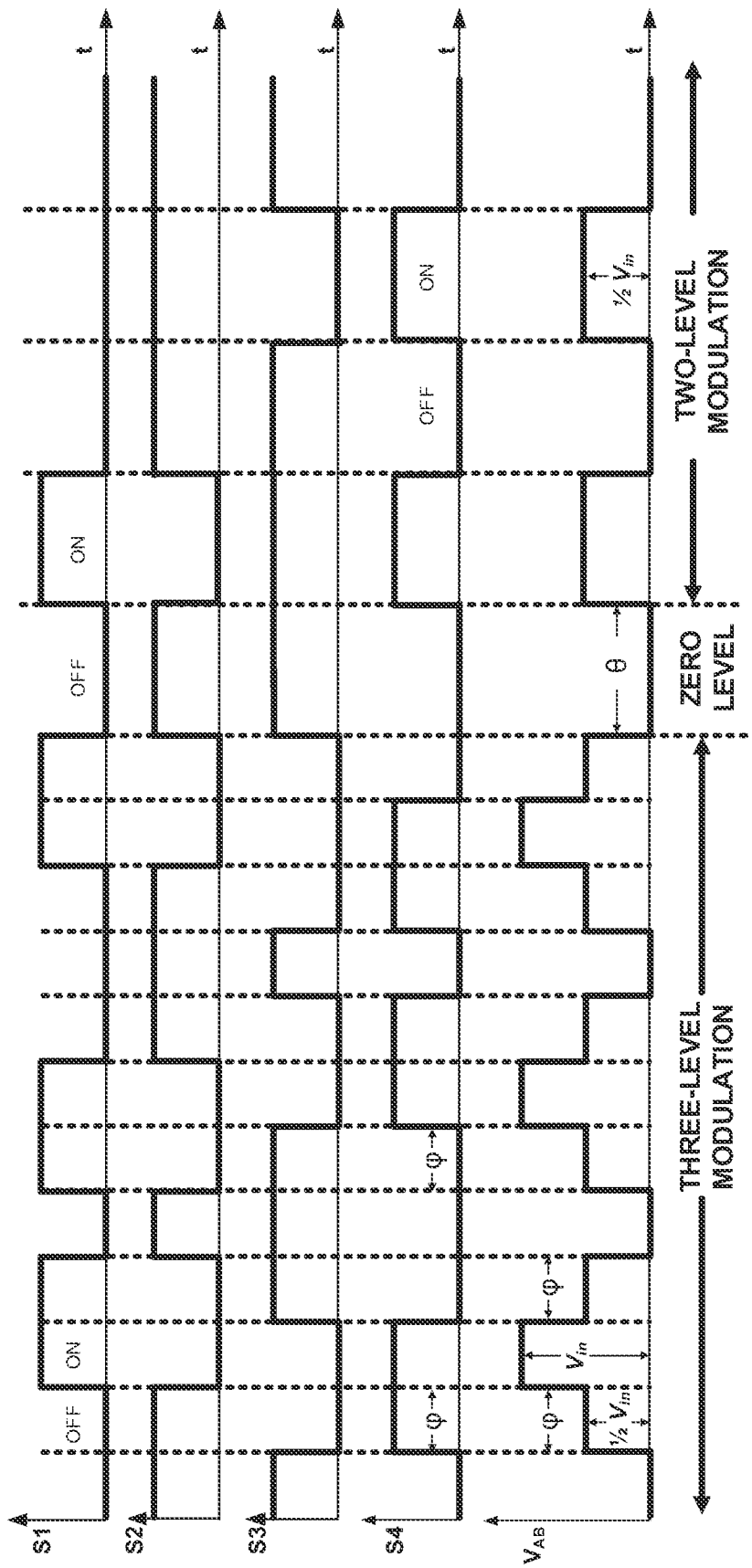
Figure 20A:
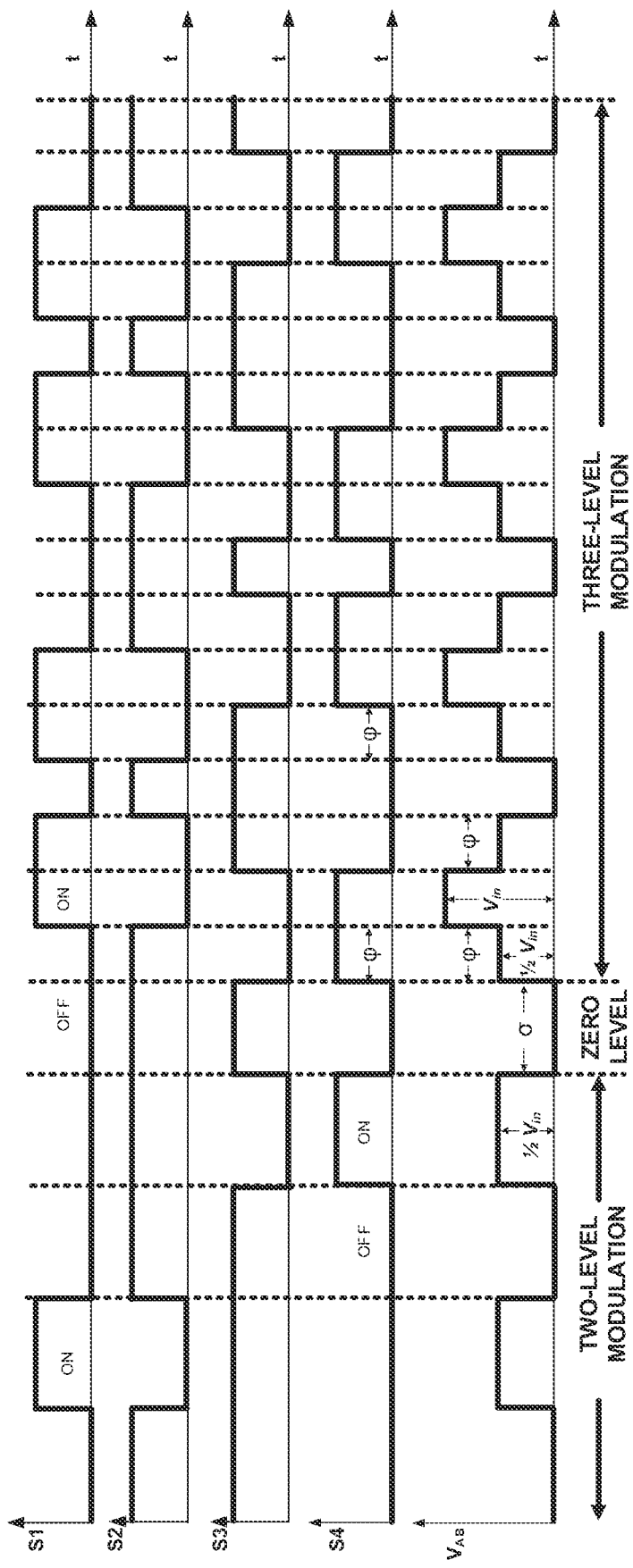
FIGS. 20A, 20B and 20C show, respectively, other possible timing diagrams of switching devices $S_1$ to $S_4$ during a two-level modulation to three-level modulation transition.
Figure 20B:
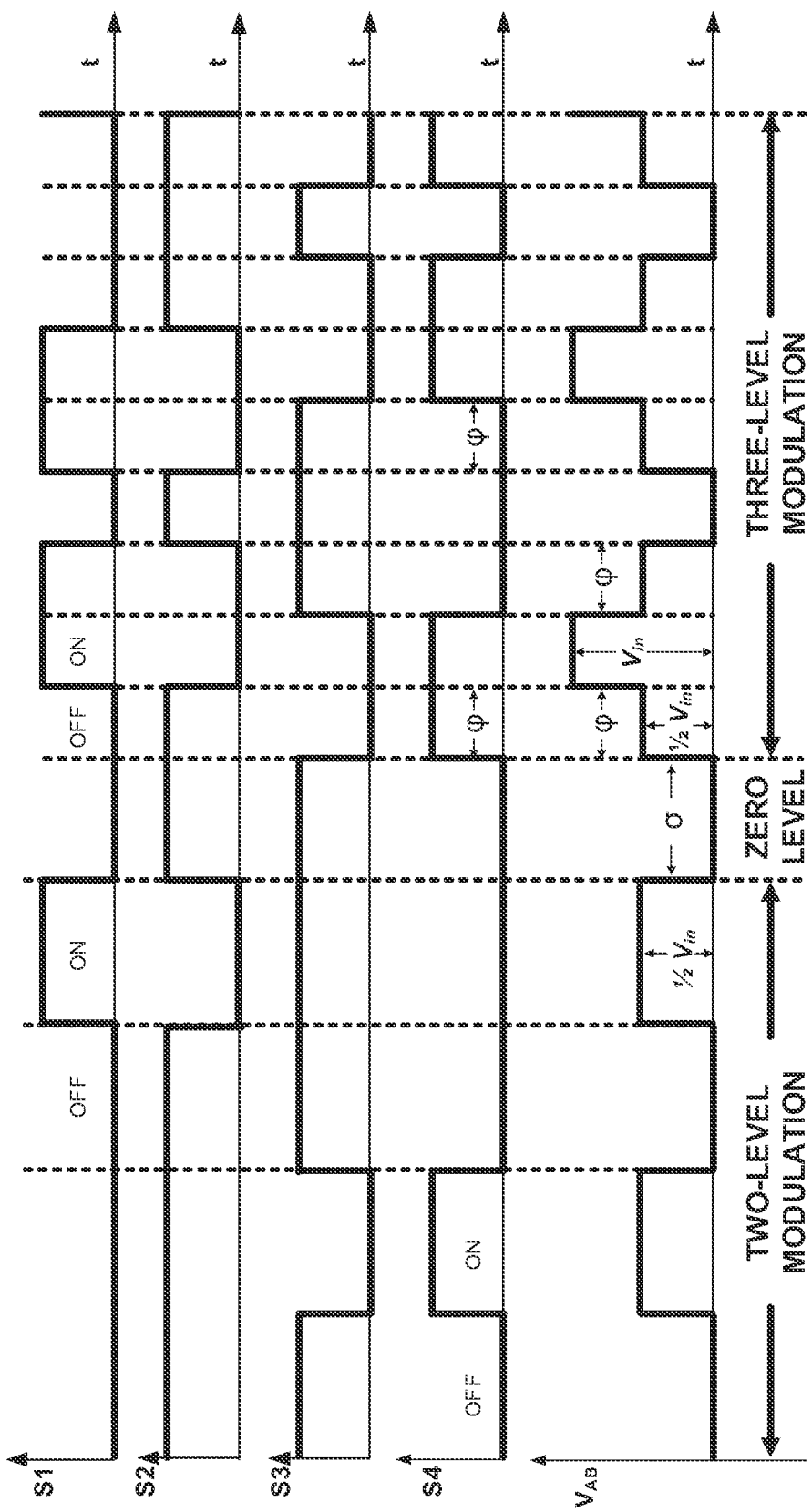
Figure 20C:
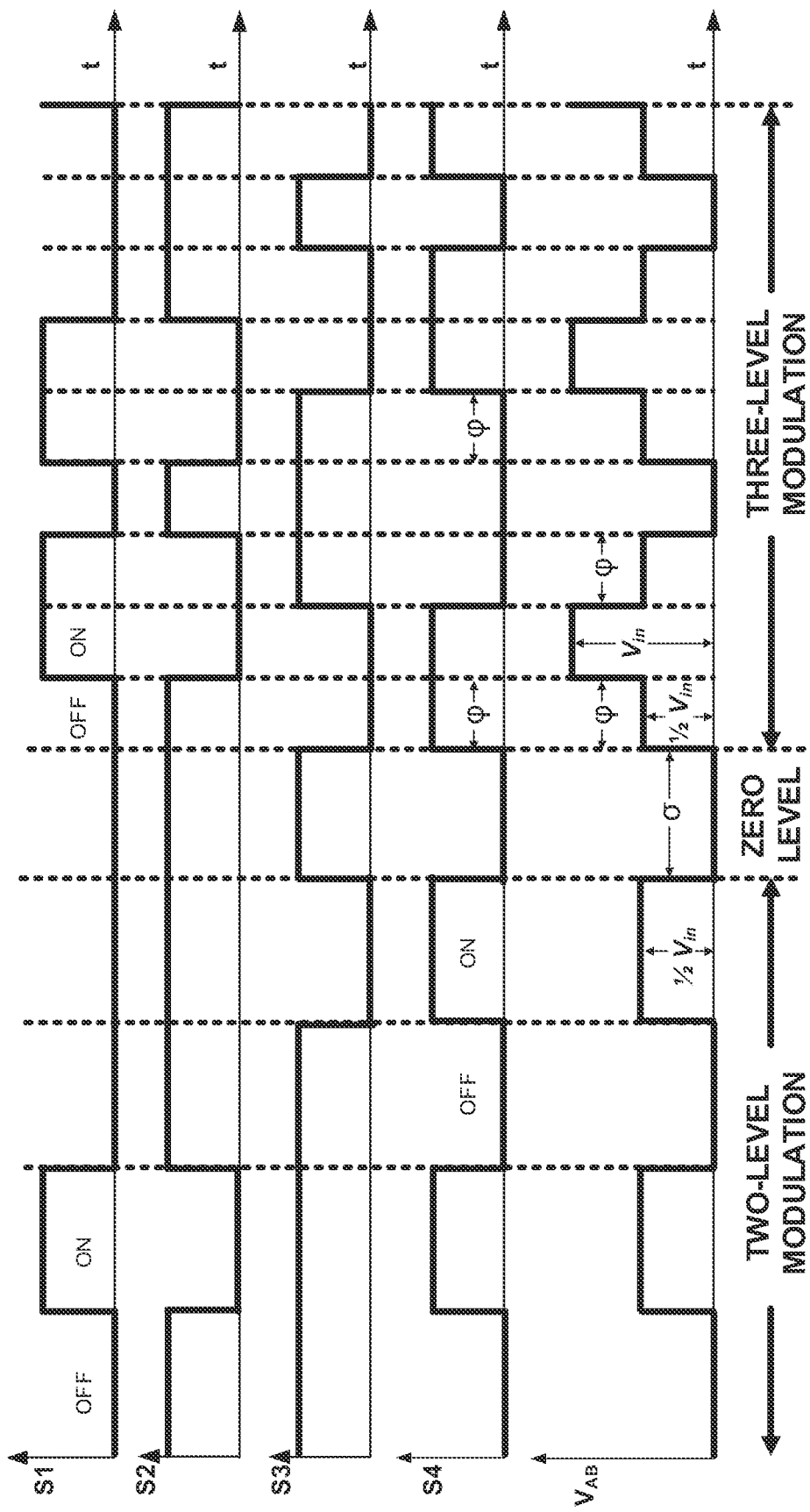

As shown in FIGS. 18B and 18C, the switching devices $S_2$ and $S_4$ are turned on to form the last ½$V_{in}$ voltage level of the three-level modulation mode before transition and the switching devices $S_2$ and $S_3$ are turned on to form the first zero voltage level of two-level modulation mode after the transition. However, other switching patterns which can generate the same voltage level of $V_{AB}$ can also be used. FIG. 19 shows another possible gate signals during the transition from three-level modulation mode to two-level modulation mode. And FIG. 20 shows another possible gate signals during the transition from two-level modulation mode to three-level modulation mode.

According to one embodiment of the present invention, another method provides a modulation mode transition without interruption of switching devices, while maintaining the output variable within the specified limits without having to increase storage capacity in the output filter.

Figure 21A:
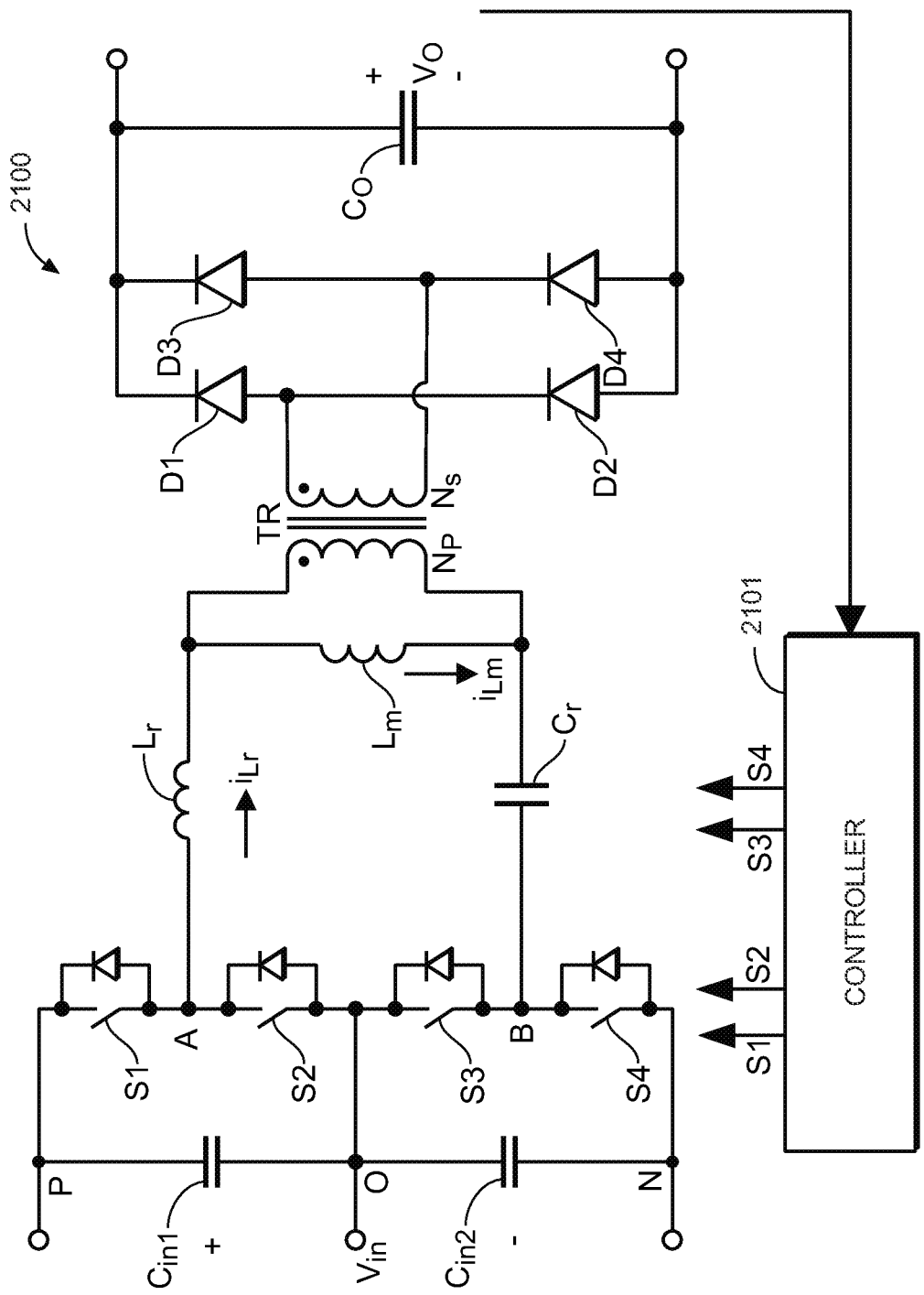
FIGS. 21A, 21B, and 21C show an exemplary circuit diagram of a serial half-bridge LLC resonant converter 2100 with modulation transition controller 2101, the timing diagrams of switching devices $S_1$ to $S_4$ during a three-level modulation to two-level modulation transition, and the timing diagrams of switching devices $S_1$ to $S_4$ during a two-level modulation to three-level modulation transition, respectively, in accordance with one embodiment of the present invention.
Figure 21B:
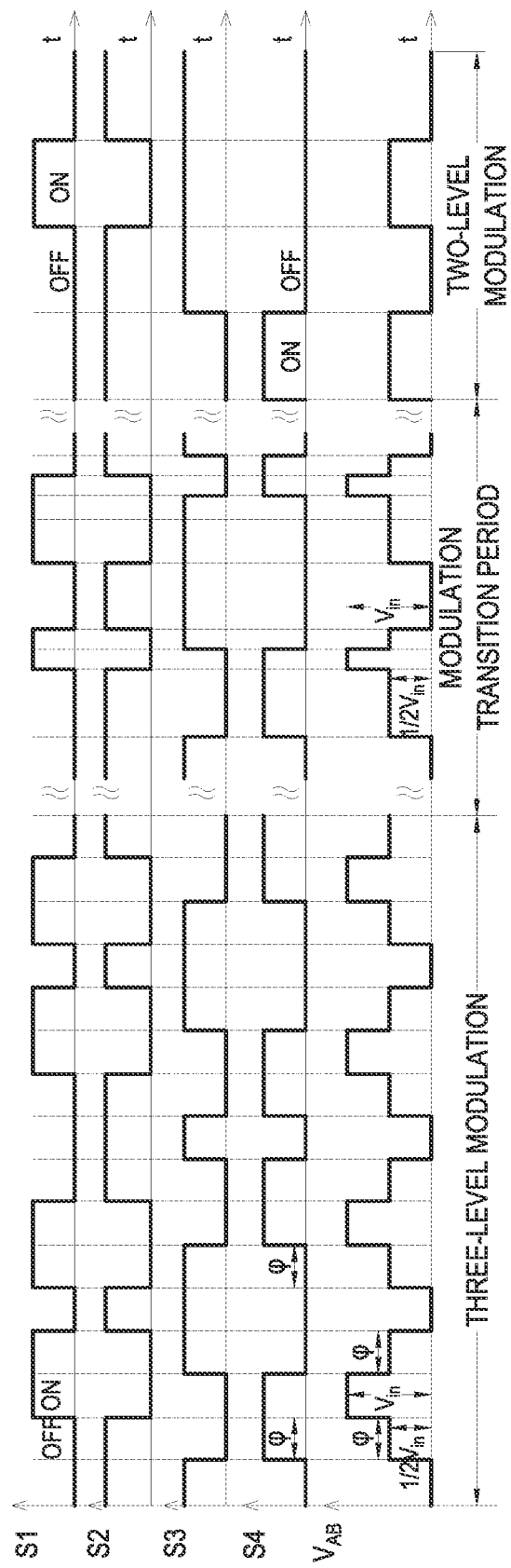
Figure 21C:
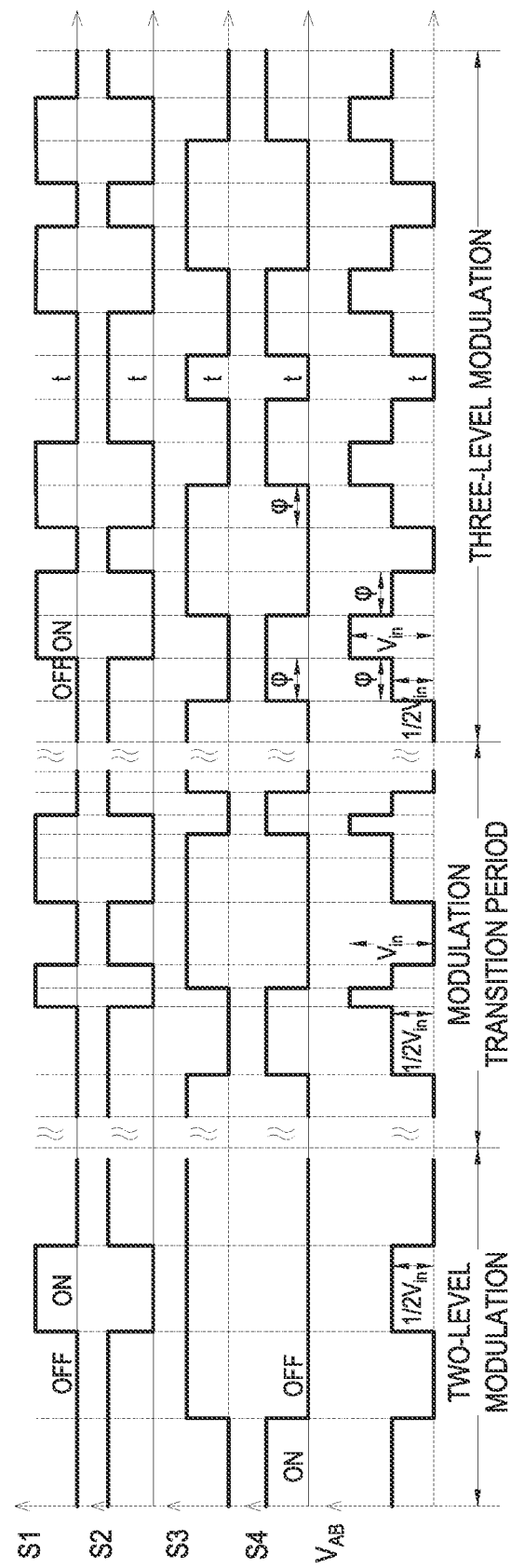

FIGS. 21A, 21B and 21C illustrate a SHB LLC resonant converter providing transitions between three-level modulation mode and two-level half-input-voltage modulation mode without interruption of switching devices, according to one embodiment of the present invention, FIG. 21A shows a SHB LLC resonant converter 2100 that may operate under either three-level modulation mode or the two-level asymmetrical half-input voltage modulation mode. The transitions between the two modulation modes for the circuit of FIG. 21A are accomplished by PWM control of the four switching devices, which the PWM control is controlled by the controller 2101. For example, FIG. 21B illustrates switching signals for switching devices $S_1$ to $S_4$ during a transition from the three-level modulation mode to the two-level half-input-voltage modulation mode. During operation under three-level modulation mode, the switching devices $S_1$ and $S_4$ are operated with variable switching frequency and a 50% duty ratio. During a transition, the switching devices $S_2$ and $S_3$ continue to operate with the variable switching frequency and to be complimentary to the switching devices $S_1$ and $S_4$ respectively, while PWM transition control decreases the duty ratio of one of every two pulses of the switching devices $S_1$ monotonically from 50% to 0% and decreases the duty ratio of every two of the two pulses of the switching devices $S_4$ monotonically from 50% to 0%. In addition, the narrowing pulse of the switching device $S_1$ is phase shifted with the narrowing pulse of the switching device $S_4$ by 180 degree, and the unchanging pulse of switching device $S_1$ is phase shifted with the unchanging pulse of switching device $S_4$ by 180 degree. Because the duty cycle of switching devices $S_1$ and $S_4$ become 25%, the LLC resonant converter continues to operate under the two-level half-input-voltage modulation mode during the transition period with variable-frequency control. FIG. 21C illustrates switching signals for the switching devices $S_1$ to $S_4$ during a transition from the two-level half-input-voltage modulation mode to the three-level modulation mode. As shown in FIG. 21C, the switching devices $S_1$ and $S_4$ are modulated during the transition from the two-level half-input-voltage modulation mode to the three-level modulation mode in substantially the opposite direction as the transition from the three-level modulation mode to the two-level half-input-voltage modulation mode, i.e., the duty ratio of one of every two pulses of the switching devices $S_1$ and $S_4$ increases monotonically from 0% to 50%, increasing the equivalent duty ratio of S1 and S4 from 25% to 50%.

In some embodiments, the controller selects one of the three-level and two-level modulation modes to operate the power converter according to at least one of power source voltage, load voltage, and load current. In some embodiments, the controller operates the switching devices with at least one of variable switching frequency, constant-frequency pulse width modulation mode, and constant frequency phase-shift control.

In one embodiment, the changes of the duty ratio of the switching devices $S_1$ and $S_4$ during the modulation mode transition period is determined by the time required for the average voltage on resonant capacitor Cr to change between its value for the three-level modulation mode and its value for the two-level half-input-voltage modulation mode. Specifically, for a transition from the three-level modulation mode to the two-level half-input-voltage modulation mode, the average voltage of resonant capacitor changes from $V_{in}/2$ to $V_{in}/4$. Correspondingly, from the two-level half-input-voltage modulation mode to the three-level modulation mode, the average voltage changes from $V_{in}/4$ to $V_{in}/2$. If the topology transition time is too short or, in the worst case, abrupt, the voltage on resonant capacitor Cr may not have sufficient time to be fully charged to the appropriate value before the topology transition completes. In such an event, a transient volt-second imbalance on the transformer may result in saturation in the transformer core, or an output voltage that is outside the desired range.

As shown in FIGS. 21B and 21C, the duty ratio of the switching devices $S_1$ and $S_4$ are reduced by delaying the turn-on edge and leading the turn-off edge simultaneously. However, other PWM control methods are possible. For example, the duty ratio can be reduced by only delaying the turn-on edge or turn-off edge.

Generally, modulation mode transitions are crucial to input or output voltage changes or output current changes. As a result, to implement the transition control, the input voltage, the output voltage, or the output current needs to be sensed. A topology transition can be initiated by either a system controller (e.g., a power management controller) or, autonomously, by a power converter controller. While a controller with modulation mode transition control may be implemented by both analog and digital circuitry, the digital approach is preferred because of adaptive control and complex timing requirements may be easily achieved.

The modulation mode transition of the SHB LLC resonant converter of the embodiments of the present invention may also be applied to other resonant converters, including conventional full bridge LLC resonant converter, where the modulation mode transition happens between full bridge two-level modulation mode and half bridge two-level modulation mode.

The embodiments of the present disclosure described in the present specification and the accompanying drawings are only as specific examples in order to assist in understanding the present disclosure and do not limit the scope of the present disclosure, and it is obvious to those skilled in the art to which the generic principles defined herein may be applied to other implementations without departing from the spirit or scope of this disclosure, in addition to the embodiments disclosed herein. Thus, the claims are not intended to be limited to the implementations shown herein, but are to be accorded the widest scope consistent with this disclosure, the principles and the novel features disclosed herein.

What is claimed is:

1. A power converter that receives an input signal from a voltage source to provide an output voltage or an output current to at least one load, characterized in that the power converter comprises:
   (a) a primary-side circuit comprising:
      (i) series-connected first and second pairs of series-connected switching devices, each switching device of the first and second pairs of switching devices being controlled by a switch control signal, wherein the input signal is provided across the series-connected first and second pairs of switching devices;
      (ii) an LC resonant circuit connected between a first electrical node in the first pair of switching devices and a second electrical node in the second pair of switching devices; and
      (iii) an isolation transformer having first and second windings, wherein the first winding is connected between third and fourth electrical nodes in the LC resonant circuit;
   (b) a secondary-side circuit connected in parallel with the second winding of the isolation transformer, the secondary-side circuit comprising a filter capacitor providing the output voltage or output current to the at least one load; and
   (c) a control circuit, wherein the control circuit selects, at any given time, one of two or more modulating schemes and provides the switch control signals to operate the first and second pairs of switching devices of the primary-side circuit under the selected modulation scheme, based on at least one of the output voltage, the output current, the input signal, and one or more external control signals,
   wherein the control circuit operates the first and second pairs of switching devices based on the output voltage or the output current, the control circuit being configured to operate in a first modulation mode and a second modulation mode, wherein under the first modulation mode, the first and second pairs of switching devices are operated to generate the output voltage comprising three different voltage levels, and wherein under the second modulation mode, the first and second pairs of switching devices are operated to generate the output voltage comprising two different voltage levels,
   wherein the control circuit is further configured to operate in a third modulation mode, under the third modulation mode, the first and second pairs of switching devices are operated to generate a zero voltage level, wherein the control circuit operates in the third modulation mode between operating in the first modulation mode and operating in the second modulation mode, and
   wherein the control circuit is further configured to operate in a fourth modulation mode, under the fourth modulation mode, the duty ratio of one of every two pulses of one of the first pair of switching devices is increased and the duty ratio of one of every two pulses of one of the second pair of switching devices is increased, or the duty ratio of one of every two pulses of one of the first pair of switching devices is decreased and the duty ratio of one of every two pulses of one of the second pair of switching devices is decreased.

2. The power converter of claim 1, wherein one of the modulation schemes operates as a symmetrical modulation scheme, in which the switch control signals to switching devices in each pair of the first and second pairs of switching devices are complementary, wherein each pair of the first and second pairs of switching devices comprises first and second switching devices, and wherein the switch control signal that operates the first switching device of the first pair of switching devices and the switch control signal that operates the second switching device of the second pair of switching devices are synchronized, and are 50% duty cycle switching signals.

3. The power converter of claim 1, wherein one of the modulation schemes operates as an asymmetrical modulation scheme, in which the switch control signals to switching devices in each pair of the first and second pairs of switching devices are complementary, wherein each pair of the first and second pairs of switching devices comprises first and second switching devices, and wherein the switch control signal that operates the first switching device of the first pair of switching devices and the switch control signal that operates the second switching device of the second pair of switching devices are 25% duty cycle signals operating under a common switching frequency, and are phase-shifted relative to each other by 180°.

4. The power converter of claim 1, wherein the first pair of switching device comprises a first switching device and a second switching device, the second pair of switching device comprises a third switching device and a fourth switching device, the first switching device, the second switching device, the third switching device, and the fourth switching device are controlled by a first switch control signal, a second switch control signal, a third switch control signal, and a fourth switch control signal, respectively, the power converter further comprising a first input capacitor coupled across the first and second switching devices and a second input capacitor coupled across the third and fourth switching devices; wherein, when the first input capacitor has a voltage greater than that of the second input capacitor, the control circuit delays transitions in the first and second switch control signals and brings forward in time transitions of the third and fourth switch control signals by the same amount, when the first input capacitor has a voltage less than that of the second input capacitor, the control circuit brings forward in time transitions in the first and second switch control signals and delays transitions of the third and fourth switch control signals.

5. The power converter of claim 1, wherein the control circuit transitions between selected modulation schemes using one or more of: frequency shift, phase shift, duty cycle shift, and any of their combinations.

6. The power converter of claim 1, wherein the first pair of switching device comprises a first switching device and a second switching device, the second pair of switching device comprises a third switching device and a fourth switching device, wherein (i) when the first and fourth switching devices are both non-conducting, a voltage across the first and second electrical nodes goes to a first voltage level, (ii) when one of the first and fourth switching devices is conducting, the voltage across the first and second electrical nodes goes to a second voltage level, and (iii) when the first and fourth switching devices are both conducting, the voltage across the first and second electrical node goes to a third voltage level, wherein the first voltage level is ground, the second voltage level is substantially one-half the input signal, the third voltage level is substantially the input signal.

7. The power converter of claim 1, wherein the first pair of switching device comprises a first switching device and a second switching device, the second pair of switching device comprises a third switching device and a fourth switching device, the first switching device, the second switching device, the third switching device, and the fourth switching device are controlled by a first switch control signal, a second switch control signal, a third switch control signal, and a fourth switch control signal, respectively, wherein the first modulation mode in which (i) the first and second switch control signals are substantially complementary with each other and the third and fourth switch control signals are substantially complementary with each other, (ii) the first, second, third, and fourth switch control signals are periodic with a common switching period, (iii) within the common switching period, (1) each switch control signal of the first to fourth switch control signals has two rising edges and two falling edges; and either (2) the first rising edge of the first switch control signal lags the first rising edge of the fourth switch control signal by a first predetermined time, while the second rising edge of the first switch control signal leads the second rising edge for the fourth switch control signal by a second predetermined time, or (3) the first rising edge of the first switch control signal leads the first rising edge of the fourth switch control signal by a first predetermined time, while the second rising edge of the first switch control signal lags the second rising edge for the fourth switch control signal by a second predetermined time, and (iv) the control circuit varies the common switching period, the first predetermined time, and the second predetermined time.

8. The power converter of claim 7, wherein the control circuit is configurable to generate the first, second, third, and fourth switch control signals according to the second modulation mode different from the first modulation mode, the second modulation mode operates as a symmetrical modulation mode, one of the first and second modulation modes comprises variable-frequency modulation, the other one of the first and second modulation modes comprises constant-frequency modulation control, the control circuit varies a gain of the power converter by operating the power converter under the first modulation mode for a first time period and operating the power converter under the second modulation mode for a second time period.

9. The power converter of claim 1, wherein the control circuit operates in the fourth modulation mode between operating in the first modulation mode and operating in the second modulation mode.

10. A power converter having first and second input terminals to receive an input signal from a voltage source to provide an output voltage or an output current to at least one load, comprising:
  (a) a transformer having primary and secondary windings;
  (b) a primary-side circuit, comprising:
    (i) first, second, third, and fourth series-connected switching devices connected across the first and second input terminals, the first and second switching devices being controlled by first and second switch control signals, respectively, and the third and the fourth switching devices being controlled by a third and a fourth complementary switch control signals, respectively; and
    (ii) a resonant tank circuit, the resonant tank circuit being coupled (1) between a first electrical node, being a common electrical node between the first and second switching devices, and a second electrical node, being a common electrical node between the third and fourth switching devices; and (2) to the primary winding of the transformer;

(c) a secondary-side circuit coupled to the secondary winding of the transformer, the secondary-side circuit comprising a filter capacitor providing the output voltage or output current to the at least one load; and the first, second, third, and fourth switch control signals are periodic with a common switching period, (iii) within the common switching period, (1) each switch control signal of the first to fourth switch control signals has two rising edges and two falling edges; and either (2) the first rising edge of the first switch control signal lags the first rising edge of the fourth switch control signal by a first predetermined time, while the second rising edge of the first switch control signal leads the second rising edge for the fourth switch control signal by a second predetermined time, or (3) the first rising edge of the first switch control signal leads the first rising edge of the fourth switch control signal by a first predetermined time, while the second rising edge of the first switch control signal lags the second rising edge for the fourth switch control signal by a second predetermined time, and (iv) a control circuit, the control circuit varies the common switching period, the first predetermined time, and the second predetermined time, wherein the control circuit operates the first to fourth switching devices based on the output voltage or the output current, the control circuit being configured to operate in a first modulation mode and a second modulation mode, wherein under the first modulation mode, the first to fourth switching devices are operated to generate the output voltage comprising three different voltage levels, and wherein under the second modulation mode, the first to fourth switching devices are operated to generate the output voltage comprising two different voltage levels, wherein the control circuit is further configured to operate in a third modulation mode, under the third modulation mode, the first to fourth switching devices are operated to generate a zero voltage level, wherein the control circuit operates in the third modulation mode between operating in the first modulation mode and operating in the second modulation mode, and wherein the control circuit is further configured to operate in a fourth modulation mode, under the fourth modulation mode, the duty ratio of one of every two pulses of one of the first and second switching devices is increased and the duty ratio of one of every two pulses of one of the third and fourth switching devices is increased, or the duty ratio of one of every two pulses of one of the first and second switching devices is decreased and the duty ratio of one of every two pulses of one of the third and fourth switching devices is decreased.

11. A power converter that receives an input signal from a voltage source to provide an output voltage or an output current to at least one load, characterized in that the power converter comprises:
(a) a primary-side circuit comprising:
  (i) series-connected first and second pairs of series-connected switching devices, wherein the input signal is provided across the series-connected first and second pairs of switching devices;
  (ii) an LC resonant circuit connected between a first electrical node in the first pair of switching devices and a second electrical node in the second pair of switching devices; and
  (iii) an isolation transformer comprising first and second windings, wherein the first winding is connected between third and fourth electrical nodes in the LC resonant circuit;
(b) a secondary-side circuit connected in parallel with the second winding of the isolation transformer, the secondary-side circuit comprising a filter capacitor adapted to provide at least one of the output voltage and output current to the at least one load; and
(c) a control circuit, wherein the control circuit is adapted to operate the first and second pairs of switching devices based on at least one of the output voltage and the output current, and the control circuit is configured to operate in a first modulation mode and a second modulation mode, wherein under the first modulation mode, the first and second pairs of switching devices are operated to generate the output voltage comprising three different voltage levels, and wherein under the second modulation mode, the first and second pairs of switching devices are operated to generate the output voltage comprising two different voltage levels,
wherein the control circuit is further configured to operate in a third modulation mode, under the third modulation mode, the first and second pairs of switching devices are operated to generate a zero voltage level,
wherein the control circuit operates in the third modulation mode between operating in the first modulation mode and operating in the second modulation mode, and
wherein the control circuit is further configured to operate in a fourth modulation mode, under the fourth modulation mode, the duty ratio of one of every two pulses of one of the first pair of switching devices is increased and the duty ratio of one of every two pulses of one of the second pair of switching devices is increased, or the duty ratio of one of every two pulses of one of the first pair of switching devices is decreased and the duty ratio of one of every two pulses of one of the second pair of switching devices is decreased.

12. The power converter of claim 11, wherein the control circuit operates in the fourth modulation mode between operating in the first modulation mode and operating in the second modulation mode.

\* \* \* \* \*